US012062412B2

(12) United States Patent
Lu et al.

(10) Patent No.: US 12,062,412 B2
(45) Date of Patent: Aug. 13, 2024

(54) SEMICONDUCTOR MEMORY DEVICE

(71) Applicant: KIOXIA CORPORATION, Tokyo (JP)

(72) Inventors: Zhao Lu, Ebina (JP); Yuji Nagai, Sagamihara (JP); Akio Sugahara, Yokohama (JP); Takehisa Kurosawa, Yokohama (JP); Masaru Koyanagi, Ota (JP)

(73) Assignee: KIOXIA CORPORATION, Tokyo (JP)

( * ) Notice: Subject to any disclaimer, the term of this patent is extended or adjusted under 35 U.S.C. 154(b) by 226 days.

(21) Appl. No.: 17/806,965

(22) Filed: Jun. 15, 2022

(65) Prior Publication Data

US 2023/0022082 A1 Jan. 26, 2023

(30) Foreign Application Priority Data

Jul. 21, 2021 (JP) ................................ 2021-120333
Oct. 18, 2021 (JP) ................................ 2021-170466

(51) Int. Cl.
*G11C 7/22* (2006.01)
*G11C 7/08* (2006.01)
*G11C 7/10* (2006.01)

(52) U.S. Cl.
CPC ................ *G11C 7/222* (2013.01); *G11C 7/08* (2013.01); *G11C 7/1063* (2013.01); *G11C 7/109* (2013.01)

(58) Field of Classification Search
CPC ...................................................... G11C 16/32
See application file for complete search history.

(56) References Cited

U.S. PATENT DOCUMENTS 7,702,885 B2 4/2010 Cohen
9,335,953 B2 5/2016 Fujimoto et al.
9,396,775 B2 7/2016 Shirakawa et al.
9,613,668 B2 4/2017 Kikuchi
10,521,153 B2 12/2019 Lim et al.
(Continued)

FOREIGN PATENT DOCUMENTS

JP 2009-528633 A 8/2009
JP 5728292 B2 6/2015
(Continued)

*Primary Examiner* — Douglas King
(74) *Attorney, Agent, or Firm* — Oblon, McClelland, Maier & Neustadt, L.L.P.

(57) ABSTRACT

A semiconductor memory device includes: first pad transmitting and receiving first timing signal; second pad transmitting and receiving data signal in response to the first timing signal; third pad receiving second timing signal; fourth pad receiving control information in response to the second timing signal; memory cell array; sense amplifier connected to the memory cell array; first register connected to the sense amplifier; second register storing first control information; third register storing second control information; and control circuit executing data-out operation. The first control information is stored in the second register based on an input to the fourth pad in response to the second timing signal consisting of i cycles, and the second control information is stored in the third register based on an input to the fourth pad in response to the second timing signal consisting of j cycles.

18 Claims, 41 Drawing Sheets

(56) References Cited

U.S. PATENT DOCUMENTS

| | | | | |
|---|---|---|---|---|
| 2008/0209110 | A1* | 8/2008 | Pyeon | G06F 13/4243 711/E12.019 |
| 2021/0064258 | A1 | 3/2021 | Sakurai et al. | |
| 2022/0011974 | A1* | 1/2022 | Lee | G06F 1/06 |

FOREIGN PATENT DOCUMENTS

| | | | |
|---|---|---|---|
| JP | 2015-176309 | A | 10/2015 |
| JP | 2017-194966 | A | 10/2017 |
| JP | 6468971 | B2 | 2/2019 |
| JP | 2021-39804 | A | 3/2021 |

* cited by examiner

FIG. 12

| MODEa | CLE | ALE | $\overline{CE}$ | $\overline{WE}$ | $\overline{RE}$ | DQS | DQ |
|---|---|---|---|---|---|---|---|
| Cmd/Add | H/L | L/H | L |  | H | Z | Input |
| DataInput | L | L | L | H | H | 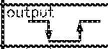 | Input |
| DataOutput | L | L | L | H |  | 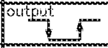 | Output |
| StatusOutput | L | L | L | H |  |  | Output |
| Standby | Z | Z | H | Z | Z | Z | Z |
| Bus Idle | L | L | L | H | X | X | Z |

FIG. 13

| MODEb @ FSel_1 | CLE | ALE | $\overline{CE}$ | $\overline{WE}$ | $\overline{RE}$ | DQS | DQ |
|---|---|---|---|---|---|---|---|
| Next | L | L | L |  | | | |
| Add | L | H | L |  | | | |
| Cmd | H | L | L |  | | | |
| Trigger | H | H | L |  | | | |

FIG. 14

| MODEb @ FSel_2 | CLE | ALE | $\overline{CE}$ | $\overline{WE}$ | $\overline{RE}$ | DQS | DQ |
|---|---|---|---|---|---|---|---|
| Next | L | L | L |  | | | |
| Data Input (via ALE/CLE) | L | H | L | 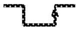 | | | |
| -- | H | L | L |  | | | |
| Data Output (via ALE/CLE) | H | H | L |  | | | |

FIG. 15
| MODEb @ S_In, Out | CLE | ALE | $\overline{CE}$ | $\overline{WE}$ | $\overline{RE}$ | DQS | DQ |
|---|---|---|---|---|---|---|---|
| Data Input (via ALE/CLE) | Input | Input | L |  | | | |
| DataInput (via DQ) | | | L | | H |  | Input |
| DataOutput (via DQ) | | | L | |  | output  | Output |
| Data Output (via ALE/CLE) | Output | Output | L |  | | | |
| Standby | Z | Z | H | Z | Z | Z | Z |
| Bus Idle | L | L | L | H | X | X | Z |

FIG. 42

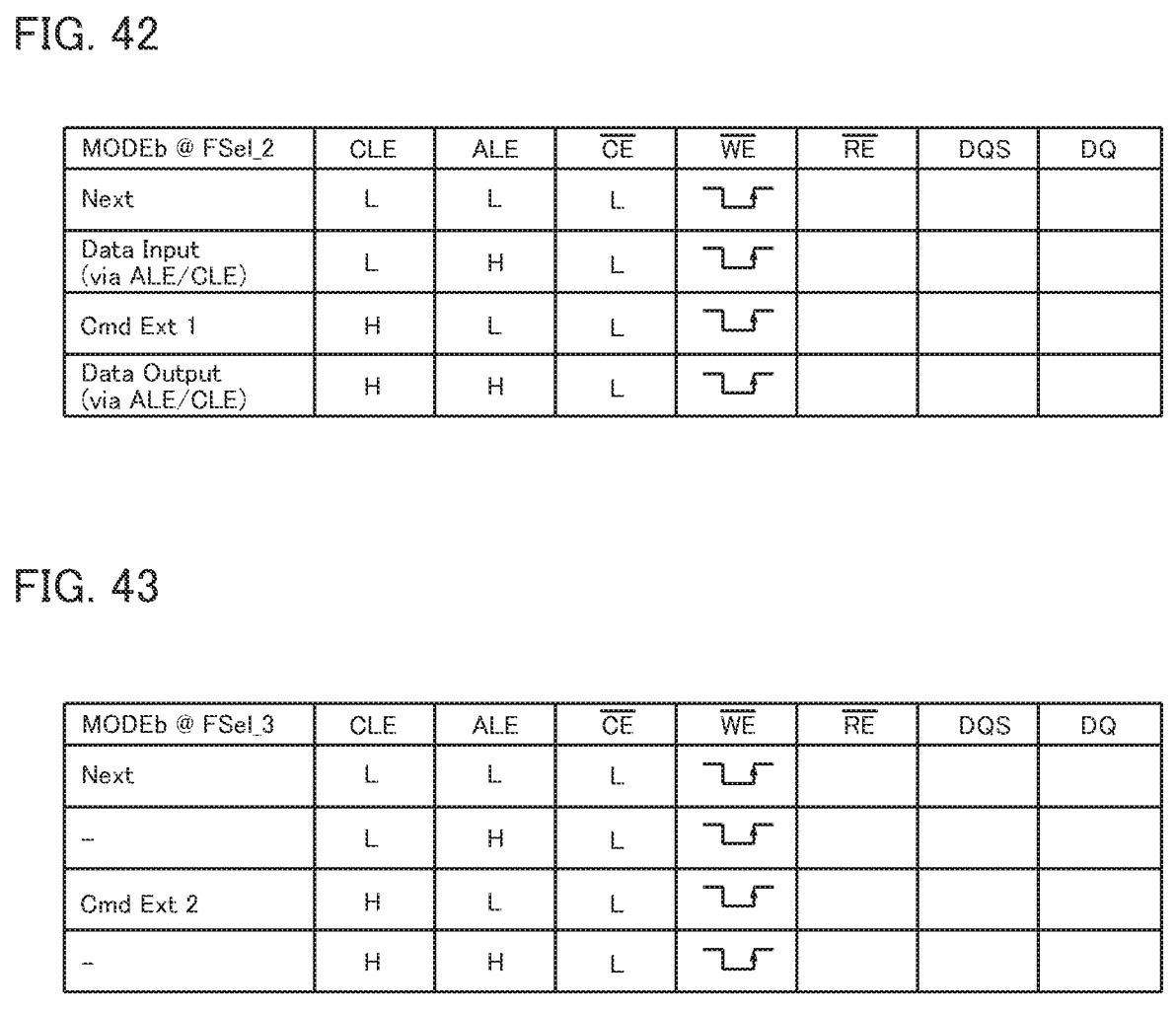

| MODEb @ FSel_2 | CLE | ALE | $\overline{CE}$ | $\overline{WE}$ | $\overline{RE}$ | DQS | DQ |
|---|---|---|---|---|---|---|---|
| Next | L | L | L | ‾_/‾ | | | |
| Data Input (via ALE/CLE) | L | H | L | ‾_/‾ | | | |
| Cmd Ext 1 | H | L | L | ‾_/‾ | | | |
| Data Output (via ALE/CLE) | H | H | L | ‾_/‾ | | | |

FIG. 43

| MODEb @ FSel_3 | CLE | ALE | $\overline{CE}$ | $\overline{WE}$ | $\overline{RE}$ | DQS | DQ |
|---|---|---|---|---|---|---|---|
| Next | L | L | L | ‾_/‾ | | | |
| – | L | H | L | ‾_/‾ | | | |
| Cmd Ext 2 | H | L | L | ‾_/‾ | | | |
| – | H | H | L | ‾_/‾ | | | |

| 1-2-4 code | Er | A | B | C | D | E | F | G |
|---|---|---|---|---|---|---|---|---|
| Upper | 1 | 0 | 0 | 1 | 1 | 0 | 0 | 1 |
| Middle | 1 | 1 | 0 | 0 | 0 | 0 | 1 | 1 |
| Lower | 1 | 1 | 1 | 1 | 0 | 0 | 0 | 0 |

Read Operation (00h)

Shift Read Operation 1 (11h, 12h, 13h, ···)

Shift Read Operation 2 (21h, 22h, 23h, ···)

SEMICONDUCTOR MEMORY DEVICE

CROSS-REFERENCE TO RELATED APPLICATIONS

This application is based upon and claims the benefits of Japanese Patent Application No. 2021-120333, filed on Jul. 21, 2021, and Japanese Patent Application No. 2021-170466, filed on Oct. 18, 2021, the entire contents of which are incorporated herein by reference.

BACKGROUND

Field

Embodiments described herein relate generally to a semiconductor memory device.

Description of the Related Art

There has been known a semiconductor memory device that includes a memory cell array including a plurality of memory cells and a peripheral circuit that is connected to this memory cell array and outputs user data in response to input of a command set including command data and address data.

BRIEF DESCRIPTION OF THE DRAWINGS

FIG. 12 is a truth table for describing the operation mode MODEa;

FIG. 13 is a truth table for describing the operation mode MODEb;

FIG. 14 is a truth table for describing the operation mode MODEb;

FIG. 15 is a truth table for describing the operation mode MODEb;

FIG. 42 is a truth table for describing the operation mode MODEb;

FIG. 43 is a truth table for describing the operation mode MODEb;

DETAILED DESCRIPTION

Figure 1:
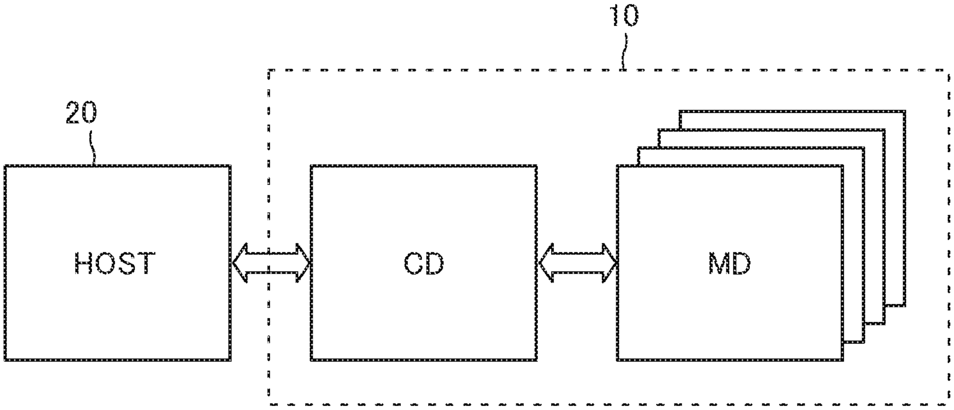
FIG. 1 is a schematic block diagram illustrating a configuration of a memory system 10 according to a first embodiment.

A semiconductor memory device according to one embodiment comprises: a first pad being capable of transmitting and receiving a first timing signal; a second pad being capable of transmitting and receiving a data signal in response to the first timing signal; a third pad being capable of receiving a second timing signal; a fourth pad being capable of receiving control information in response to the second timing signal; a memory cell array including a string in which a plurality of memory cell transistors are connected in series; a sense amplifier connected to the memory cell array; a first register connected to the sense amplifier and being capable of storing data read from the memory cell array; a second register being capable of storing first control information; a third register being capable of storing second control information; and a control circuit being capable of executing a data-out operation of outputting the data stored in the first register from the first pad. The first control information is stored in the second register based on an input to the fourth pad in response to the second timing signal consisting of i cycles (i is an integer of two or more), and the second control information is stored in the third register based on an input to the fourth pad in response to the second timing signal consisting of j cycles (j is an integer different from i).

Next, the semiconductor memory devices according to embodiments are described in detail with reference to the drawings. The following embodiments are only examples, and not described for the purpose of limiting the present invention.

In this specification, when referring to a "semiconductor memory device", it may mean a memory die and may mean a memory system including a controller die, such as a memory chip, a memory card, and a Solid State Drive (SSD). Further, it may mean a configuration including a host computer, such as a smartphone, a tablet terminal, and a personal computer.

In this specification, when it is referred that a first configuration "is electrically connected" to a second configuration, the first configuration may be directly connected to the second configuration, or the first configuration may be connected to the second configuration via a wiring, a semiconductor member, a transistor, or the like. For example, when three transistors are connected in series, even when the second transistor is in OFF state, the first transistor is "electrically connected" to the third transistor.

In this specification, when it is referred that the first configuration "is connected between" the second configuration and a third configuration, it may mean that the first configuration, the second configuration, and the third configuration are connected in series and the second configuration is connected to the third configuration via the first configuration.

In this specification, when it is referred that a circuit or the like "electrically conducts" two wirings or the like, it may mean, for example, that this circuit or the like includes a transistor or the like, this transistor or the like is disposed in a current path between the two wirings, and this transistor or the like is turned ON.

First Embodiment

[Memory System 10]

FIG. 1 is a schematic block diagram illustrating a configuration of a memory system 10 according to a first embodiment.

The memory system 10 executes, for example, a read operation, a write operation, an erase operation, and the like in response to a signal transmitted from a host computer 20. The memory system 10 is, for example, any system that can store user data including a memory card and an SSD. The memory system 10 includes a plurality of memory dies MD that store the user data and a controller die CD connected to these plurality of memory dies MD and the host computer 20. The controller die CD includes, for example, a processor, a RAM, and the like, and performs conversion between a logical address and a physical address, bit error detection/correction, a garbage collection (compaction), a wear leveling, and the like.

Figure 2:
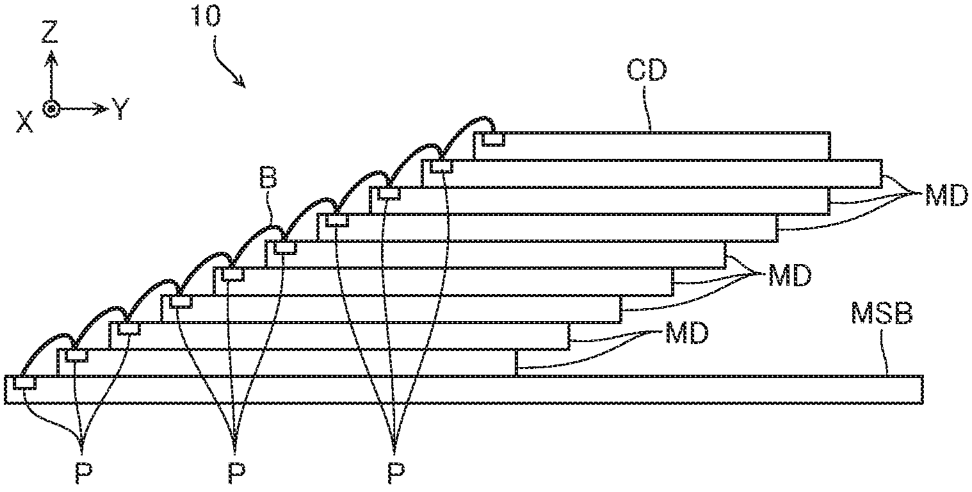
FIG. 2 is a schematic side view illustrating an exemplary configuration of the memory system 10.
Figure 3:
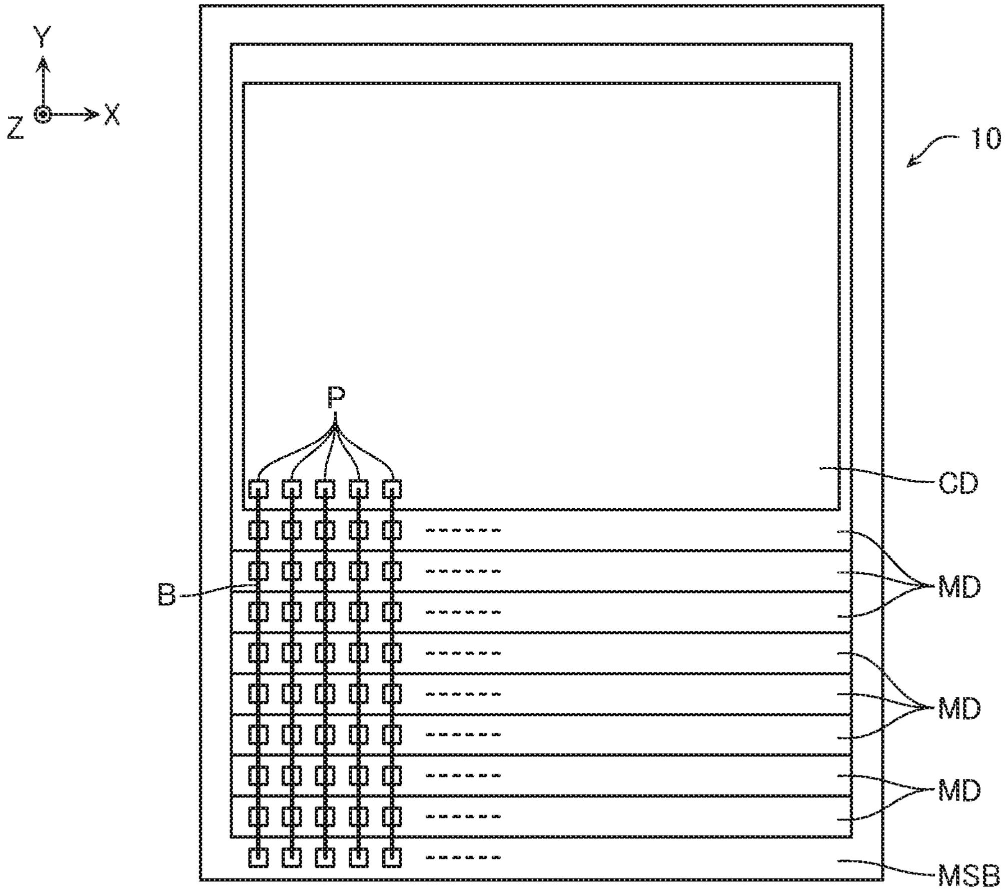
FIG. 3 is a schematic plan view illustrating the exemplary configuration of the memory system 10.

FIG. 2 is a schematic side view illustrating an exemplary configuration of the memory system 10 according to the embodiment. FIG. 3 is a schematic plan view illustrating the exemplary configuration. For convenience of description, FIG. 2 and FIG. 3 omit a part of the configuration.

As illustrated in FIG. 2, the memory system 10 according to the embodiment includes a mounting substrate MSB, the plurality of memory dies MD stacked on the mounting substrate MSB, and the controller die CD stacked on the memory die MD. On an upper surface of the mounting substrate MSB, a pad electrode P is disposed in a region at an end portion in a Y-direction, and a part of the other region is bonded to a lower surface of the memory die MD via an adhesive and the like. On an upper surface of the memory die MD, the pad electrode P is disposed in a region at an end portion in the Y-direction, and the other region is bonded to a lower surface of another memory die MD or the controller die CD via the adhesive and the like. On an upper surface of the controller die CD, the pad electrode P is disposed in a region at an end portion in the Y-direction.

As illustrated in FIG. 3, the mounting substrate MSB, the plurality of memory dies MD, and the controller die CD each include a plurality of the pad electrodes P arranged in an X-direction. The plurality of pad electrodes P disposed to each of the mounting substrate MSB, the plurality of memory dies MD, and the controller die CD are mutually connected via bonding wires B.

Note that the configurations illustrated in FIG. 2 and FIG. 3 are merely examples, and specific configurations are appropriately adjustable. For example, in the example illustrated in FIG. 2 and FIG. 3, the controller die CD is stacked on the plurality of memory dies MD, and these configurations are connected with the bonding wires B. In such a configuration, the plurality of memory dies MD and the controller die CD are included in one package. However, the controller die CD may be included in a package different from the memory die MD. Additionally, the plurality of memory dies MD and the controller die CD may be connected to one another via through electrodes or the like, not the bonding wires B.

[Configuration of Memory Die MD]

Figure 4:
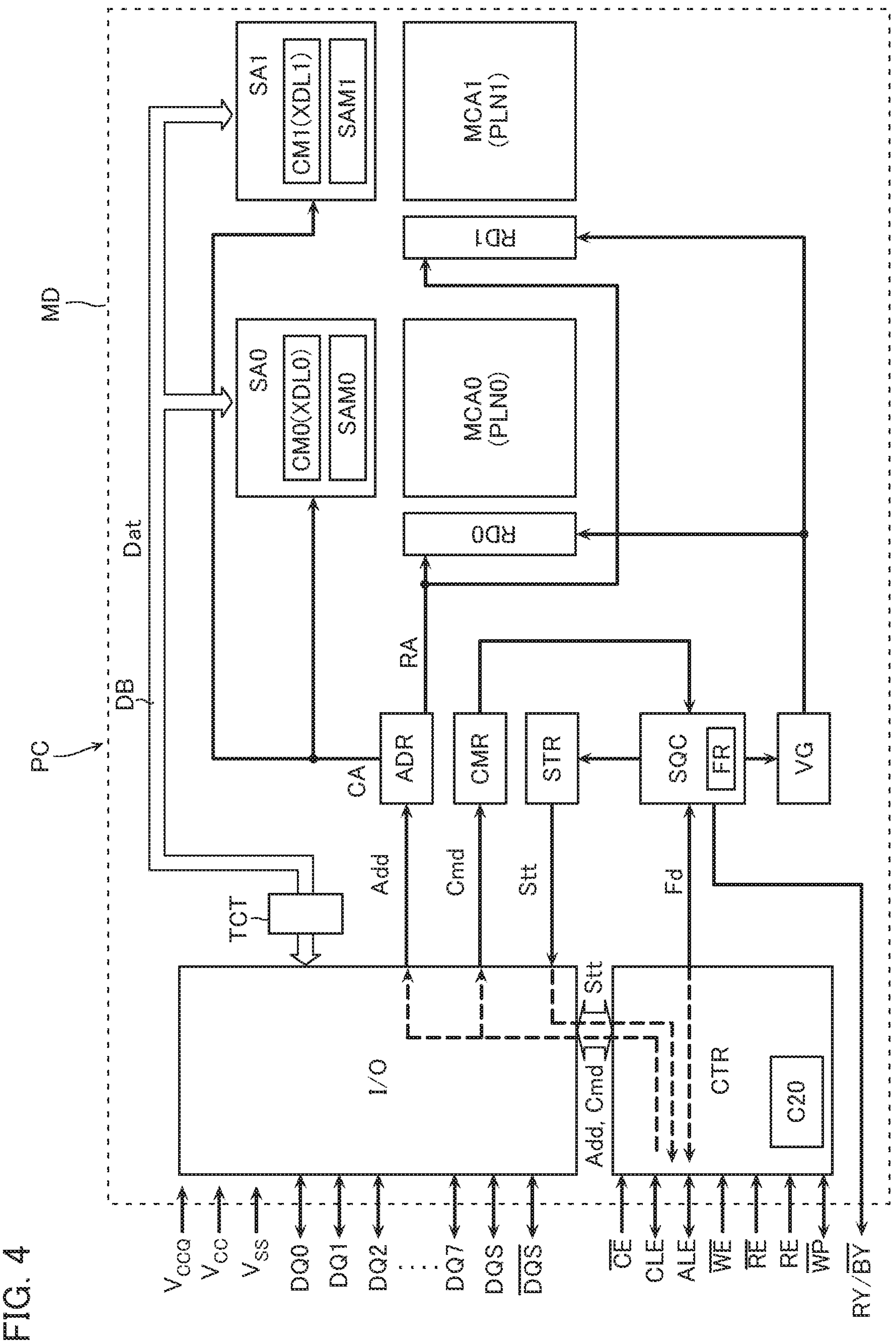
FIG. 4 is a schematic block diagram illustrating a configuration of a memory die MD.
Figure 5:
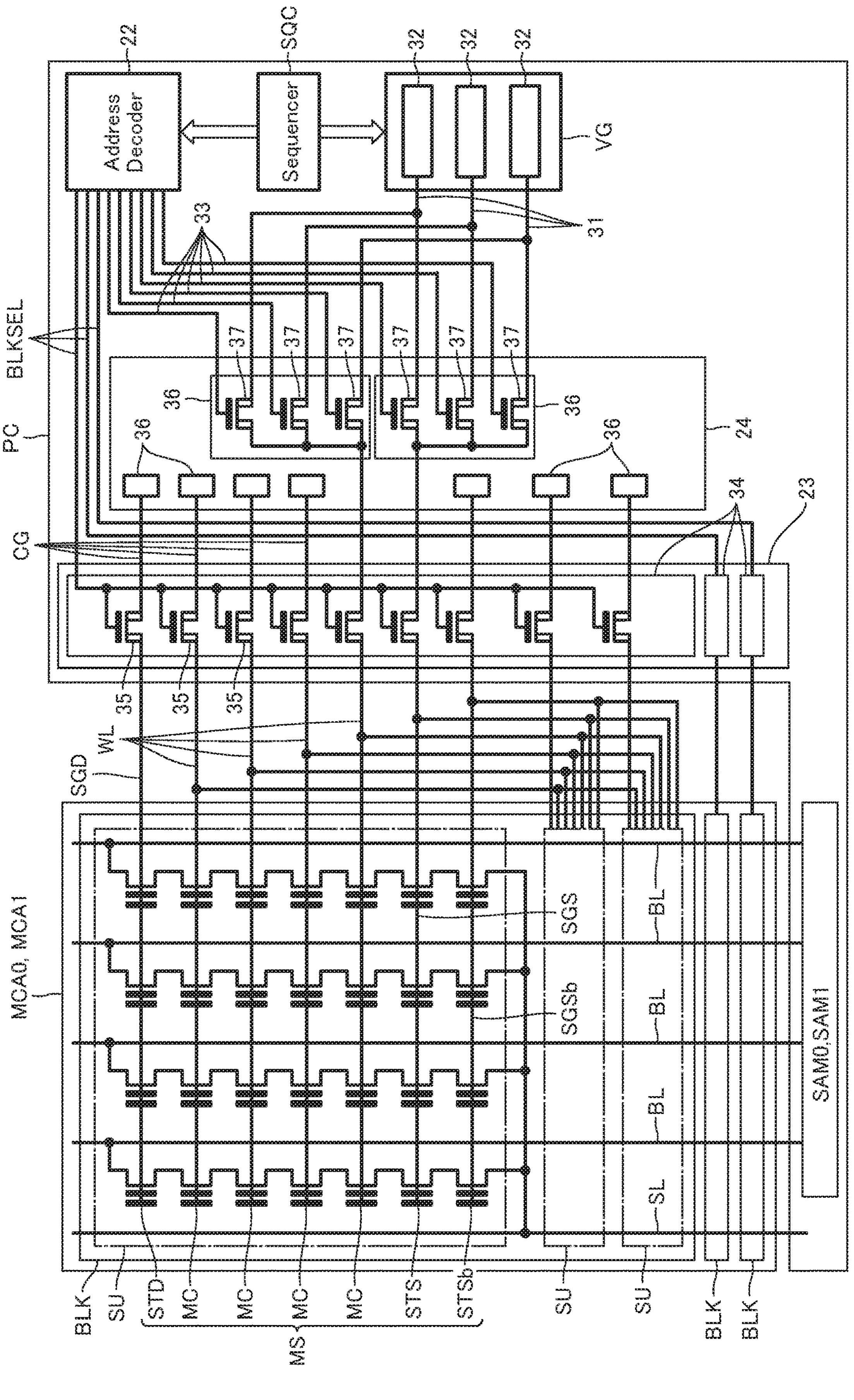
FIG. 5 is a schematic circuit diagram illustrating a configuration of a part of the memory die MD.
Figure 6:
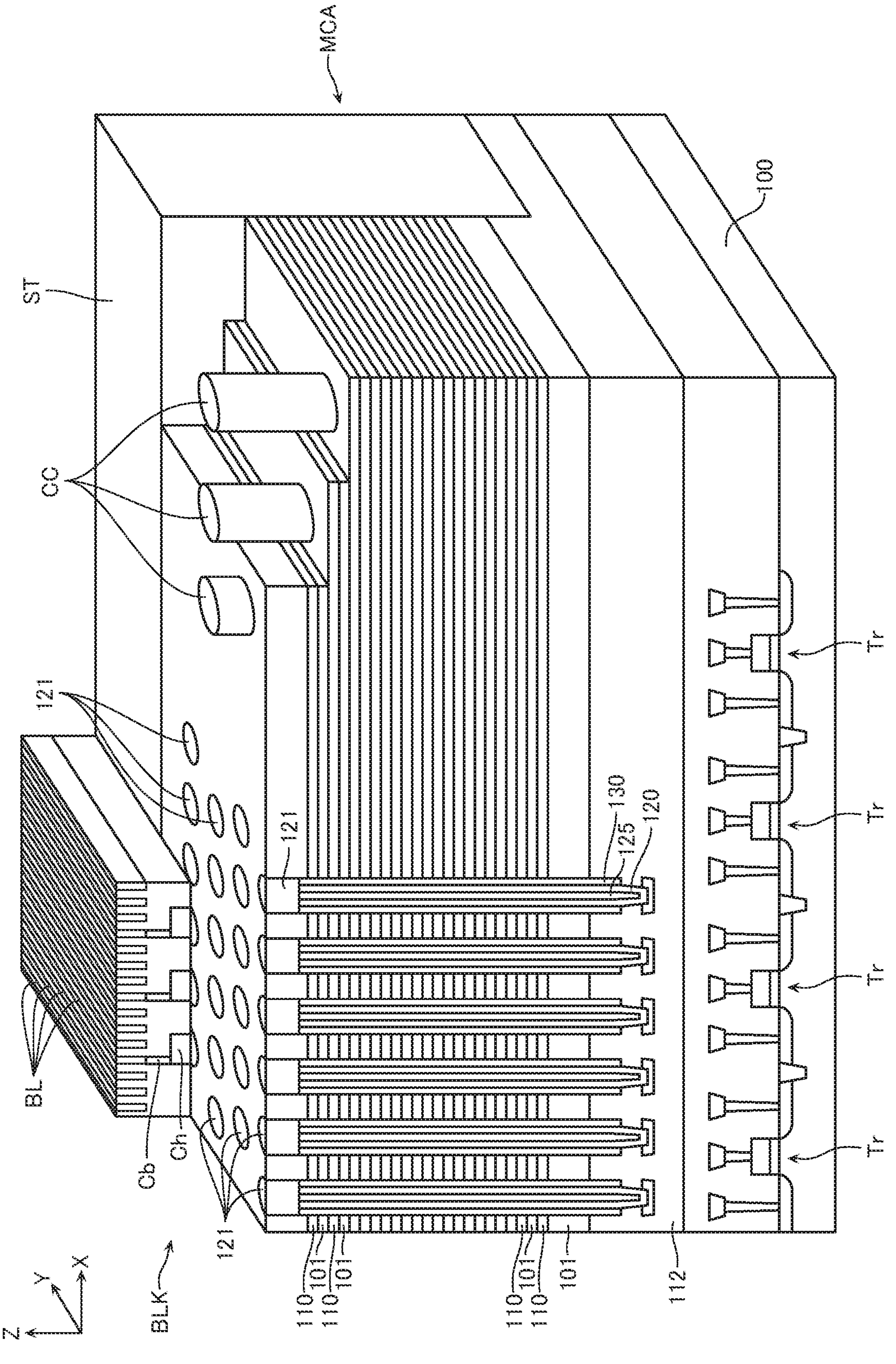
FIG. 6 is a schematic perspective view illustrating a configuration of a part of the memory die MD.
Figure 7:
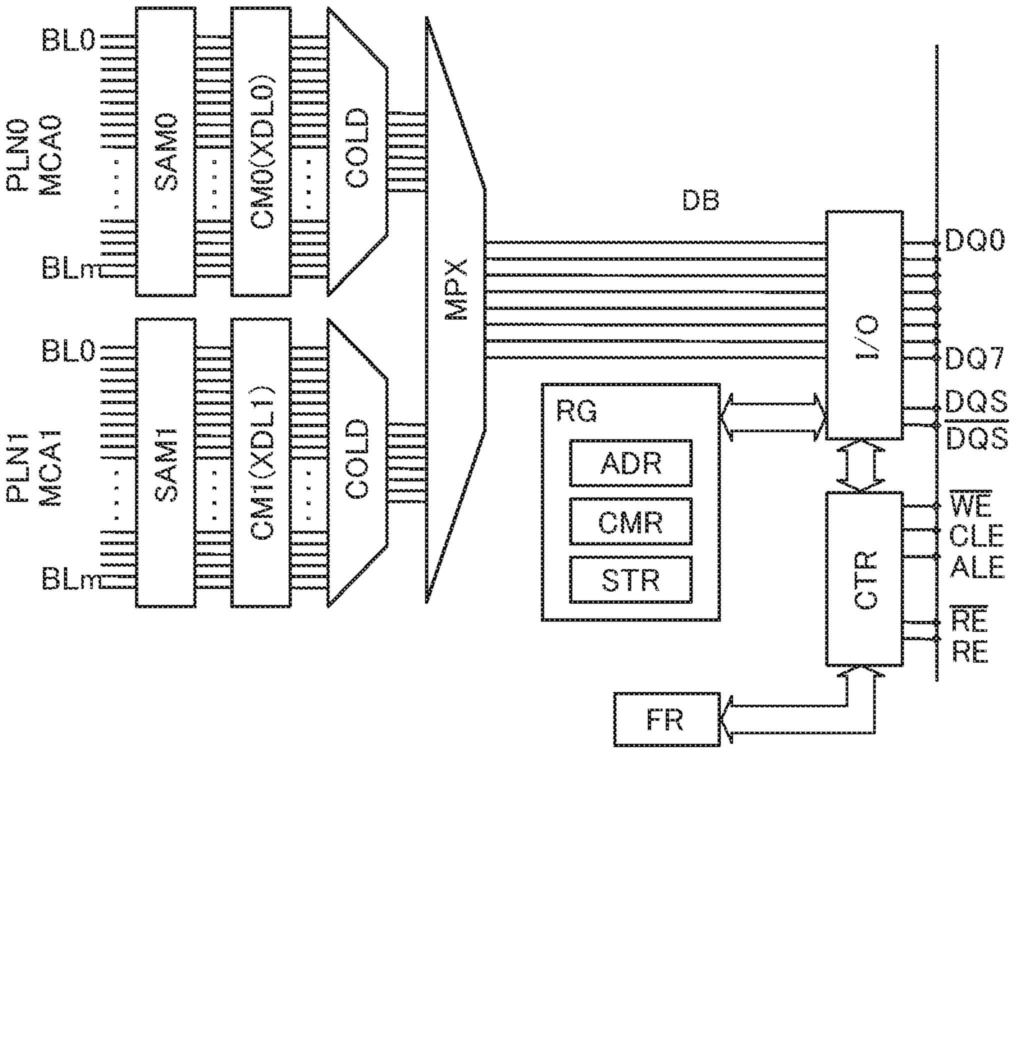
FIG. 7 is a schematic circuit diagram illustrating a configuration of a part of the memory die MD.
Figure 8:
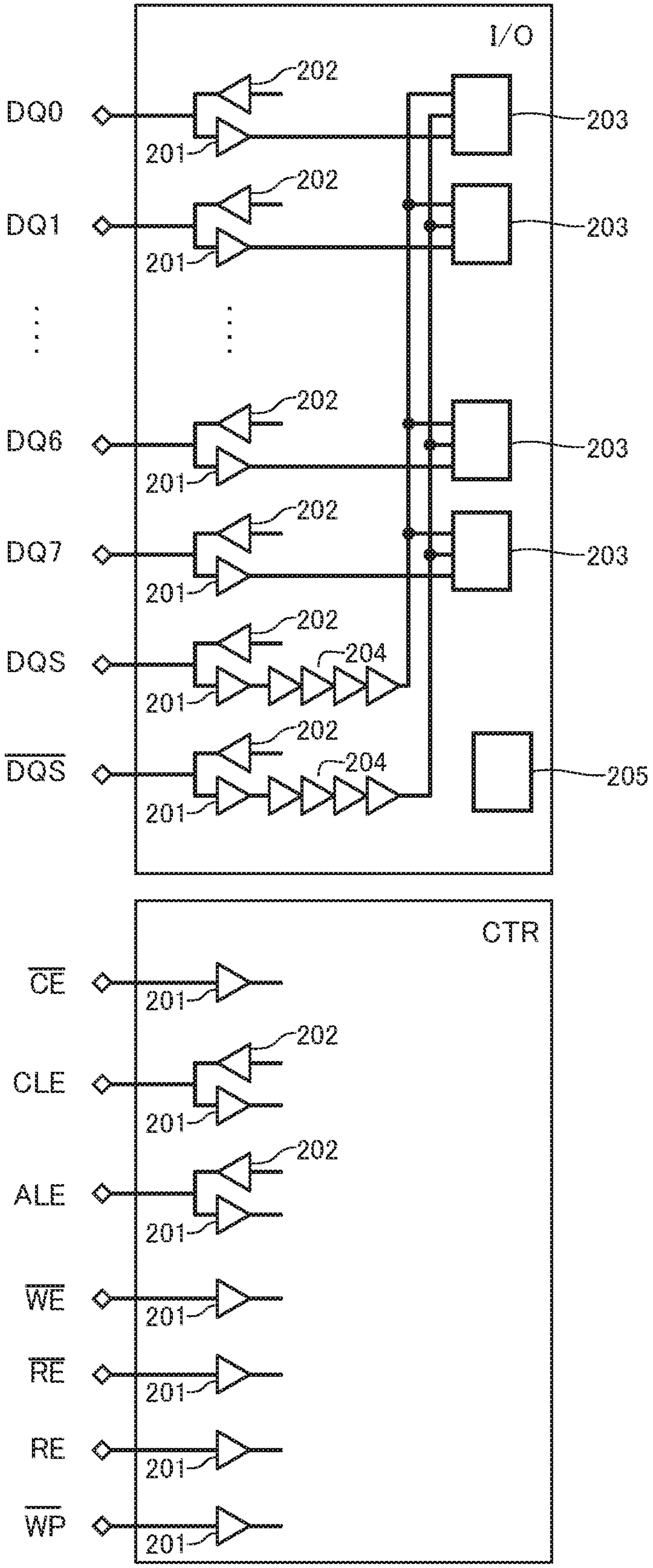
FIG. 8 is a schematic circuit diagram illustrating a configuration of a part of the memory die MD.
Figure 9:
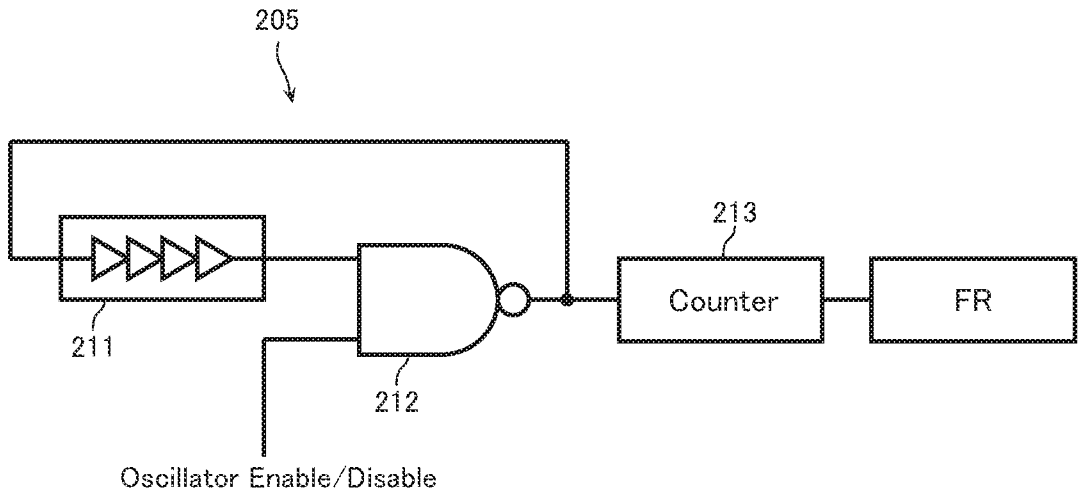
FIG. 9 is a schematic circuit diagram illustrating a configuration of a part of the memory die MD.

FIG. 4 is a schematic block diagram illustrating a configuration of the memory die MD according to the first embodiment. FIG. 5 is a schematic circuit diagram illustrating a configuration of a part of the memory die MD. FIG. 6 is a schematic perspective view illustrating a configuration of a part of the memory die MD. FIG. 7 to FIG. 9 are schematic circuit diagrams illustrating a configuration of a part of the memory die MD. For convenience of description, FIG. 4 to FIG. 9 omit a part of a configuration.

Note that FIG. 4 illustrates a plurality of control terminals and the like. These plurality of control terminals may be expressed as control terminals corresponding to high active signals (positive logic signals), may be expressed as control terminals corresponding to low active signals (negative logic signals), or may be expressed as control terminals corresponding to both the high active signals and the low active signals. In FIG. 4, reference numerals of the control terminals corresponding to the low active signals include an overline (overlying line). In this specification, reference numerals of the control terminals corresponding to the low active signals include a slash ("/"). Note that the illustration in FIG. 4 is an example, and the specific aspect is appropriately adjustable. For example, it is possible to change a part or all of the high active signals to low active signals or change a part or all of the low active signals to high active signals.

Next to the plurality of control terminals illustrated in FIG. 4, an arrow indicating an input/output direction is illustrated. In FIG. 4, the control terminals provided with an arrow pointing from left to right are usable for an input of data or other signals from the controller die CD to the memory die MD. In FIG. 4, the control terminals provided with an arrow pointing from right to left are usable for an output of data or other signals from the memory die MD to the controller die CD. In FIG. 4, the control terminals provided with an arrow pointing to both left and right directions are usable in both directions for an input of data or other signals from the controller die CD to the memory die MD and for an output of data or other signals from the memory die MD to the controller die CD.

As illustrated in FIG. 4, the memory die MD includes memory cell arrays MCA0, MCA1 that store user data and a peripheral circuit PC connected to the memory cell arrays MCA0, MCA1. Note that, in the following description, the memory cell arrays MCA0, MCA1 may be referred to as memory cell arrays MCA. Further, the memory cell arrays MCA0, MCA1 may be referred to as planes PLN0, PLN1.

[Configuration of Memory Cell Array MCA]

The memory cell array MCA includes a plurality of memory blocks BLK as illustrated in FIG. 5. These plurality of memory blocks BLK each include a plurality of string units SU. These plurality of string units SU each include a plurality of memory strings MS. These plurality of memory strings MS have one ends each connected to the peripheral circuit PC via a bit line BL. These plurality of memory strings MS have other ends each connected to the peripheral circuit PC via a common source line SL.

The memory string MS includes a drain-side select transistor STD, a plurality of memory cells MC (memory cell transistors), a source-side select transistor STS, and a source-side select transistor STSb, which are connected in series between the bit line BL and the source line SL. Hereinafter, the drain-side select transistor STD, the source-side select transistor STS, and the source-side select transistor STSb may be simply referred to as select transistors (STD, STS, STSb).

The memory cell MC is a field-effect type transistor including a semiconductor layer, a gate insulating film, and a gate electrode. The semiconductor layer serves as a channel region. The gate insulating film includes an electric charge accumulating film. The memory cell MC has a threshold voltage that changes according to an electric charge amount in the electric charge accumulating film. The memory cell MC stores one bit or a plurality of bits of user data. Word lines WL are connected to the respective gate electrodes of the plurality of memory cells MC corresponding to one memory string MS. These respective word lines WL are connected to all of the memory strings MS in one memory block BLK in common.

The select transistors (STD, STS, STSb) are field-effect type transistors each including a semiconductor layer, a gate insulating film, and a gate electrode. The semiconductor layer serves as a channel region. Select gate lines (SGD, SGS, SGSb) are connected to the respective gate electrodes of the select transistors (STD, STS, STSb). The drain-side select gate line SGD is disposed corresponding to the string unit SU and connected to all of the memory strings MS in one string unit SU in common. The source-side select gate line SGS is connected to all of the memory strings MS in the memory block BLK in common. The source-side select gate line SGSb is connected to all of the memory strings MS in the memory block BLK in common.

For example, as illustrated in FIG. 6, the memory cell array MCA is disposed above a semiconductor substrate 100. In the example of FIG. 6, a plurality of transistors Tr constituting the peripheral circuit PC are disposed between the semiconductor substrate 100 and the memory cell array MCA.

The memory cell array MCA includes the plurality of memory blocks BLK arranged in the Y-direction. Between two memory blocks BLK adjacent in the Y-direction, an inter-block insulating layer ST of silicon oxide ($SiO_2$) or the like is disposed.

For example, as illustrated in FIG. 6, the memory block BLK includes a plurality of conductive layers 110 arranged in a Z-direction, a plurality of semiconductor columns 120 extending in the Z-direction, and a respective plurality of gate insulating films 130 disposed between the plurality of conductive layers 110 and the plurality of semiconductor columns 120.

The conductive layer 110 is an approximately plate-shaped conductive layer extending in the X-direction. The conductive layer 110 may include a stacked film of a barrier conductive film, such as titanium nitride (TiN), and a metal film, such as tungsten (W), or the like. For example, the conductive layer 110 may contain polycrystalline silicon containing impurities, such as phosphorus (P) or boron (B), or the like. Between the plurality of conductive layers 110 arranged in the Z-direction, insulating layers 101 of silicon oxide ($SiO_2$) or the like are disposed.

Among the plurality of conductive layers 110, two or more conductive layers 110 positioned at the lowermost layer serve as the source-side select gate lines SGS, SGSb (FIG. 5) and gate electrodes of the plurality of source-side select transistors STS, STSb connected thereto. These plurality of conductive layers 110 are electrically independent in every memory block BLK.

The plurality of conductive layers 110 positioned above these conductive layers 110 serve as the word lines WL (FIG. 5) and gate electrodes of the plurality of memory cells MC (FIG. 5) connected thereto. These plurality of conductive layers 110 are each electrically independent in every memory block BLK.

The one or plurality of conductive layers 110 positioned above these conductive layers 110 serve as the drain-side select gate line SGD and gate electrodes of the plurality of drain-side select transistors STD (FIG. 5) connected thereto. These plurality of conductive layers 110 have widths in the Y-direction smaller than those of the other conductive layers 110.

A semiconductor layer 112 is disposed below the conductive layer 110. For example, the semiconductor layer 112 may contain polycrystalline silicon containing impurities, such as phosphorus (P) or boron (B), or the like. Between the semiconductor layer 112 and the conductive layer 110, the insulating layer 101 of silicon oxide ($SiO_2$) or the like is disposed.

The semiconductor layer 112 serves as the source line SL (FIG. 5). The source line SL is, for example, disposed in common among all of the memory blocks BLK included in the memory cell array MCA.

For example, as illustrated in FIG. 6, the semiconductor columns 120 are arranged in the X-direction and the Y-direction in a predetermined pattern. The semiconductor columns 120 serve as the channel regions of the plurality of memory cells MC and the select transistors (STD, STS, STSb) included in one memory string MS (FIG. 5). The semiconductor column 120 includes, for example, polycrystalline silicon (Si) or the like. For example, as illustrated in FIG. 6, the semiconductor column 120 has an approximately cylindrical shape and includes an insulating layer 125 of silicon oxide or the like at its center part. Each of the outer peripheral surfaces of the semiconductor columns 120 is surrounded by the conductive layers 110 and is opposed to the conductive layers 110.

An impurity region 121 containing N-type impurities, such as phosphorus (P), is disposed on the upper end portion of the semiconductor column 120. The impurity region 121 is connected to the bit line BL via a contact Ch and a contact Cb.

The gate insulating film 130 has an approximately cylindrical shape that covers the outer peripheral surface of the semiconductor column 120. The gate insulating film 130 includes, for example, a tunnel insulating film, an electric charge accumulating film, and a block insulating film, which are stacked between the semiconductor column 120 and the conductive layers 110. The tunnel insulating film and the block insulating film are, for example, insulating films of silicon oxide ($SiO_2$) or the like. The electric charge accumulating film is, for example, a film of silicon nitride ($Si_3N_4$) or the like that can accumulate an electric charge. The tunnel insulating film, the electric charge accumulating film, and the block insulating film, which have approximately cylindrical shapes, extend in the Z-direction along the outer peripheral surface of the semiconductor column 120 excluding the contact portion of the semiconductor column 120 and the semiconductor layer 112.

The gate insulating film 130 may include, for example, a floating gate of polycrystalline silicon containing N-type or P-type impurities or the like.

A plurality of contacts CC are disposed at the end portions in the X-direction of the plurality of conductive layers 110. The plurality of conductive layers 110 are connected to the peripheral circuit PC via these plurality of contacts CC. As illustrated in FIG. 6, these plurality of contacts CC extend in the Z-direction and are connected to the conductive layers 110 at the lower ends. The contact CC may include, for example, a stacked film of a barrier conductive film, such as titanium nitride (TiN), and a metal film, such as tungsten (W), or the like.

[Configuration of Peripheral Circuit PC]

For example, as illustrated in FIG. 4, the peripheral circuit PC includes row decoders RD0, RD1 respectively connected to the memory cell arrays MCA0, MCA1 and sense amplifiers SA0, SA1 respectively connected to the memory cell arrays MCA0, MCA1. The peripheral circuit PC includes a voltage generation circuit VG and a sequencer SQC. Additionally, the peripheral circuit PC includes an input/output control circuit I/O, a logic circuit CTR, an address register ADR, a command register CMR, a status register STR, and a data output timing adjustment portion TCT. Note that, in the following description, the row decoders RD0, RD1 may be referred to as row decoders RD, and the sense amplifiers SA0, SA1 may be referred to as sense amplifiers SA.

[Configuration of Row Decoder RD]

The row decoder RD (FIG. 4) includes, for example, as illustrated in FIG. 5, an address decoder 22 that decodes address data Add (FIG. 4) and a block select circuit 23 and a voltage select circuit 24 that transfer the operating voltage to the memory cell array MCA in response to an output signal from the address decoder 22.

The address decoder 22 includes a plurality of block select lines BLKSEL and a plurality of voltage select lines 33. For example, the address decoder 22 sequentially refers to a row address RA in the address register ADR (FIG. 4) in response to the control signal from the sequencer SQC, decodes this row address RA to cause a predetermined block select transistor 35 and a predetermined voltage select transistor 37 corresponding to the row address RA to be in an ON state, and cause the block select transistors 35 and the voltage select transistors 37 other than those to be in an OFF state. For example, voltages of the predetermined block select line BLKSEL and voltage select line 33 are set to be in an "H" state and voltages other than those are set to be in an "L" state. When a P-channel type transistor is used, not an N-channel type transistor, an inverse voltage is applied to these wirings.

In the illustrated example, in the address decoder 22, one block select line BLKSEL is disposed per memory block BLK. However, this configuration is appropriately changeable. For example, one block select line BLKSEL may be included in per two or more memory blocks BLK.

The block select circuit 23 includes a plurality of block selectors 34 corresponding to the memory blocks BLK. These plurality of block selectors 34 each include a plurality of the block select transistors 35 corresponding to the word lines WL and the select gate lines (SGD, SGS, SGSb). The block select transistor 35 is, for example, a field-effect type high breakdown voltage transistor. The block select transistors 35 have drain electrodes each electrically connected to the corresponding word line WL or select gate lines (SGD, SGS, SGSb). Source electrodes are each electrically connected to a voltage supply line 31 via a wiring CG and the voltage select circuit 24. Gate electrodes are connected to the corresponding block select line BLKSEL in common.

Note that the block select circuit 23 further includes a plurality of transistors (not illustrated). These plurality of transistors are field-effect type high breakdown voltage transistors connected between the select gate lines (SGD, SGS, SGSb) and voltage supply lines to which a ground voltage $V_{SS}$ is applied. These plurality of transistors apply the select gate lines (SGD, SGS, SGSb) included in unselected memory blocks BLK with the ground voltage $V_{SS}$. Note that the plurality of word lines WL included in the unselected memory blocks BLK enter a floating state.

The voltage select circuit 24 includes a plurality of voltage selectors 36 corresponding to the word lines WL and the select gate lines (SGD, SGS, SGSb). These plurality of voltage selectors 36 each include a plurality of the voltage select transistors 37. The voltage select transistor 37 is, for example, a field-effect type high breakdown voltage transistor. The voltage select transistors 37 have drain terminals each electrically connected to the corresponding word line WL or select gate lines (SGD, SGS, SGSb) via the wiring CG and the block select circuit 23. Source terminals are each electrically connected to the corresponding voltage supply line 31. Gate electrodes are each connected to the corresponding voltage select line 33.

[Configuration of Sense Amplifier SA]

The sense amplifiers SA0, SA1 (FIG. 4) include respective sense amplifier modules SAM0, SAM1 and respective cache memories CM0, CM1 (data registers). The cache memories CM0, CM1 include latch circuits XDL0, XDL1, respectively.

Note that, in the following description, the sense amplifier modules SAM0, SAM1 may be referred to as sense amplifier modules SAM, the cache memories CM0, CM1 may be referred to as cache memories CM, and the latch circuits XDL0, XDL1 may be referred to as latch circuits XDL.

The sense amplifier module SAM includes, for example, respective sense circuits corresponding to a plurality of bit lines BL, a plurality of latch circuits connected to the sense circuits, and the like.

The cache memory CM includes a plurality of latch circuits XDL. The plurality of latch circuits XDL are connected to the respective latch circuits in the sense amplifier module SAM. In the latch circuit XDL, for example, user data Dat to be written in the memory cell MC or user data Dat read from the memory cell MC is latched.

For example, as illustrated in FIG. 7, a column decoder COLD is connected to the cache memory CM. The column decoder COLD decodes a column address CA (FIG. 4) latched in the address register ADR (FIG. 4) to select the latch circuit XDL corresponding to the column address CA.

The user data Dat latched in these plurality of latch circuits XDL are sequentially transferred to the latch circuits in the sense amplifier module SAM in the write operation. The user data Dat included in the latch circuits in the sense amplifier module SAM is sequentially transferred to the latch circuit XDL in the read operation. The user data Dat included in the latch circuit XDL is sequentially transferred to the input/output control circuit I/O in a data-out described later via the column decoder COLD and a multiplexer MPX.

[Configuration of Voltage Generation Circuit VG]

For example, as illustrated in FIG. 5, the voltage generation circuit VG (FIG. 4) is connected to a plurality of voltage supply lines 31. The voltage generation circuit VG includes, for example, a step-down circuit, such as a regulator, and a step-up circuit, such as a charge pump circuit 32. These step-down circuit and step-up circuit are each connected to a voltage supply line to which a power supply voltage $V_{CC}$ and a ground voltage $V_{SS}$ (FIG. 4) are applied. These voltage supply lines are connected to, for example, the pad electrodes P described with reference to FIG. 2 and FIG. 3. For example, the voltage generation circuit VG generates a plurality of operating voltages applied to the bit line BL, the source line SL, the word line WL, and the select gate lines (SGD, SGS, SGSb) in the read operation, the write operation, and the erase operation on the memory cell array MCA, in accordance with a control signal from the sequencer SQC to simultaneously output the operating voltages to the plurality of voltage supply lines 31. The operating voltage output from the voltage supply line 31 is appropriately adjusted in accordance with the control signal from the sequencer SQC.

[Configuration of Sequencer SQC]

The sequencer SQC (FIG. 4) outputs an internal control signal to the row decoders RD0, RD1, the sense amplifier modules SAM0, SAM1, and the voltage generation circuit VG in response to command data Cmd latched in the command register CMR. The sequencer SQC outputs status data Stt indicating the state of the memory die MD to the status register STR as necessary.

The sequencer SQC generates a ready/busy signal and outputs the ready/busy signal to a terminal RY//BY. The terminal RY//BY enters an "L" state during execution of operations of applying a voltage to the memory cell array MCA, such as the read operation, the write operation, and the erase operation, and a get-feature, a set-feature, and the like, which will be described later. In the case other than them, the terminal RY//BY enters an "H" state. Even when operations, such as the data-out and a status-read, which will be described later, are executed, the terminal RY//BY does not enter the "L" state. In a period where the terminal RY//BY is in the "L" state (a busy period), an access to the memory die MD is basically inhibited. In a period where the terminal RY//BY is in the "H" state (a ready period), the access to the memory die MD is permitted. The terminal RY//BY is achieved by, for example, the pad electrode P described with reference to FIG. 2 and FIG. 3.

The sequencer SQC includes a feature register FR. The feature register FR is a register that latches feature data Fd. The feature data Fd includes, for example, control parameters of the memory die MD, and the like. The feature data Fd includes, for example, a value that indicates in which mode of an operation mode MODEa and an operation mode MODEb, which will be described later, the memory die MD is operated. The feature data Fd includes, for example, a value described later that indicates a state of the input/output control circuit I/O.

[Configuration of Address Register ADR]

As illustrated in FIG. 4, the address register ADR is connected to the input/output control circuit I/O and latches the address data Add input from the input/output control circuit I/O. The address register ADR includes, for example, a plurality of 8-bit register arrays. For example, when an internal operation, such as the read operation, the write operation, or the erase operation, is executed, the register array latches a plurality of pieces of the address data Add including the address data Add corresponding to the operation being executed and the address data Add corresponding to the operation to be executed next.

The address data Add includes, for example, the column address CA (FIG. 4) and the row address RA (FIG. 4). The row address RA includes, for example, a block address identifying the memory block BLK (FIG. 5), a page address identifying the string unit SU and the word line WL, a plane address identifying the memory cell array MCA (plane), and a chip address identifying the memory die MD.

When an operation corresponding to another address data Add is instructed during execution of an operation corresponding to one address data Add, the intended operation is not preferably executed in some cases. For example, in a certain memory die MD, when a data-out with respect to another plane (address data Add corresponding to a different plane) is instructed during execution of a data-out from one plane, operation timing is adjusted such that the next data-out starts after the first data-out ends.

In contrast to this, for example, in a configuration in which the plurality of memory dies MD are connected as illustrated in FIG. 2 and FIG. 3, when a data-out with respect to another memory die MD (address data Add corresponding to a different memory die) is instructed during execution of a data-out from a certain memory die MD, the user data Dat corresponding to the intended address cannot be preferably output in some cases.

The output of the user data Dat is instructed by switching (toggling) input signals of external control terminals /RE, RE. In the configuration in which the plurality of memory dies MD are connected as illustrated in FIG. 2 and FIG. 3, when a data-out with respect to another memory die MD (address data Add corresponding to a different memory die) is instructed during execution of a data-out from a certain memory die MD, both memory dies MD possibly execute the data-outs in response to the switching (toggling) of the input signals in the external control terminals /RE, RE.

Therefore, the semiconductor memory device according to the first embodiment is configured such that the address data Add that becomes an operation target can be switched by inputting a trigger signal. For example, in the configuration in which the plurality of memory dies MD are connected as illustrated in FIG. 2 and FIG. 3, when a data-out with respect to another memory die MD (address data Add corresponding to a different memory die) is instructed during execution of a data-out from a certain memory die MD, the memory die MD instructed of the data-out later does not start the data-out until the trigger signal is input even when the input signals in the external control terminals /RE, RE are switched (toggled). Then, the controller die CD inputs the trigger signal for switching the address data Add to all of the memory dies MD connected in common after detecting completion of the data-out from the memory die MD that has executed the data-out first, and after that, switches (toggles) the input signals of the external control terminals /RE, RE. The memory die MD that has executed the data-out first does not react even when the memory die MD receives the trigger signal from the controller die CD. In contrast to this, the memory die MD instructed of the data-out later becomes able to execute the data-out in response to the switching (toggling) of the input signals in the external control terminals /RE, RE by receiving the trigger signal from the controller die CD. Therefore, collision of the operations can be avoided between the memory die MD that has executed the data-out first and the memory die MD instructed of the data-out later. That is, the trigger signal serves as a signal for instructing the memory die MD that the data-out can be started. Accordingly, in the configuration in which the plurality of memory dies MD are connected as illustrated in FIG. 2 and FIG. 3, the data-outs from the plurality of memory dies MD can be continuously executed.

[Configuration of Command Register CMR]

The command register CMR is connected to the input/output control circuit I/O and latches the command data Cmd input from the input/output control circuit I/O. The command register CMR includes, for example, at least one set of 8-bit register array. When the command data Cmd is latched in the command register CMR, a control signal is input to the sequencer SQC.

[Configuration of Status Register STR]

The status register STR is connected to the input/output control circuit I/O and latches the status data Stt output to the input/output control circuit I/O. The status register STR includes, for example, a plurality of 8-bit register arrays. For example, when an internal operation, such as the read operation, the write operation, or the erase operation, is executed, the register array latches the status data Stt related to the internal operation being executed. Further, the register array latches, for example, ready/busy information of the memory cell arrays MCA0, MCA1.

[Configuration of Data Output Timing Adjustment Portion TCT]

The data output timing adjustment portion TCT is connected to a bus wiring DB between the cache memories CM0, CM1 and the input/output control circuit I/O. For example, in a case, such as where the data-out described later is continuously executed with respect to the cache memories CM0, CM1, in order to start the data-out of the cache memory CM1 without a time interval after completion of the data-out of the cache memory CM0, the data output timing adjustment portion TCT adjusts the start timing of the data-out with respect to the cache memory CM1.

[Configuration of Input/Output Control Circuit I/O]

The input/output control circuit I/O (FIG. 4) includes data signal input/output terminals DQ0 to DQ7, data strobe signal input/output terminals DQS, /DQS, a shift register, and a buffer circuit. Each circuit in the input/output control circuit I/O (FIG. 4) is connected to a terminal to which a power supply voltage $V_{CCQ}$ and the ground voltage $V_{SS}$ (FIG. 4) are applied. The terminals to which the power supply voltage $V_{CCQ}$ and the ground voltage $V_{SS}$ are applied are achieved by, for example, the pad electrodes P described with reference to FIG. 2 and FIG. 3.

Each of the data signal input/output terminals DQ0 to DQ7 and the data strobe signal input/output terminals DQS, /DQS is achieved by, for example, the pad electrode P described with reference to FIG. 2 and FIG. 3. Data input via the data signal input/output terminals DQ0 to DQ7 are input from the buffer circuit to the cache memory CM, the address register ADR, or the command register CMR in response to an internal control signal from the logic circuit CTR. Data output via the data signal input/output terminals DQ0 to DQ7 are input to the buffer circuit from the cache memory CM or the status register STR in response to the internal control signal from the logic circuit CTR.

Signals (such as, a data strobe signal and its complementary signal) input via the data strobe signal input/output terminals DQS, /DQS are used for the input of the data via the data signal input/output terminals DQ0 to DQ7. The data input via the data signal input/output terminals DQ0 to DQ7 is retrieved in the shift register in the input/output control circuit I/O at a timing of a voltage rise edge (switching of the input signal) of the data strobe signal input/output terminal DQS and a voltage fall edge (switching of the input signal) of the data strobe signal input/output terminal /DQS, and at a timing of a voltage fall edge (switching of the input signal) of the data strobe signal input/output terminal DQS and a voltage rise edge (switching of the input signal) of the data strobe signal input/output terminal /DQS.

For example, as illustrated in FIG. 8, the input/output control circuit I/O (FIG. 4) includes input circuits 201 and output circuits 202 each connected to the data signal input/output terminals DQ0 to DQ7 and the data strobe signal input/output terminals DQS, /DQS. The input circuit 201 is, for example, a receiver, such as a comparator. The output circuit 202 is, for example, a driver, such as an Off Chip Driver (OCD) circuit.

The input/output control circuit I/O (FIG. 4) includes a plurality of latch circuits 203 disposed corresponding to the respective data signal input/output terminals DQ0 to DQ7. These plurality of latch circuits 203 are connected to output terminals of the input circuits 201 connected to the corresponding data signal input/output terminals DQ0 to DQ7. These plurality of latch circuits 203 latch "H" or "L" according to voltage values of the output terminals of the input circuits 201 at a timing of the switching of the input signals of the data strobe signal input/output terminals DQS, /DQS as described above.

Additionally, the input/output control circuit I/O (FIG. 4) includes signal transfer circuits 204 disposed corresponding to the respective data strobe signal input/output terminals DQS, /DQS. The signal transfer circuit 204 includes, for example, an even number of CMOS inverters connected in series. An input terminal of the signal transfer circuit 204 is connected to an output terminal of the input circuit 201. An output terminal of the signal transfer circuit 204 is connected to the latch circuit 203.

Additionally, the input/output control circuit I/O (FIG. 4) includes an internal path delay detection circuit 205. As illustrated in FIG. 9, the internal path delay detection circuit 205 includes a signal transfer circuit 211 and a NAND circuit 212. The signal transfer circuit 211 includes a configuration similar to that of the signal transfer circuit 204 described with reference to FIG. 8. The signal transfer circuit 211 serves as a replica of the signal transfer circuit 204. One input terminal of the NAND circuit 212 is connected to an output terminal of the signal transfer circuit 211. To the other input terminal of the NAND circuit 212, an enable signal of the internal path delay detection circuit 205 is input. An output terminal of the NAND circuit 212 is connected to an input terminal of the signal transfer circuit 211 and an input terminal of a counter 213.

Depending on usage conditions of the semiconductor memory device, the operating state of the signal transfer circuit 204 described with reference to FIG. 8 varies in some cases. In such cases, signal delay amounts may differ between signal propagation paths corresponding to the data signal input/output terminals DQ0 to DQ7 and signal propagation paths corresponding to the data strobe signal input/output terminals DQS, /DQS. The internal path delay detection circuit 205 is a circuit for detecting such a difference in the signal delay amounts.

For example, when the signal delay amount is detected, the enable signal of the NAND circuit 212 (FIG. 9) enters the "H" state for a certain period. In association with this, an output signal of the NAND circuit 212 oscillates at a frequency according to the delay amount in the signal transfer circuit 211. Therefore, by detecting a count of pulses output from the output terminal of the NAND circuit 212 during this period by the counter 213, the signal delay amounts in the signal transfer circuits 204, 211 can be measured. The count of pulses is latched in the feature register FR as one piece of the feature data Fd.

[Configuration of Logic Circuit CTR]

The logic circuit CTR (FIG. 4) includes a plurality of external control terminals /CE, CLE, ALE, /WE, /RE, RE, /WP and logic circuits connected to these plurality of external control terminals /CE, CLE, ALE, /WE, /RE, RE, /WP. The logic circuit CTR receives an external control signal from the controller die CD via the external control terminals /CE, CLE, ALE, /WE, /RE, RE, /WP and outputs the internal control signal to the input/output control circuit I/O in response to the external control signal.

For example, as illustrated in FIG. 8, the logic circuit CTR includes the input circuits 201 connected to the respective external control terminals /CE, CLE, ALE, /WE, /RE, RE, /WP and the output circuits 202 connected to the respective external control terminals CLE, ALE. The respective external control terminals /CE, CLE, ALE, /WE, /RE, RE, /WP are achieved by, for example, the pad electrodes P described with reference to FIG. 2 and FIG. 3.

A signal (such as, a chip enable signal) input via the external control terminal /CE is used for selection of the memory die MD. In the first embodiment, the memory die MD in which "L" is input to the external control terminal /CE enters a state where an input/output of the user data Dat, the command data Cmd, and the address data Add (hereinafter, may be simply referred to as "data") is possible. In the first embodiment, the memory die MD in which "H" is input to the external control terminal /CE enters a state where the input/output of the data is difficult. As illustrated in FIG. 8, the external control terminal /CE is connected to the input circuit 201.

A signal (such as, a command latch enable signal) input via the external control terminal CLE is used, for example, when the command register CMR is used. The functions and the like of the external control terminal CLE will be described later.

A signal (such as, an address latch enable signal) input via the external control terminal ALE is used, for example, when the address register ADR is used. The functions and the like of the external control terminal ALE will be described later.

A signal (such as, a write enable signal) input via the external control terminal /WE is used, for example, for the input of the data from the controller die CD to the memory die MD. The functions and the like of the external control terminal /WE will be described later.

Signals (such as, a read enable signal and its complementary signal) input via the external control terminals /RE, RE are used for the output of the data via the data signal input/output terminals DQ0 to DQ7. The data output from the data signal input/output terminals DQ0 to DQ7 is switched at a timing of a voltage fall edge (switching of the input signal) of the external control terminal /RE and a voltage rise edge (switching of the input signal) of the external control terminal RE, and at a timing of a voltage rise edge (switching of the input signal) of the external control terminal /RE and a voltage fall edge (switching of the input signal) of the external control terminal RE.

A signal (such as, a write protect signal) input via the external control terminal /WP is used, for example, for restriction of the input of the user data Dat from the controller die CD to the memory die MD.

For example, as illustrated in FIG. 4, the logic circuit CTR includes a switching circuit C20. In the memory die MD, when a data-out with respect to another plane (address data Add corresponding to a different plane) is instructed during execution of a data-out from one plane, the switching circuit C20 adjusts the operation timing such that the next data-out starts after the first data-out ends. Further, in the configuration in which the plurality of memory dies MD are connected as illustrated in FIG. 2 and FIG. 3, when a data-out with respect to the memory die MD (address data Add corresponding to a different memory die) is instructed during execution of a data-out from another memory die MD, the switching circuit C20 controls so as not to start the data-out until the trigger signal is received from the controller die CD even when the input signals in the external control terminals /RE, RE are switched (toggled).

[Operation Mode MODEa and Operation Mode MODEb]

The semiconductor memory device according to the embodiment can be operated in the operation mode MODEa and the operation mode MODEb. In the following, the operation mode MODEa and the operation mode MODEb will be described with reference to FIG. 10 to FIG. 31.

[Roles of External Terminals in Each Mode]

Figure 10:
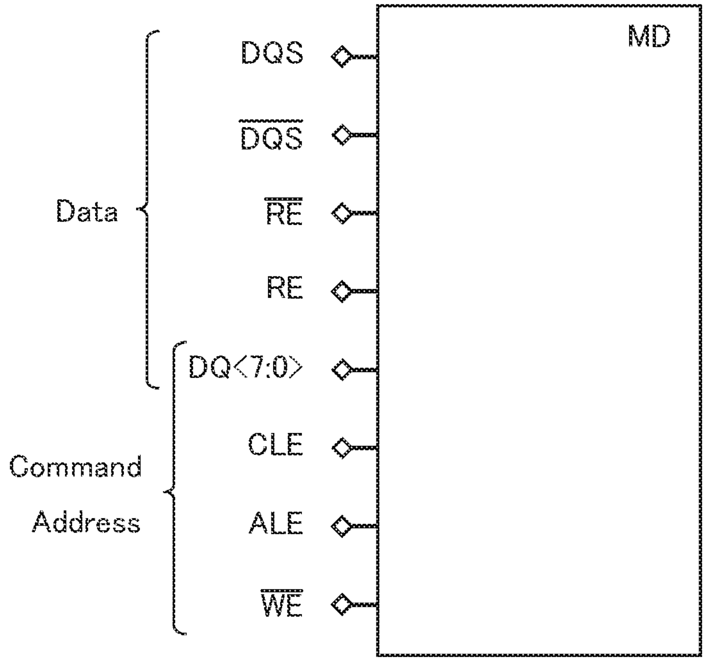
FIG. 10 is a schematic diagram for describing an operation mode MODEa.
Figure 11:
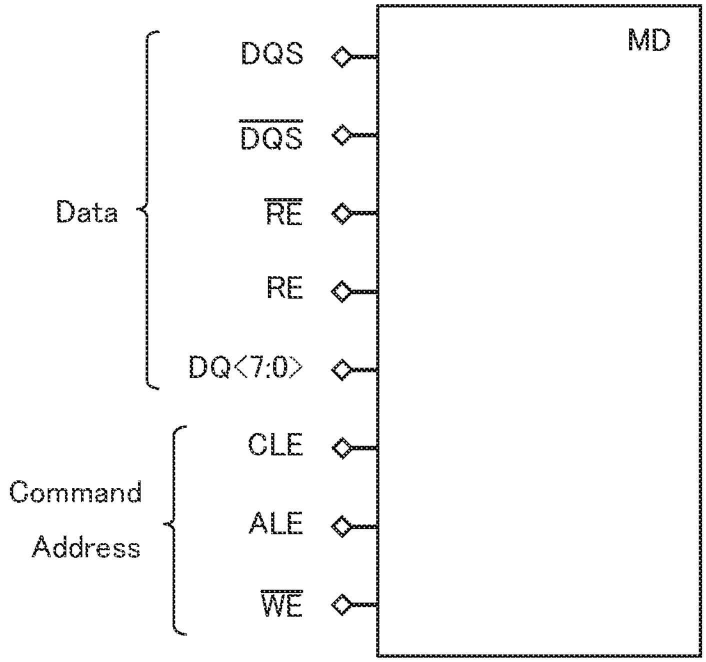
FIG. 11 is a schematic diagram for describing an operation mode MODEb.

FIG. 10 is a schematic diagram for describing the roles of the signal input/output terminals and the external control terminals in the operation mode MODEa. FIG. 11 is a schematic diagram for describing the roles of the signal input/output terminals and the external control terminals in the operation mode MODEb. Note that, in the following description, the data signal input/output terminals DQ0 to DQ7 are referred to as data signal input/output terminals DQ<7:0> in some cases.

In the operation mode MODEa, for example, as illustrated in FIG. 10, the data signal input/output terminals DQ<7:0> are used for the input/output of data other than the user data Dat, such as the command data Cmd, the address data Add, the status data Stt, or the feature data Fd, in addition to the input/output of the user data Dat.

On the other hand, in the operation mode MODEb, for example, as illustrated in FIG. 11, the data signal input/output terminals DQ<7:0> are used for the input/output of the user data Dat but are not basically used for the input/output of the data other than the user data Dat, such as the command data Cmd, the address data Add, the status data Stt, or the feature data Fd. In the operation mode MODEb, the external control terminals CLE, ALE are used for the input/output of the data other than the user data Dat.

[Roles of External Terminals in Operation Mode MODEa]

FIG. 12 is a truth table for describing the roles of the external terminals in the operation mode MODEa. In FIG. 12, "Z" indicates a case where any of "H" and "L" may be input. "X" indicates a case where the input signal is fixed to "H" or "L". "Input" indicates a case where data is input. "Output" indicates a case where data is output.

When the command data Cmd is input in the operation mode MODEa, for example, the controller die CD sets the voltages of the data signal input/output terminals DQ<7:0> to "H" or "L" according to each bit of the 8-bit command data Cmd and raises the voltage of the external control terminal /WE from "L" to "H" in a state where "H" is input to the external control terminal CLE and "L" is input to the external control terminal ALE.

When "H, L" are input to the external control terminals CLE, ALE, the data input via the data signal input/output terminals DQ<7:0> is latched in a buffer memory in the input/output control circuit I/O as the command data Cmd and transferred to the command register CMR (FIG. 4).

When the address data Add is input, for example, the controller die CD sets the voltages of the data signal input/output terminals DQ<7:0> to "H" or "L" according to each bit of 8-bit data constituting the address data Add and raises the voltage of the external control terminal /WE from "L" to "H" in a state where "L" is input to the external control terminal CLE and "H" is input to the external control terminal ALE.

When "L, H" are input to the external control terminals CLE, ALE, the data input via the data signal input/output terminals DQ<7:0> is latched in the buffer memory in the input/output control circuit I/O as the address data Add and transferred to the address register ADR (FIG. 4).

When the user data Dat is input, for example, the controller die CD sets the voltages of the data signal input/output terminals DQ<7:0> to "H" or "L" according to each bit of 8-bit data constituting the user data Dat and switches (toggles) the input signals of the data strobe signal input/output terminals DQS, /DQS in a state where "L" is input to the external control terminal CLE and "L" is input to the external control terminal ALE.

When "L" is input to both of the external control terminals CLE, ALE, the data input via the data signal input/output terminals DQ<7:0> is latched in the buffer memory in the input/output control circuit I/O as the user data Dat and transferred to the cache memory CM (FIG. 4) via the bus wiring DB.

When the user data Dat or the status data Stt is output, for example, the controller die CD switches (toggles) the input signals of the external control terminals /RE, RE. In association with this, 8 bits among the output user data Dat or status data Stt are output to the data signal input/output terminals DQ0 to DQ7. Further, output signals of the data strobe signal input/output terminals DQS, /DQS are switched.

When the memory die MD is brought into a standby state, for example, the controller die CD inputs "H" to the external control terminal /CE.

When the memory die MD is brought into a bus idle state, for example, the controller die CD inputs "H" to the external control terminal /WE.

[Roles of External Terminals in Operation Mode MODEb]

FIG. 13 to FIG. 15 are truth tables for describing the roles of the external terminals in the operation mode MODEb. In FIG. 13 to FIG. 15, "Z" indicates a case where any of "H" and "L" may be input. "X" indicates a case where the input signal is fixed to "H" or "L". "Input" indicates a case where data is input. "Output" indicates a case where data is output.

As described above, in the operation mode MODEb, the external control terminals CLE, ALE are used for the input/output of the command data Cmd, the address data Add, the status data Stt, the feature data Fd, and the like. Here, as described later with reference to FIG. 17 and the like, in the operation mode MODEb, prior to the input/output and the like of these data, a signal specifying the type of input data or output data is input. Hereinafter, such a signal is referred to as an input/output data select signal. In the operation mode MODEb, the input/output data select signal may be referred to as a header, and the command data Cmd, the address data Add, the status data Stt, the feature data Fd, and the like, which are input/output following the input/output data select signal, may be referred to as bodies. A combination of one header and one body may be referred to as a frame.

FIG. 13 illustrates the roles of the external control terminals in a first cycle of a period FSel (FIG. 17) in which the input/output data select signal is input.

In the first cycle of the period FSel, when the input/output data select signal indicative of inputting the address data Add is input, for example, the controller die CD raises the voltage of the external control terminal /WE from "L" to "H" in the state where "L" is input to the external control terminal CLE and "H" is input to the external control terminal ALE.

In the first cycle of the period FSel, when "L" is input to the external control terminal CLE and "H" is input to the external control terminal ALE, the period FSel ends in one cycle. The data input in a period S_In immediately after this period FSel is latched in the buffer memory in the input/output control circuit I/O as the address data Add and transferred to the address register ADR (FIG. 4).

In the first cycle of the period FSel, when the input/output data select signal indicative of inputting the command data Cmd is input, for example, the controller die CD raises the voltage of the external control terminal /WE from "L" to "H" in the state where "H" is input to the external control terminal CLE and "L" is input to the external control terminal ALE.

In the first cycle of the period FSel, when "H" is input to the external control terminal CLE and "L" is input to the external control terminal ALE, the period FSel ends in one cycle. The data input in the period S_In immediately after this period FSel is latched in the buffer memory in the input/output control circuit I/O as the command data Cmd and transferred to the command register CMR (FIG. 4).

In the first cycle of the period FSel, when the input/output data select signal indicative of inputting the trigger signal for instructing that the data-out can be started is input, for example, the controller die CD raises the voltage of the external control terminal /WE from "L" to "H" in a state where "H" is input to the external control terminal CLE and "H" is input to the external control terminal ALE.

In the first cycle of the period FSel, when "H" is input to the external control terminal CLE and "H" is input to the external control terminal ALE, the period FSel ends in one cycle. Further, the address data of the operation target is switched.

In the first cycle of the period FSel, when the input/output data select signal indicative of executing other operations is input, for example, the controller die CD raises the voltage of the external control terminal /WE from "L" to "H" in the state where "L" is input to the external control terminal CLE and "L" is input to the external control terminal ALE.

In the first cycle of the period FSel, when "L" is input to the external control terminal CLE and "L" is input to the external control terminal ALE, a second cycle is added to the period FSel.

FIG. 14 illustrates the roles of the external control terminals in the second cycle of the period FSel in which the input/output data select signal is input.

In the second cycle of the period FSel, when the input/output data select signal indicative of inputting data other than the user data Dat, the address data Add, or the command data Cmd is input, for example, the controller die CD raises the voltage of the external control terminal /WE from "L" to "H" in the state where "L" is input to the external control terminal CLE and "H" is input to the external control terminal ALE.

The data other than the user data Dat, the address data Add, or the command data Cmd includes, for example, address data in a case where an address is specified in executing the status-read or the get-feature. Additionally, the feature data Fd required in executing the set-feature is included.

In the second cycle of the period FSel, when "L" is input to the external control terminal CLE and "H" is input to the external control terminal ALE, the data input in the period S_In immediately after this period FSel is transferred to the address register ADR (FIG. 4), the feature register FR (FIG. 4), and the like according to the command data Cmd that has been input before the period S_In.

In the second cycle of the period FSel, when the input/output data select signal indicative of outputting data other than the user data Dat is input, for example, the controller die CD raises the voltage of the external control terminal /WE from "L" to "H" in the state where "H" is input to the external control terminal CLE and "H" is input to the external control terminal ALE.

The data other than the user data Dat includes, for example, the status data Stt, the feature data Fd output in response to execution of the get-feature, and the like.

In the second cycle of the period FSel, when "H" is input to the external control terminal CLE and "H" is input to the external control terminal ALE, the data output in the period S_In immediately after this period FSel is selected according to the command data Cmd that has been input before the period S_In and is output from the input/output control circuit I/O.

In the second cycle of the period FSel, when the input/output data select signal indicative of executing other operations is input, for example, the controller die CD raises the voltage of the external control terminal /WE from "L" to "H" in the state where "L" is input to the external control terminal CLE and "L" is input to the external control terminal ALE.

Note that the signals input to the external control terminals CLE, ALE during the period FSel are not stored in the command register CMR (FIG. 4), the address register ADR (FIG. 4), and the like. In the second cycle of the period FSel, when "L" is input to the external control terminal CLE and "L" is input to the external control terminal ALE, a third cycle may be added to the period FSel.

FIG. 15 illustrates the roles of the external control terminals in the period S_In in which the data other than the user data Dat is input or in a period S_Out in which the data other than the user data Dat is output.

When the data other than the user data Dat is input in the period S_In, for example, the controller die CD sets the voltages of the external control terminals CLE, ALE to "H" or "L" according to each bit of 2-bit data constituting the data other than the user data Dat and raises the voltage of the external control terminal /WE from "L" to "H".

When the user data Dat is input in the operation mode MODEb, for example, the controller die CD sets the voltages of the data signal input/output terminals DQ<7:0> to "H" or "L" according to each bit of the 8-bit data constituting the user data Dat and switches the input signals of the data strobe signal input/output terminals DQS, /DQS in a state where "H, L" are input to the external control terminals /RE, RE. This operation can be executed in the period FSel and in the periods S_In, S_Out.

In the operation mode MODEb, the data input via the data signal input/output terminals DQ<7:0> is latched in the buffer memory in the input/output control circuit I/O as the user data Dat and transferred to the cache memory CM via the bus wiring DB.

When the data other than the user data Dat is output in the period S_Out, for example, the controller die CD lowers the input signal of the external control terminal /WE. In association with this, the 2-bit data constituting the data other than the user data Dat is output from the external control terminals CLE, ALE.

When the memory die MD is brought into the standby state in the periods S_In, S_Out, for example, the controller die CD inputs "H" to the external control terminal /CE.

When the memory die MD is brought into the bus idle state in the periods S_In, S_Out, for example, the controller die CD inputs "H" to the external control terminal /WE.

[Example of Signal Input/Output in Each Mode]

Figure 16:
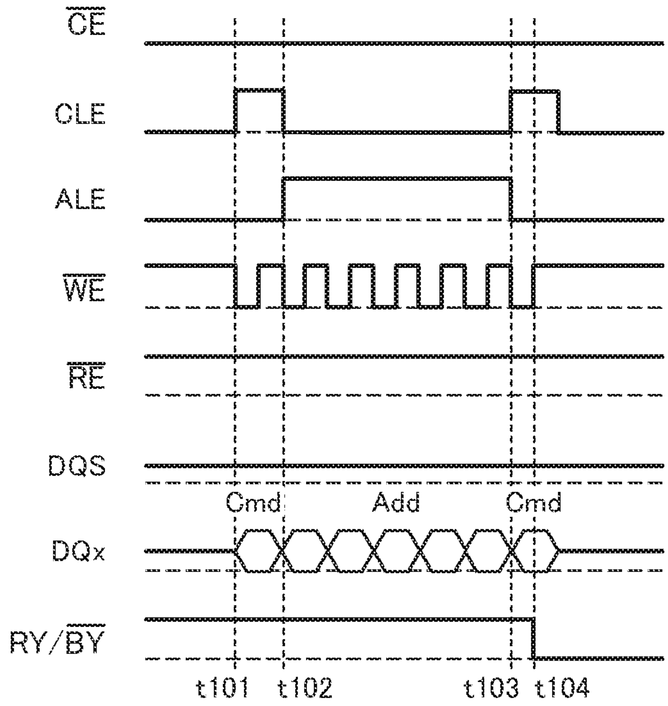
FIG. 16 is a schematic waveform diagram for describing the operation mode MODEa.
Figure 17:
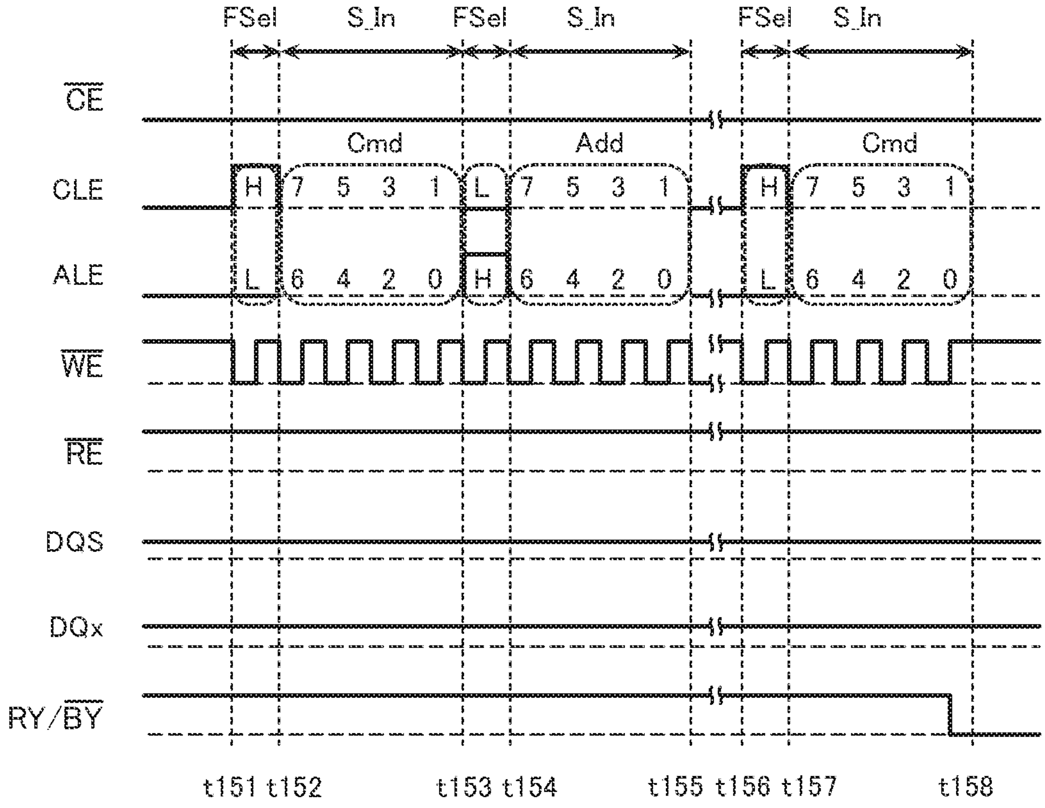
FIG. 17 is a schematic waveform diagram for describing the operation mode MODEb.

FIG. 16 and FIG. 17 are schematic waveform diagrams for describing the operations of the memory die MD according to the first embodiment.

FIG. 16 illustrates a waveform when the command data Cmd and the address data Add are input in the operation mode MODEa. In the example of FIG. 16, at timing t101, the controller die CD inputs the command data Cmd to the memory die MD. At timing t102, the controller die CD inputs the address data Add to the memory die MD. In the illustrated example, at timing t102 to timing t103, while the data of 8 bits ×5 cycles constituting the address data Add is input, the number of cycles may be less than or more than five. At timing t103, the controller die CD inputs the command data Cmd to the memory die MD. At timing t104, the command data Cmd is accepted in response to the rise edge of the signal input to the external control terminal /WE. Accordingly, the operation, such as the read operation, is started, and the voltage of the terminal RY//BY falls from "H" to "L". Note that there may be a slight delay from when the command data Cmd is accepted to when the voltage of the terminal RY//BY falls from "H" to "L".

FIG. 17 illustrates a waveform when the command data Cmd and the address data Add are input in the operation mode MODEb. In the example of FIG. 17, "L" and "H" are input to the external control terminal /WE at an approximately constant pace. When a period from when the input signal of the external control terminal /WE falls once to when it falls again is set to one cycle, FIG. 17 exemplifies the periods FSel having one cycle and the periods S_In having four cycles.

In the example of FIG. 17, in the period FSel from timing t151 to timing t152, the controller die CD inputs the input/output data select signal specifying the input of the command data Cmd to the memory die MD.

In the period S_In from timing t152 to timing t153, the controller die CD inputs the command data Cmd to the memory die MD.

Here, in the example of FIG. 17, in the period S_In, the controller die CD inputs the 8-bit command data Cmd to the memory die MD in four cycles of 2 bits each in a divided manner. For example, the 8-bit command data Cmd is set to bits "7" to "0". First, in the data input of the first cycle, in a state where the voltages of the external control terminals CLE, ALE are set to "H" or "L" according to the bits "7", "6", the voltage of the external control terminal /WE is raised from "L" to "H". Similarly in the data input of the second cycle to the fourth cycle, in the state where the voltages of the external control terminals CLE, ALE are each set to "H" or "L" according to the bits "5", "4", the bits "3", "2", and the bits "1", "0", the voltage of the external control terminal /WE is raised from "L" to "H".

In the period FSel from timing t153 to timing t154, the controller die CD inputs the input/output data select signal specifying the input of the address data Add to the memory die MD.

In the period S_In from timing t154 to timing t155, the controller die CD inputs the address data Add to the memory die MD.

Here, in the example of FIG. 17, in the period S_In, the controller die CD inputs the 8-bit data constituting the address data Add to the memory die MD in four cycles of 2 bits each in a divided manner.

Although not illustrated, similarly in a period from timing t155 to timing t156, the data constituting the address data Add is input by 2 bits each.

In the period FSel from timing t156 to timing t157, similarly to from timing t151 to timing t152, the input/output data select signal specifying the input of the command data Cmd is input.

In the period S_In from timing t157 to timing t158, the controller die CD inputs the command data Cmd to the memory die MD. A little before timing t158, and at a timing of the rise edge of the signal input to the external control terminal /WE, the operation, such as the read operation, is started, and the voltage of the terminal RY//BY falls from "H" to "L".

[Operation]

Next, the operations of the memory die MD will be described.

The memory die MD is configured to be able to execute the read operation. The read operation is an operation of reading the user data Dat from the memory cell array MCA by the sense amplifier module SAM (FIG. 4) and transferring the read user data Dat to the latch circuit XDL (FIG. 4). In the read operation, the user data Dat read from the memory cell array MCA is transferred to the latch circuit XDL via the bit line BL and the sense amplifier module SAM.

The memory die MD is configured to be able to execute the data-out. The data-out is an operation of outputting the user data Dat included in the latch circuit XDL (FIG. 4) to the controller die CD (FIG. 1). In the data-out, the user data Dat included in the latch circuit XDL is output to the controller die CD via the column decoder COLD described with reference to FIG. 7, the multiplexer MPX, the bus wiring DB, and the input/output control circuit I/O.

The memory die MD is configured to be able to execute the status-read (status information output operation). The status-read is an operation of outputting the status data Stt included in the status register STR (FIG. 4) to the controller die CD (FIG. 1). In the status-read, the status data Stt included in the status register STR is output to the controller die CD via the input/output control circuit I/O or the logic circuit CTR.

The memory die MD is configured to be able to execute the get-feature (characteristic information output operation). The get-feature is an operation of outputting the feature data Fd included in the feature register FR (FIG. 4) to the controller die CD (FIG. 1). In the get-feature, the feature data Fd included in the feature register FR is output to the controller die CD via the input/output control circuit I/O or the logic circuit CTR.

The memory die MD is configured to be able to execute the set-feature. The set-feature is an operation of inputting the feature data Fd to the feature register FR (FIG. 4). In the set-feature, the feature data Fd is input from the controller die CD to the feature register FR via the input/output control circuit I/O or the logic circuit CTR.

[Read Operation and Data-Out in Operation Mode MODEa]

Figure 18:
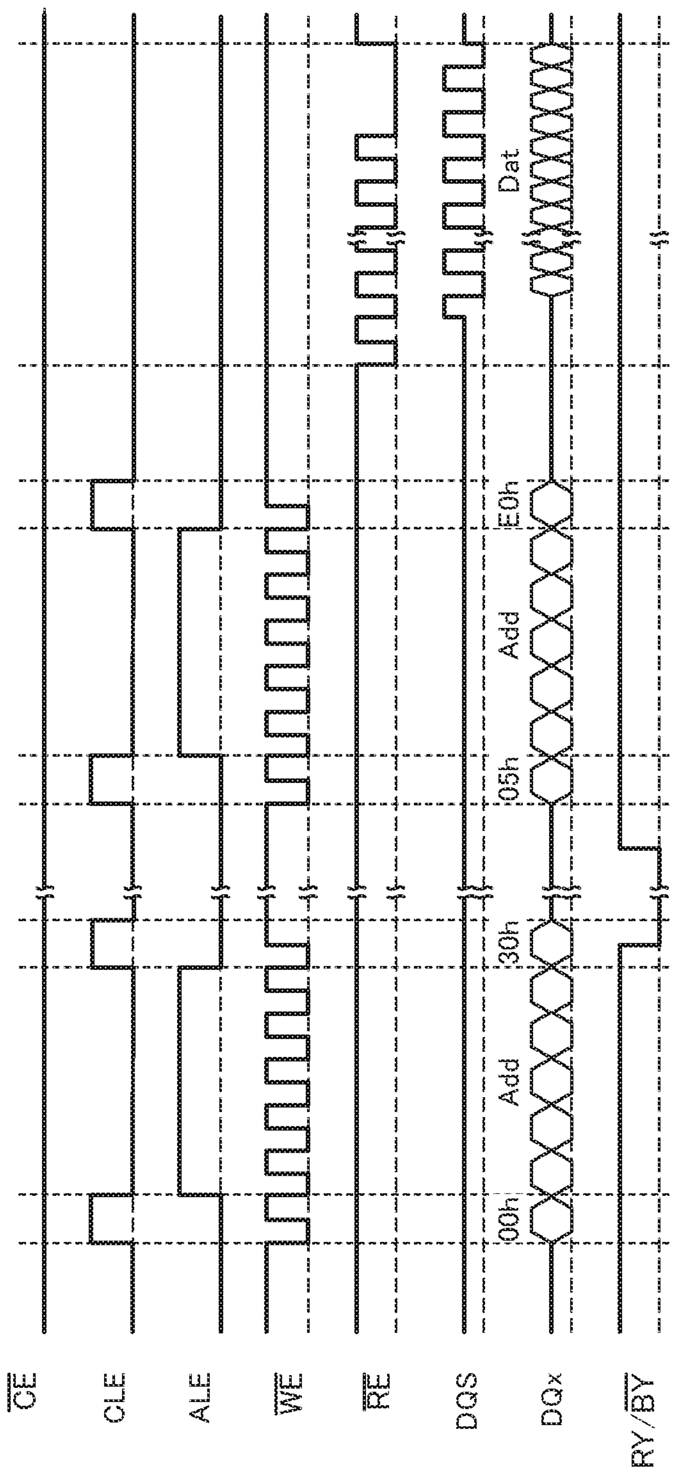
FIG. 18 is a schematic waveform diagram for describing the operation mode MODEa.

FIG. 18 is a schematic waveform diagram illustrating a state when the read operation and the data-out are executed in the operation mode MODEa. In the example of FIG. 18, the memory die MD is set to the operation mode MODEa.

In the example of FIG. 18, first, command data "00h", the address data Add, and command data "30h" are sequentially input via the data signal input/output terminals DQ<7:0>. The command data "00h" is the command data Cmd that is input at the start of a command set instructing a read operation. The command data "30h" is the command data Cmd that is input at the end of the command set instructing a read operation.

In association with the input of the command data "00h", the address data Add, and the command data "30h", the read operation is started and the voltage of the terminal RY//BY falls from "H" to "L". The user data Dat is transferred to the latch circuit XDL. At the timing when the read operation ends, the voltage of the terminal RY//BY rises from "L" to "H".

Next, command data "05h", the address data Add, and command data "E0h" are sequentially input via the data signal input/output terminals DQ<7:0>. The command data "05h" is the command data Cmd that is input at the start of a command set instructing a data-out. The command data "E0h" is the command data Cmd that is input at the end of the command set instructing a data-out.

In association with the input of the command data "05h", the address data Add, and the command data "E0h", the controller die CD switches (toggles) the input signals of the external control terminals /RE, RE after a predetermined standby time. Accordingly, the data-out is started, and the user data Dat is output via the data signal input/output terminals DQ<7:0>.

Figure 19:
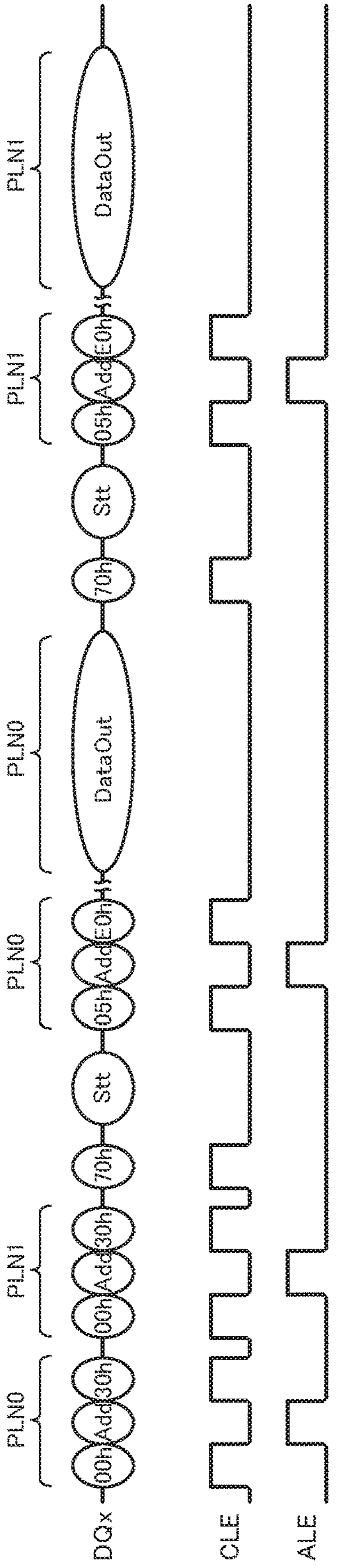
FIG. 19 is a schematic waveform diagram for describing the operation mode MODEa.

FIG. 19 is a schematic waveform diagram illustrating another state when the read operations and the data-outs are executed in the operation mode MODEa. In the example of FIG. 19, the memory die MD is set to the operation mode MODEa.

In the example of FIG. 19, first, the command data "00h", the address data Add, and the command data "30h" are sequentially input via the data signal input/output terminals DQ<7:0>. The address data Add included in this command set includes information on the plane PLN0 (FIG. 4) that becomes a target of the read operation as the above-described plane address.

In association with the input of the command data "00h", the address data Add, and the command data "30h", the read operation is started with respect to the plane PLN0, and the user data Dat is transferred to the latch circuit XDL0.

Next, the command data "00h", the address data Add, and the command data "30h" are sequentially input via the data signal input/output terminals DQ<7:0>. The address data Add included in this command set includes information on the plane PLN1 (FIG. 4) that becomes a target of the read operation as the above-described plane address.

In association with the input of the command data "00h", the address data Add, and the command data "30h", the read operation is started with respect to the plane PLN1, and the user data Dat is transferred to the latch circuit XDL1.

Next, command data "70h" is input via the data signal input/output terminals DQ<7:0>. The command data "70h" is the command data Cmd that instructs the status-read. In association with the input of the command data "70h", the status-read is executed, and the status data Stt is output via the data signal input/output terminals DQ<7:0>.

Next, the command data "05h", the address data Add, and the command data "E0h" are sequentially input via the data signal input/output terminals DQ<7:0>. The address data Add included in this command set includes information on the plane PLN0 (FIG. 4) that becomes a target of the data-out as the above-described plane address.

In association with the input of the command data "05h", the address data Add, and the command data "E0h", the controller die CD switches (toggles) the input signals of the external control terminals /RE, RE after a predetermined standby time. Accordingly, the data-out is started with respect to the plane PLN0, and user data "DataOut" is output via the data signal input/output terminals DQ<7:0>.

After the data-out with respect to the plane PLN0 ends, the command data "70h" is input via the data signal input/output terminals DQ<7:0>. In association with the input of the command data "70h", the status-read is executed again, and the status data Stt is output via the data signal input/output terminals DQ<7:0>.

Next, similarly to the data-out with respect to PLN0, the command data "05h", the address data Add, and the command data "E0h" are sequentially input via the data signal input/output terminals DQ<7:0>. The address data Add included in this command set includes information on the plane PLN1 (FIG. 4) that becomes a target of the data-out as the above-described plane address.

After the elapse of a predetermined time, the controller die CD switches (toggles) the input signals of the external control terminals /RE, RE. Accordingly, the data out is started with respect to the plane PLN1, and the user data "DataOut" is output via the data signal input/output terminals DQ<7:0>.

[Read Operation and Data-Out in Operation Mode MODEb]

Figure 20:
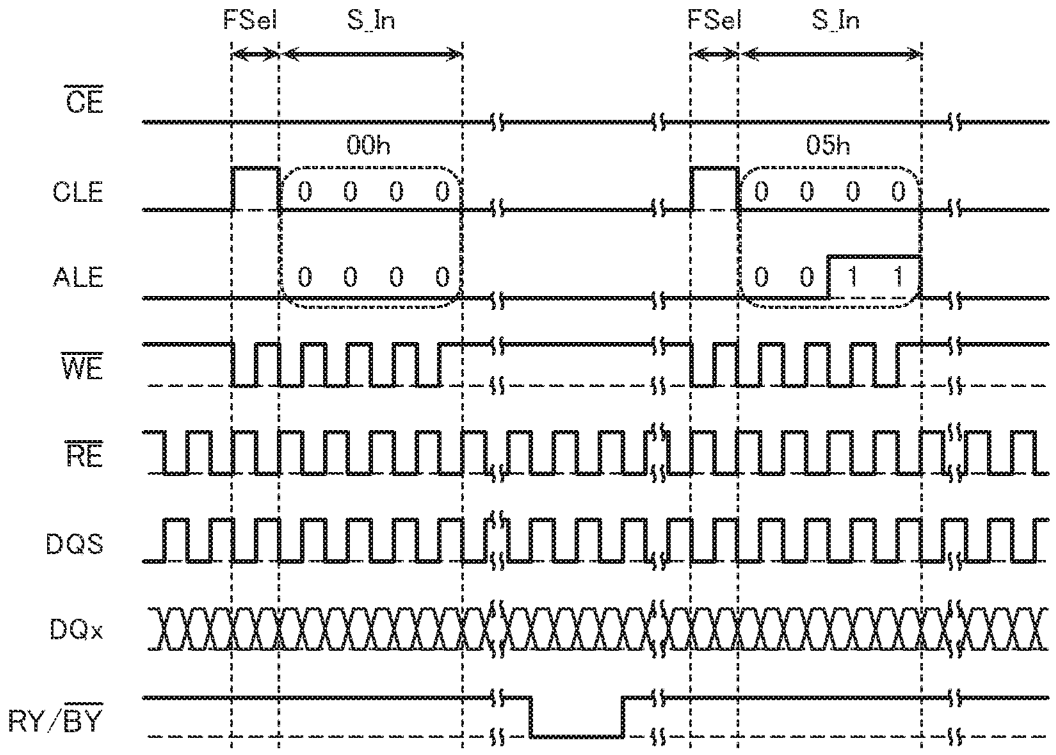
FIG. 20 is a schematic waveform diagram for describing the operation mode MODEb.

FIG. 20 is a schematic waveform diagram illustrating a state when the read operation and the data-out are executed in the operation mode MODEb. In the example of FIG. 20, the memory die MD is set to the operation mode MODEb.

In the example of FIG. 20, first, a command set including the command data "00h" is input via the external control terminals CLE, ALE. Next, a command set including the command data "05h" is input via the external control terminals CLE, ALE. In the operation mode MODEb, the input/output of the data via the data signal input/output terminals DQ<7:0> and the input/output of the data via the external control terminals CLE, ALE can be executed at independent timings. For example, in the example of FIG. 20, the input of these command sets is executed during execution of the data-out (during the period of toggling the input signals of the external control terminals /RE, RE).

Figure 21:
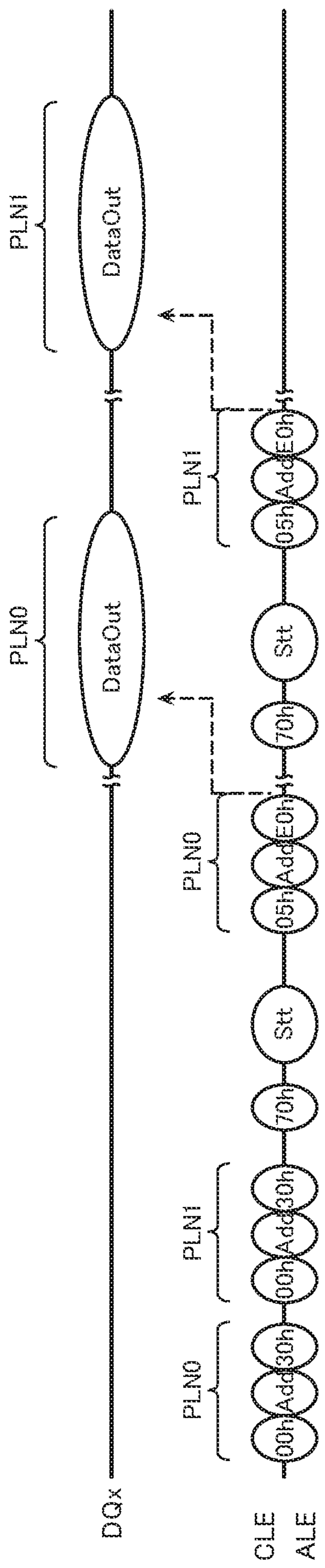
FIG. 21 is a schematic waveform diagram for describing the operation mode MODEb.

FIG. 21 is a schematic waveform diagram illustrating another state when the read operations and the data-outs are executed in the operation mode MODEb. In the example of FIG. 21, the memory die MD is set to the operation mode MODEb.

In the example of FIG. 21, first, the command data "00h", the address data Add, and the command data "30h" are sequentially input via the external control terminals CLE, ALE. The address data Add included in this command set includes the information on the plane PLN0 (FIG. 4) that becomes a target of the read operation as the above-described plane address.

Next, the command data "00h", the address data Add, and the command data "30h" are sequentially input via the external control terminals CLE, ALE. The address data Add included in this command set includes the information on the plane PLN1 (FIG. 4) that becomes a target of the read operation as the above-described plane address.

Next, the command data "70h" is input via the external control terminals CLE, ALE. In association with the input of the command data "70h", the status-read is executed, and the status data Stt is output via the external control terminals CLE, ALE.

Next, the command data "05h", the address data Add, and the command data "E0h" are sequentially input via the external control terminals CLE, ALE. This address data Add includes the information on the plane PLN0 (FIG. 4) that becomes a target of the data-out as the above-described plane address.

After a predetermined standby time, the data-out is started with respect to the plane PLN0, and the user data "DataOut" is output via the data signal input/output terminals DQ<7:0>.

In the example of FIG. 21, while the data-out with respect to the plane PLN0 is executed, the command data "70h" is input via the external control terminals CLE, ALE. In association with the input of the command data "70h", the status-read is executed. In the illustrated example, while the data-out with respect to the plane PLN0 is executed, the status data Stt is output via the external control terminals CLE, ALE.

In the example of FIG. 21, while the data-out with respect to the plane PLN0 is executed, the command data “05h”, the address data Add, and the command data “E0h” are sequentially input via the external control terminals CLE, ALE. This address data Add includes an address and the like of the plane PLN1 (FIG. 4) that becomes a target of the data-out as the above-described plane address.

Here, in the operation mode MODEb, different from the operation mode MODEa, the data output timing adjustment portion TCT (FIG. 4) adjusts the timing of the start of the data-out with respect to the plane PLN1. After the data out with respect to the plane PLN0 ends, in response to an internal signal sent by the data output timing adjustment portion TCT, the data-out is started with respect to the plane PLN1, and the user data “DataOut” is output via the data signal input/output terminals DQ<7:0>.

Figure 22:
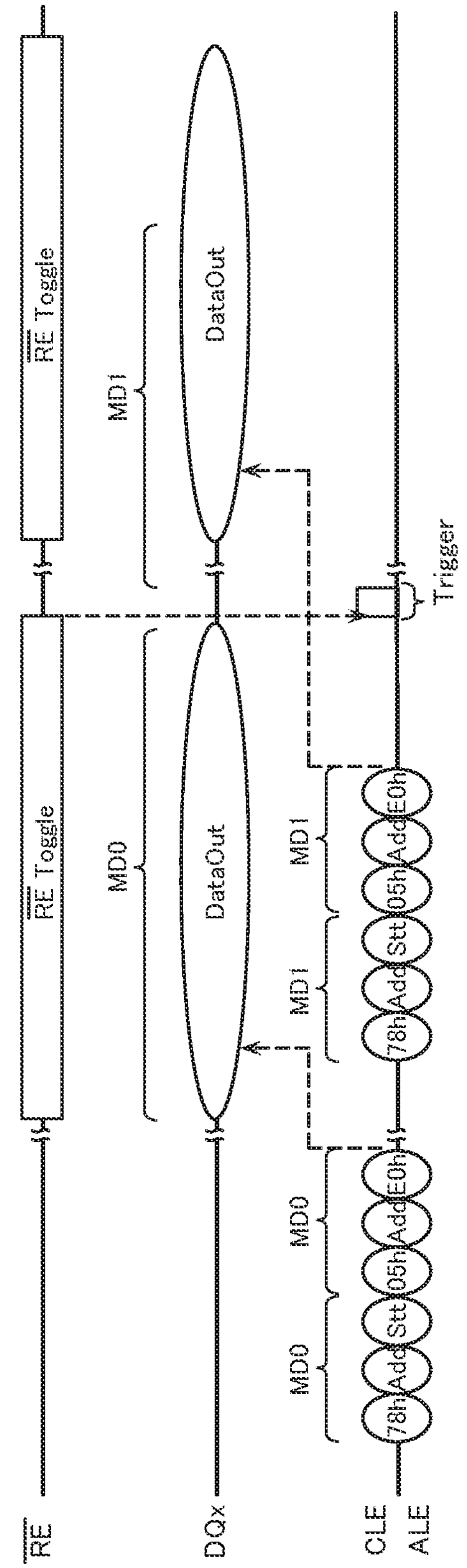
FIG. 22 is a schematic waveform diagram for describing the operation mode MODEb.

FIG. 22 is a schematic waveform diagram illustrating another state when the read operations and the data-outs are executed in the operation mode MODEb. In the example of FIG. 22, the memory die MD is set to the operation mode MODEb. Here, a case where the read operations and the data-outs are executed on the respective plurality of memory dies MD as illustrated in FIG. 2 and FIG. 3 will be described as an example.

As described above, the memory die MD as the semiconductor memory device according to the first embodiment is configured to be able to execute the data-out in response to the switching (toggling) of the input signals in the external control terminals /RE, RE by receiving the trigger signal from the controller die CD after the data-out is instructed. For example, in the example of FIG. 22, while the data-out with respect to the memory die MD0 is executed, the data-out with respect to the memory die MD1 is instructed. At this point, the memory die MD0 executes the data-out in response to the switching (toggling) of the input signals in the external control terminals /RE, RE. In contrast to this, after the data-out is instructed, the memory die MD1 does not start the data-out until the trigger signal is received from the controller die CD even when the input signals in the external control terminals /RE, RE are switched (toggled). Therefore, in the memory die MD0 and the memory die MD1 that are connected in common, collision of the data-outs is avoided. After the controller die CD detects that the data-out from the memory die MD0 ends, the controller die CD inputs the trigger signal to the memory die MD0 and the memory die MD1 that are connected in common. That is, as described with reference to FIG. 13, “H” is input to the external control terminal CLE, and “H” is input to the external control terminal ALE. In association with this, as illustrated in FIG. 22, the data-out from the memory die MD1 is started.

[Status-Read in Operation Mode MODEa]

Figure 23:
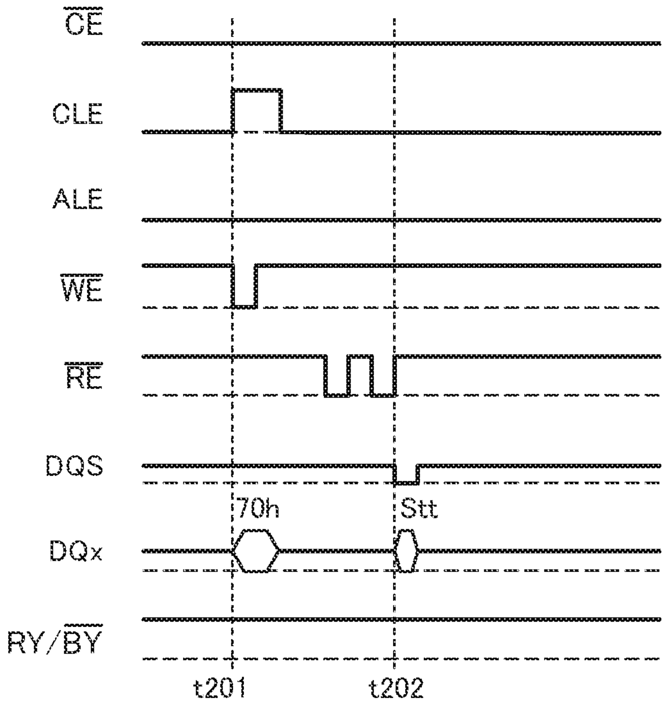
FIG. 23 is a schematic waveform diagram for describing the operation mode MODEa.

FIG. 23 illustrates a waveform when the status-read is executed in the operation mode MODEa. In the example of FIG. 23, at timing t201, the controller die CD inputs command data 70h to the memory die MD. At timing t202, the status data Stt is output.

[Status-Read in Operation Mode MODEb]

Figure 24:
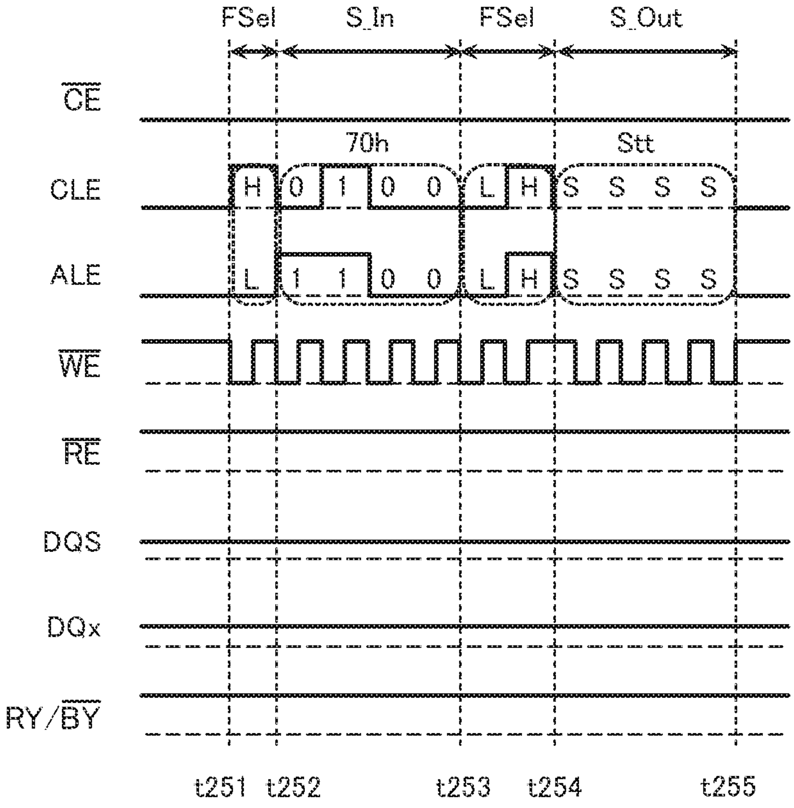
FIG. 24 is a schematic waveform diagram for describing the operation mode MODEb.

FIG. 24 illustrates a waveform when the status-read is executed in the operation mode MODEb.

In the example of FIG. 24, in the period FSel from timing t251 to timing t252, the controller die CD inputs the input/output data select signal specifying the input of the command data Cmd to the memory die MD.

In the period S_In from timing t252 to timing t253, the controller die CD inputs the command data 70h to the memory die MD.

In the example of FIG. 24, in the period S_In, the controller die CD inputs the 8-bit command data 70h to the memory die MD in four cycles of 2 bits each in a divided manner.

In the period FSel from timing t253 to timing t254, the controller die CD inputs the input/output data select signal specifying the output of the data to the memory die MD.

In the period S_Out from timing t254 to timing t255, the memory die MD outputs the status data Stt to the controller die CD.

[Another Status-Read in Operation Mode MODEa]

Figure 25:
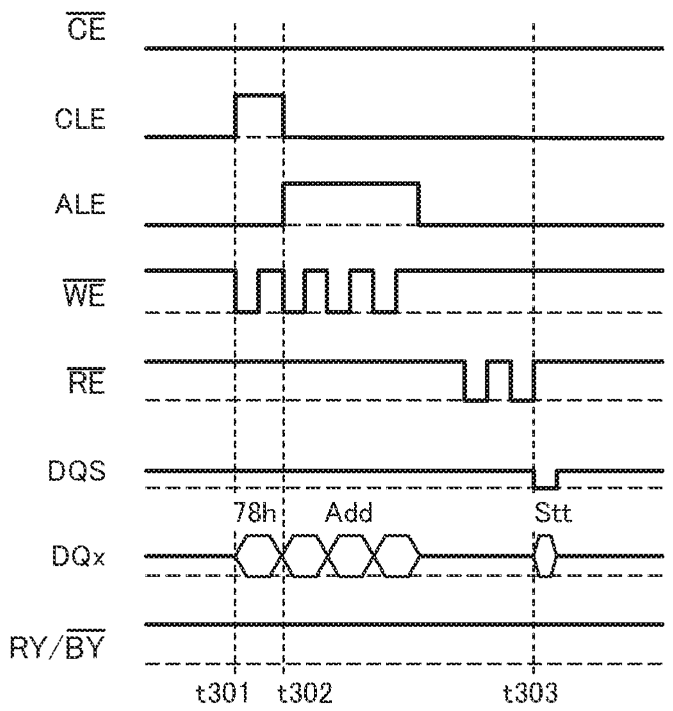
FIG. 25 is a schematic waveform diagram for describing the operation mode MODEa.

FIG. 25 illustrates a waveform when another status-read is executed in the operation mode MODEa. In the example of FIG. 25, at timing t301, the controller die CD inputs command data 78h to the memory die MD. The command data “78h” is the command data Cmd that instructs another status-read. At timing t302, the controller die CD inputs the address data Add to the memory die MD. In the illustrated example, after timing t302, while the data of 8 bits ×3 cycles constituting the address data Add is input, the number of cycles may be less than or more than three. At timing t303, the status data Stt is output.

[Another Status-Read in Operation Mode MODEb]

Figure 26:
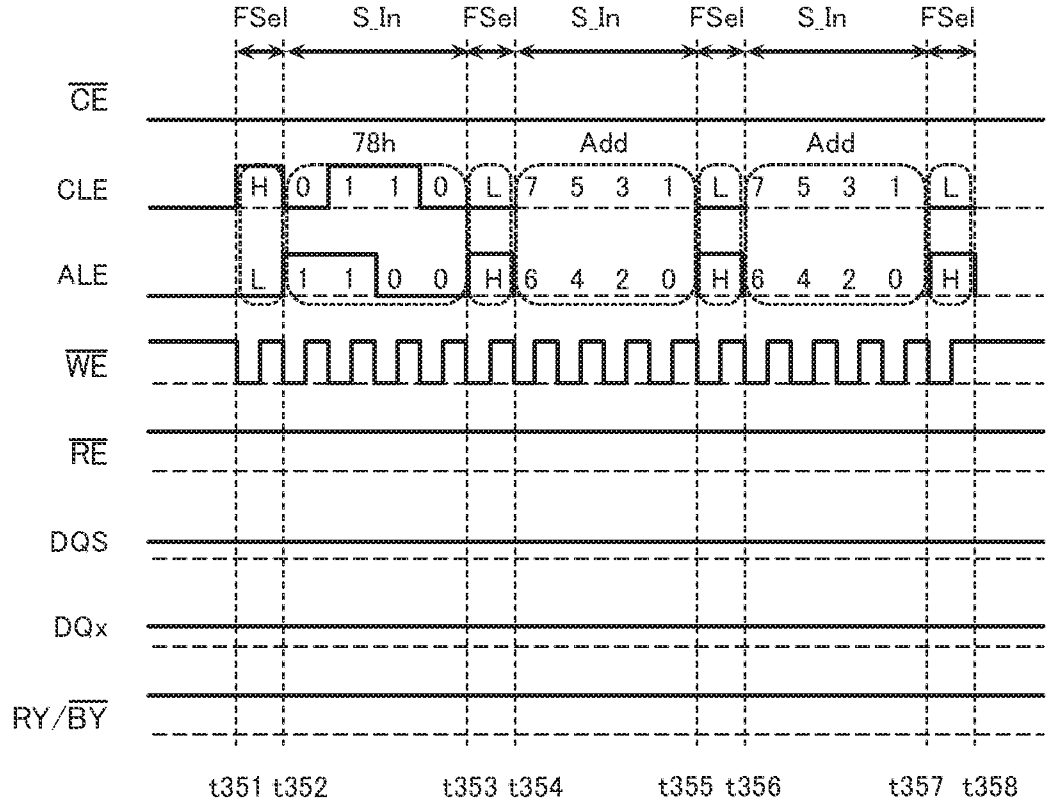
FIG. 26 is a schematic waveform diagram for describing the operation mode MODEb.

FIG. 26 illustrates a waveform when another status-read is executed in the operation mode MODEb.

In the example of FIG. 26, in the period FSel from timing t351 to timing t352, the controller die CD inputs the input/output data select signal specifying the input of the command data Cmd to the memory die MD.

In the period S_In from timing t352 to timing t353, the controller die CD inputs the command data 78h to the memory die MD.

In the example of FIG. 26, in the period S_In, the controller die CD inputs the 8-bit command data 78h to the memory die MD in four cycles of 2 bits each in a divided manner.

In the period FSel from timing t353 to timing t354, the controller die CD inputs the input/output data select signal specifying the input of the address data to the memory die MD.

In the period S_In from timing t354 to timing t355, the controller die CD inputs the address data Add to the memory die MD.

Similarly in the following, in the period FSel from timing t355 to timing t356 and in the period FSel from timing t357 to timing t358, the controller die CD inputs the input/output data select signal specifying the input of the address data to the memory die MD.

In the period S_In from timing t356 to timing t357, the controller die CD inputs the address data Add to the memory die MD.

[Get-Feature in Operation Mode MODEa]

Figure 27:
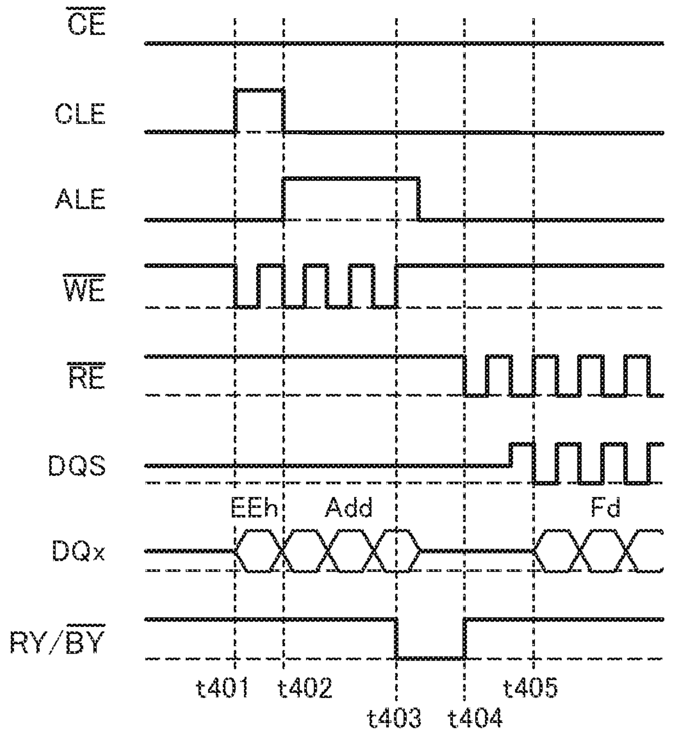
FIG. 27 is a schematic waveform diagram for describing the operation mode MODEa.

FIG. 27 illustrates a waveform when the get-feature is executed in the operation mode MODEa. In the example of FIG. 27, at timing t401, the controller die CD inputs command data EEh to the memory die MD. The command data “EEh” is the command data Cmd that instructs the get-feature. At timing t402, the controller die CD inputs the address data Add to the memory die MD. In the illustrated example, after timing t402, while the data of 8 bits ×3 cycles constituting the address data Add is input, the number of cycles may be less than or more than three. At timing t403, in response to the rise edge of the signal input to the external control terminal /WE, the get-feature is started, and the voltage of the terminal RY//BY falls from “H” to “L”. At timing t404, the get-feature ends, and the voltage of the terminal RY//BY rises from "L" to "H". At timing t405, the feature data Fd is output.

[Get-Feature in Operation Mode MODEb]

Figure 28:
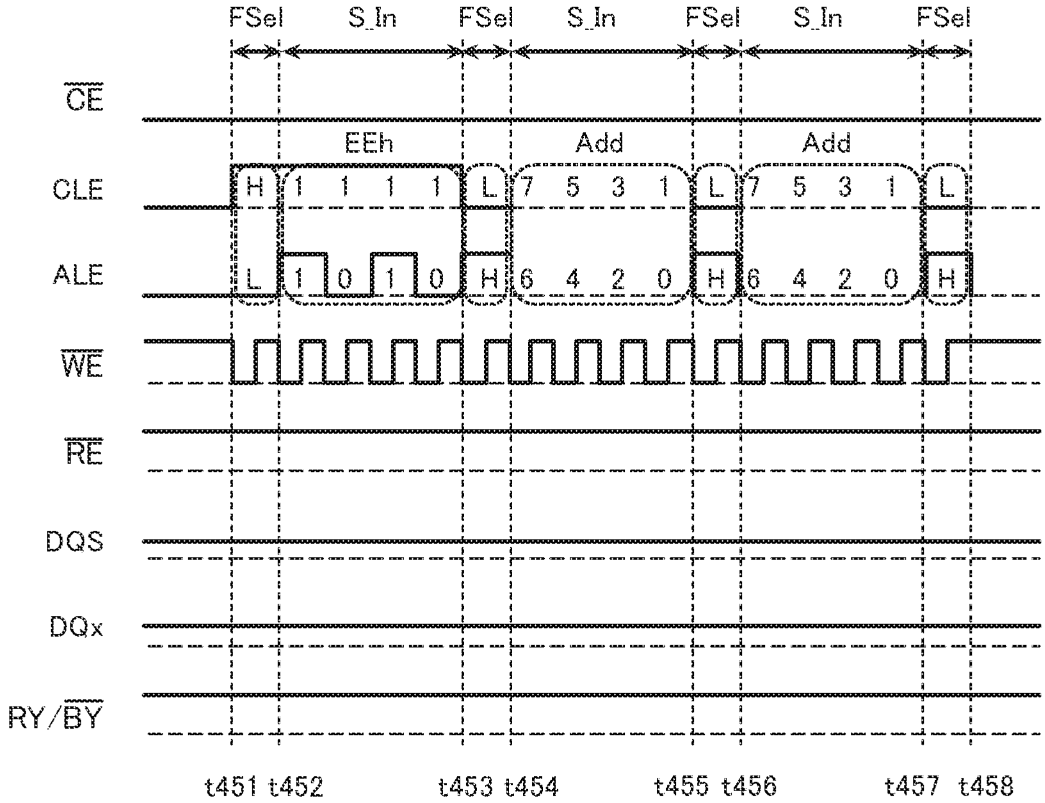
FIG. 28 is a schematic waveform diagram for describing the operation mode MODEb.

FIG. 28 illustrates a waveform when the get-feature is executed in the operation mode MODEb.

In the example of FIG. 28, in the period FSel from timing t451 to timing t452, the controller die CD inputs the input/output data select signal specifying the input of the command data Cmd to the memory die MD.

In the period S_In from timing t452 to timing t453, the controller die CD inputs the command data EEh to the memory die MD.

In the example of FIG. 28, in the period S_In, the controller die CD inputs the 8-bit command data EEh to the memory die MD in four cycles of 2 bits each in a divided manner.

In the period FSel from timing t453 to timing t454, the controller die CD inputs the input/output data select signal specifying the input of the address data to the memory die MD.

In the period S_In from timing t454 to timing t455, the controller die CD inputs the address data Add to the memory die MD.

Similarly in the following, in the period FSel from timing t455 to timing t456 and in the period FSel from timing t457 to timing t458, the controller die CD inputs the input/output data select signal specifying the input of the address data to the memory die MD.

In the period S_In from timing t456 to timing t457, the controller die CD inputs the address data Add to the memory die MD.

[Set-Feature in Operation Mode MODEa]

Figure 29:
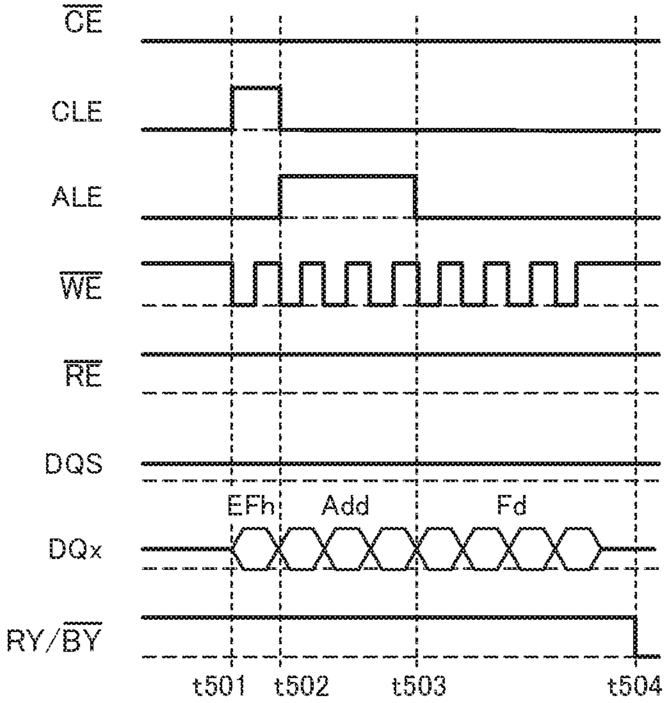
FIG. 29 is a schematic waveform diagram for describing the operation mode MODEa.

FIG. 29 illustrates a waveform when the set-feature is executed in the operation mode MODEa. In the example of FIG. 29, at timing t501, the controller die CD inputs command data EFh to the memory die MD. The command data "EFh" is the command data Cmd that instructs the set-feature. At timing t502, the controller die CD inputs the address data Add to the memory die MD. In the illustrated example, after timing t502, while the data of 8 bits×3 cycles constituting the address data Add is input, the number of cycles may be less than or more than three. At timing t503, the controller die CD inputs the feature data Fd to the memory die MD. At timing t504, the set-feature is started, and the voltage of the terminal RY//BY falls from "H" to "L".

[Set-Feature in Operation Mode MODEb]

Figure 30:
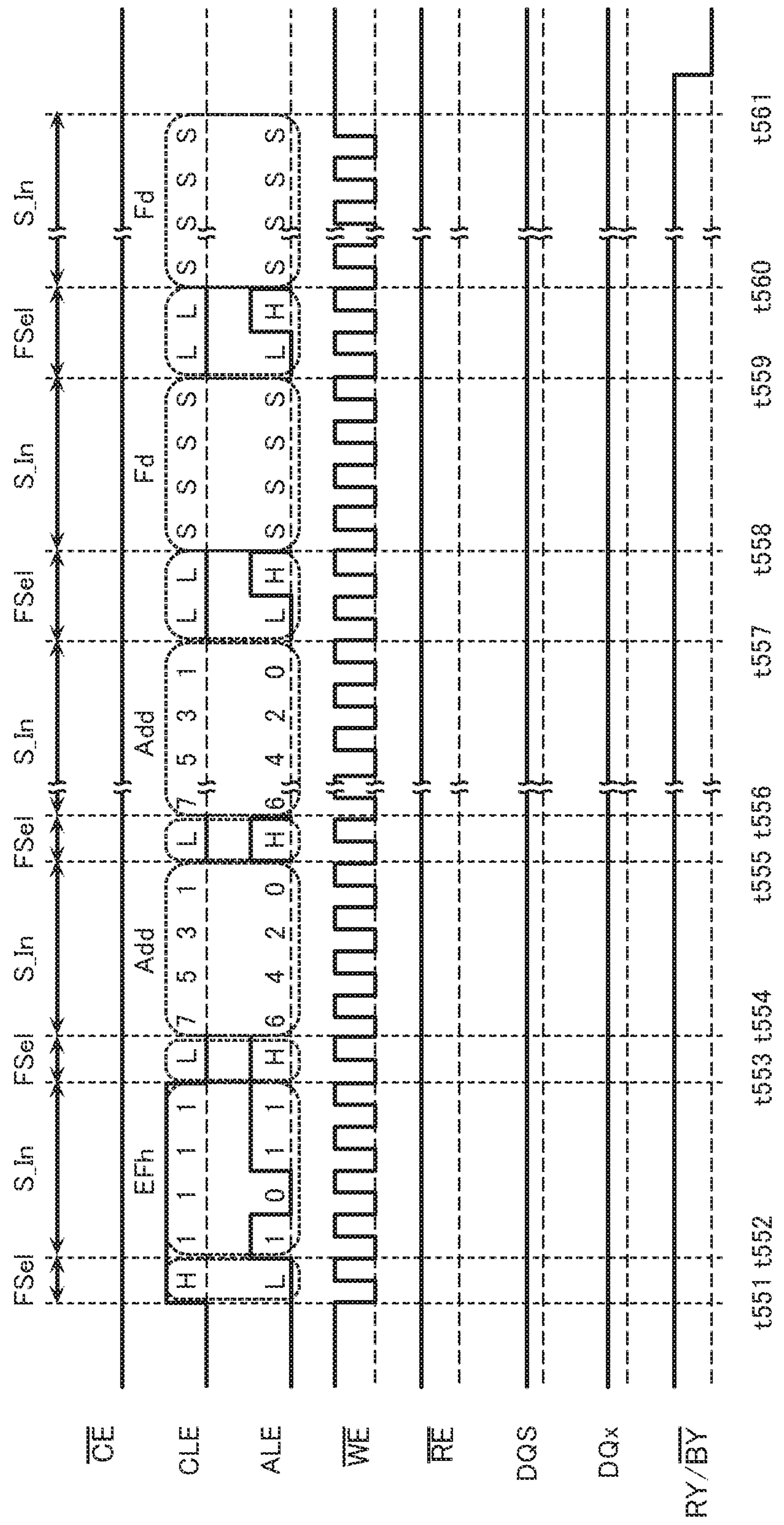
FIG. 30 is a schematic waveform diagram for describing the operation mode MODEb.
Figure 31:
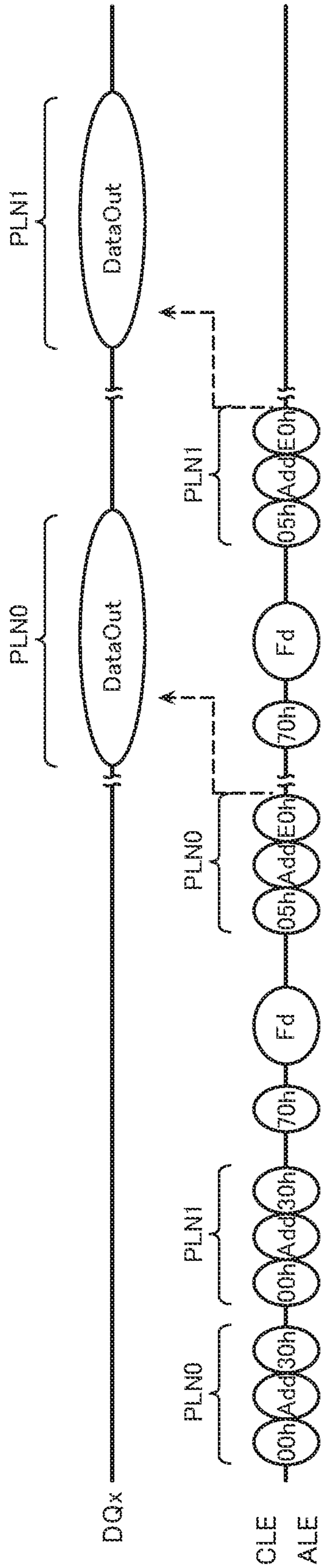
FIG. 31 is a schematic waveform diagram for describing the operation mode MODEb.

FIG. 30 illustrates a waveform when the set-feature is executed in the operation mode MODEb.

In the example of FIG. 30, in the period FSel from timing t551 to timing t552, the controller die CD inputs the input/output data select signal specifying the input of the command data Cmd to the memory die MD.

In the period S_In from timing t552 to timing t553, the controller die CD inputs the command data EFh to the memory die MD.

In the example of FIG. 30, in the period S_In, the controller die CD inputs the 8-bit command data EFh to the memory die MD in four cycles of 2 bits each in a divided manner.

In the period FSel from timing t553 to timing t554, the controller die CD inputs the input/output data select signal specifying the input of the address data to the memory die MD.

In the period S_In from timing t554 to timing t555, the controller die CD inputs the address data Add to the memory die MD.

Similarly in the following, in the period FSel from timing t555 to timing t556, the controller die CD inputs the input/output data select signal specifying the input of the address data to the memory die MD.

In the periods S_In after timing t556 and in the periods S_In until timing t557, the controller die CD inputs the address data Add to the memory die MD.

In the period FSel from timing t557 to timing t558, the controller die CD inputs the input/output data select signal specifying the input of the data to the memory die MD.

In the period S_In from timing t558 to timing t559, the controller die CD inputs the feature data Fd to the memory die MD.

Similarly in the following, in the period FSel from timing t559 to timing t560, the controller die CD inputs the input/output data select signal specifying the input of the data to the memory die MD.

In the periods S_In after timing t560 and in the periods S_In until timing t561, the controller die CD inputs the feature data Fd to the memory die MD.

[Effect]

As described with reference to FIG. 10 and the like, in the operation mode MODEa, the data signal input/output terminals DQ<7:0> are used for the input/output of the data other than the user data Dat, such as the command data Cmd and the address data Add, in addition to the input/output of the user data Dat. Therefore, for example, as described with reference to FIG. 19, when the read operations and the data-outs are continuously executed with respect to the plane PLN0 and the plane PLN1, the command set indicative of executing the data-out with respect to the plane PLN1 cannot be input in some cases until after the data-out with respect to the plane PLN0 ends.

Here, the semiconductor memory device according to the embodiment can be operated in the operation mode MODEb. In the operation mode MODEb, as described above, even while the data-out via the data signal input/output terminals DQ<7:0> is being executed, the input of the command data Cmd and the address data Add can be executed via the external control terminals CLE, ALE. Therefore, for example, as described with reference to FIG. 21, when the read operations and the data-outs are continuously executed with respect to the plane PLN0 and the plane PLN1, the command set indicative of executing the data-out with respect to the plane PLN1 can be input even during execution of the data-out with respect to the plane PLN0. Accordingly, the time required for the input of the command set to the memory die MD can be reduced, and speed-up of the performance of the semiconductor memory device can be achieved.

As described with reference to FIG. 13, FIG. 14, and the like, in the semiconductor memory device according to the embodiment, when any of "L, H", "H, L", and "H, H" are input to the external control terminals CLE, ALE in the first cycle of the period FSel, the period FSel ends in one cycle. When "L, L" are input to the external control terminals CLE, ALE in the first cycle of the period FSel, the second cycle is added to the period FSel such that another operation can be further instructed. Accordingly, the operations can be preferably specified while allowing high-speed performance for a part of functions.

For example, according to the semiconductor memory device according to the embodiment, as exemplified in FIG.

31, the operation, such as the set-feature and the get-feature, can be executed during execution of the data-out.

[Deserializer Applicable to Memory Die MD According to First Embodiment]

Figure 32:
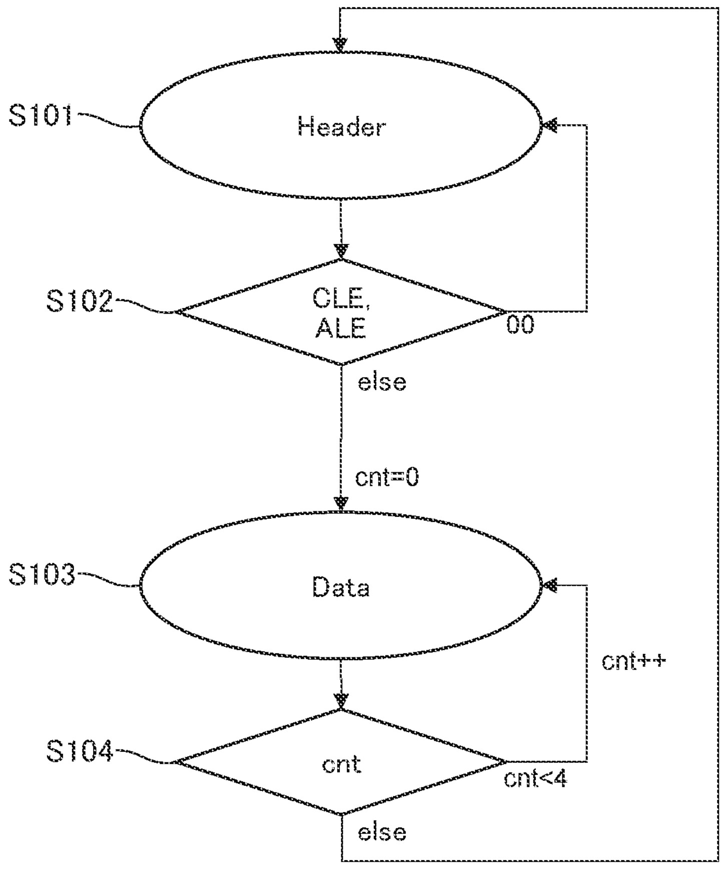
FIG. 32 is a schematic flowchart illustrating an exemplary configuration of a part of the memory die MD.
Figure 33:
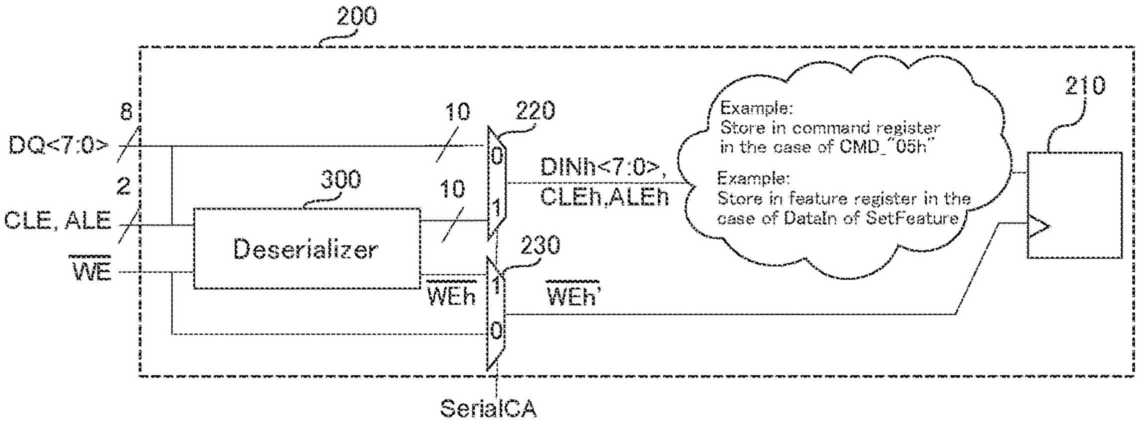
FIG. 33 is a schematic circuit diagram illustrating an exemplary configuration of a part of the memory die MD.
Figure 34:
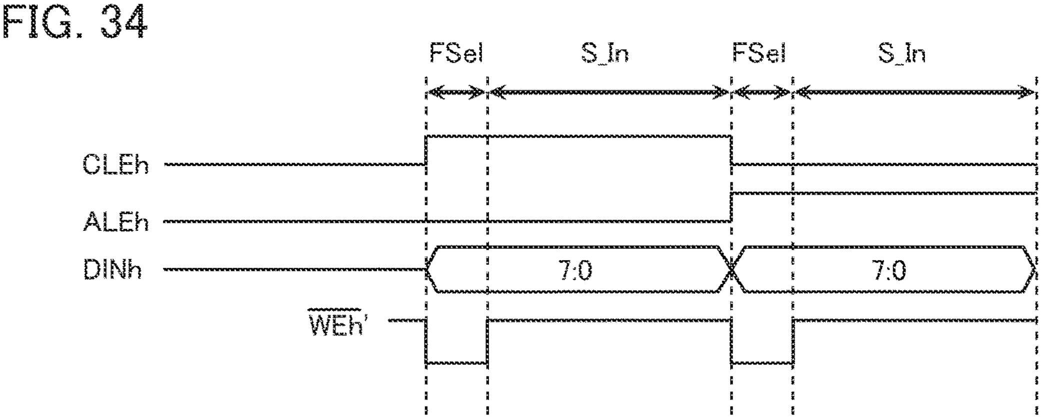
FIG. 34 is a schematic waveform diagram for describing an operation method of the circuit illustrated in FIG. 33.
Figure 35:
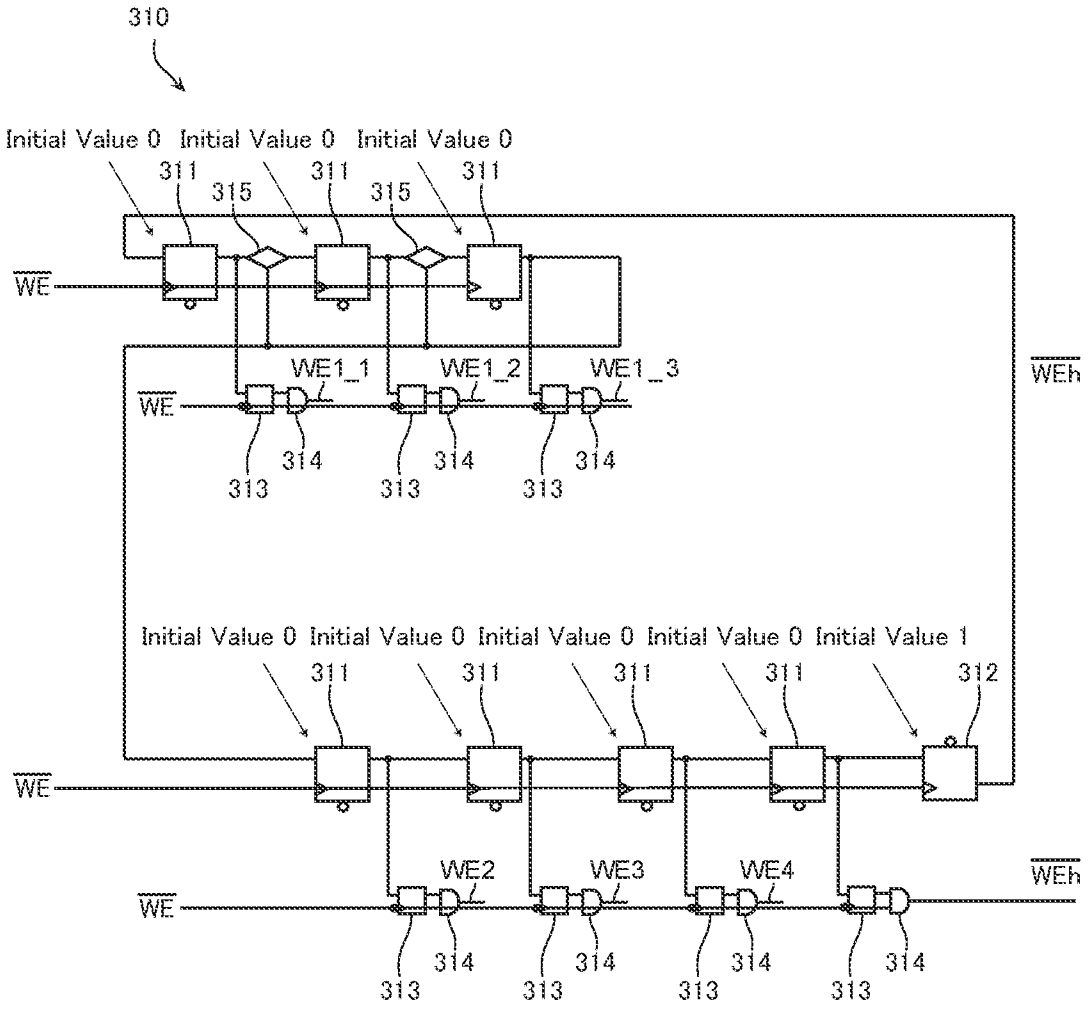
FIG. 35 is a schematic circuit diagram illustrating an exemplary configuration of a part of the memory die MD.
Figure 36:
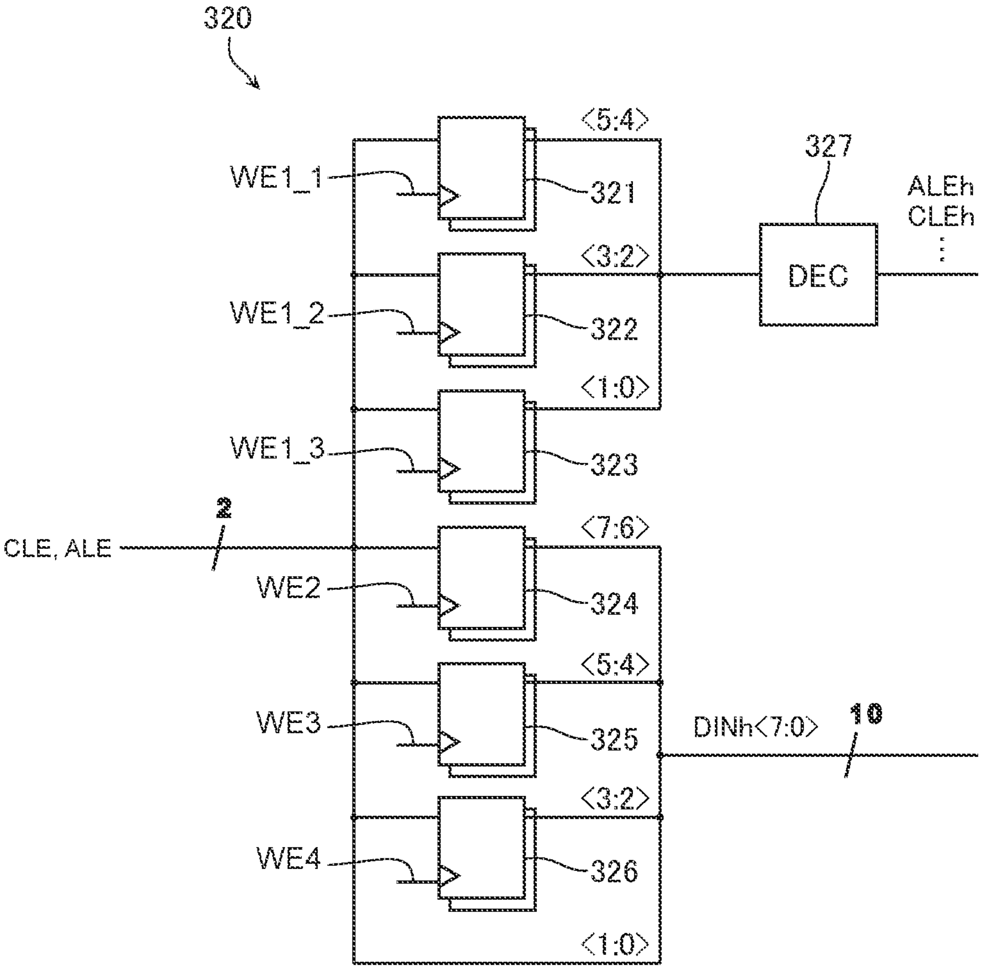
FIG. 36 is a schematic circuit diagram illustrating an exemplary configuration of a part of the memory die MD.

In the memory die MD according to the first embodiment, depending on which of the operation modes MODEa, MODEb is selected, the functions of the data signal input/output terminals DQ<7:0>, the external control terminals CLE, ALE, and the like vary. In the following, with reference to FIG. 32 to FIG. 36, a circuit having such functions is exemplified. FIG. 32 is a schematic flowchart for describing an example of such a circuit. FIG. 33, FIG. 35, and FIG. 36 are schematic circuit diagrams for describing other examples of such a circuit. FIG. 34 is a schematic waveform diagram for describing an operation method of the circuit illustrated in FIG. 33.

The circuit corresponding to FIG. 32 may be achieved by, for example, a state machine and the like. For example, this circuit latches the signals input to the external control terminals CLE, ALE as a part of the input/output data select signal (Step S101). Next, whether or not the external control terminals CLE, ALE are "L, L" is determined (Step S102). When the external control terminals CLE, ALE are "L, L", the process returns to Step S101. When the external control terminals CLE, ALE are not "L, L", a variable cnt is set to zero and the process proceeds to Step S103. Next, the signals input to the external control terminals CLE, ALE are latched as a part of the data other than the user data Dat (Step S103). Next, whether or not the variable cnt is smaller than four is determined (Step S104). When the variable cnt is smaller than four, one is added to the variable cnt and the process returns to Step S103. When the variable cnt is not smaller than four, the process returns to Step S101.

FIG. 33 exemplifies the data signal input/output terminals DQ<7:0>, the external control terminals CLE, ALE, /WE, and a circuit unit 200 connected to the data signal input/output terminals DQ<7:0> and the external control terminals CLE, ALE, /WE.

The circuit unit 200 includes, for example, a latch circuit 210, multiplexers 220, 230, and a deserializer 300.

The latch circuit 210 is included in the command register CMR, the address register ADR, or the feature register FR. For example, a plurality of latch circuits 210 are disposed corresponding to the command register CMR. These plurality of latch circuits 210 may be disposed in the same number as the number of pieces of the usable command data Cmd. Further, the plurality of latch circuits 210 are disposed corresponding to the address register ADR. These plurality of latch circuits 210 may be disposed in the number of product of the number of pieces of the address data Add that can be latched and the number of bits of the address data Add. Further, the plurality of latch circuits 210 may be disposed corresponding to the feature register FR. In the illustrated example, the latch circuit 210 latches 1-bit data corresponding to the input command data Cmd. The latch circuit 210 has data input terminals connected to output terminals DINh<7:0>, CLEh, ALEh of the multiplexer 220 via a logic circuit and a clock input terminal connected to an output terminal /WEh' of the multiplexer 230.

Select signals SerialCA are input to respective select control terminals of the multiplexers 220, 230. The select signal SerialCA is in a "0" state when the operation mode MODEa is selected and in a "1" state when the operation mode MODEb is selected.

The multiplexer 220 includes the 10 output terminals DINh<7:0>, CLEh, ALEh. Among the 10 output terminals, the eight output terminals DINh<7:0> correspond to data constituting the data other than the user data Dat. The remaining two output terminals CLEh, ALEh correspond to the input signals of the external control terminals CLE, ALE.

The multiplexer 220 includes 10 input terminals selected when the select signal SerialCA is in the "0" state and 10 input terminals selected when the select signal SerialCA is in the "1" state. Eight of the 10 input terminals corresponding to the "0" state are connected to the data signal input/output terminals DQ<7:0>. The remaining two input terminals are connected to the external control terminals CLE, ALE. The 10 input terminals corresponding to the "1" state are connected to output terminals of the deserializer 300.

The multiplexer 230 includes the one output terminal /WEh'. The multiplexer 230 includes one input terminal /WEh selected when the select signal SerialCA is in the "1" state and one input terminal selected when the select signal SerialCA is in the "0" state. The input terminal /WEh corresponding to the "1" state is connected to an output terminal of the deserializer 300. The input terminal corresponding to the "0" state is connected to the external control terminal /WE.

The deserializer 300 includes 10 output terminals connected to the multiplexer 220. The deserializer 300 converts data that is input over four cycles of 2 bits each from the external control terminals CLE, ALE into 8-bit data and generates 10-bit data by adding 2-bit data indicating whether this 8-bit data is the command data Cmd or the address data Add. The deserializer 300 outputs this 10-bit data to the multiplexer 220 via the 10 output terminals. This 10-bit data may be, for example, switched at a timing of the start of the period FSel.

The deserializer 300 includes one output terminal connected to the multiplexer 230. From when the data of the first cycle is input to when the data of the second cycle is input (during the first cycle of the period FSel) among a plurality of cycles of data input from the external control terminal /WE, the deserializer 300 outputs "L" to the input terminal /WEh of the multiplexer 230. In periods other than the first cycle of the period FSel, "H" is output to the input terminal /WEh of the multiplexer 230.

In the operation mode MODEa, 8-bit data input via the data signal input/output terminals DQ<7:0> is input to the logic circuit via the output terminals DINh<7:0> of the multiplexer 220. Enable signals input via the external control terminals CLE, ALE are input to the logic circuit via the output terminals CLEh, ALEh of the multiplexer 220. For example, when the 8-bit data input via the data signal input/output terminals DQ<7:0> is the command data "05h" and the input signals of the external control terminals CLE, ALE are "H, L", the output signal of the logic circuit corresponding to the command data "05h" becomes "H". In other cases, the output signal of the logic circuit corresponding to the command data "05h" becomes "L".

In the operation mode MODEa, a signal input from the external control terminal /WE is output from the output terminal /WEh' of the multiplexer 230 and input to the clock input terminal of the latch circuit 210.

In the operation mode MODEb, data of 2 bits×a plurality of cycles (such as, 5 cycles or 6 cycles) input via the external control terminals CLE, ALE is converted into data of a plurality of bits (such as, 10 bits or 12 bits) by the deserializer 300. Among the data of these plurality of bits, 10-bit data is input to the input terminals of the multiplexer 220. These data and signals are input to the logic circuit via the output terminals DINh<7:0>, CLEh, ALEh of the multiplexer 220. For example, when "H, L" are input from the external control terminals CLE, ALE in the period FSel and the command data "05h" is input from the external control terminals CLE, ALE in the period S_In, the output signal of the logic circuit corresponding to the command data "05h" becomes "H". In other cases, the output signal of the logic circuit corresponding to the command data "05h" becomes "L". For example, as exemplified in FIG. 34, in the operation mode MODEb, in any one cycle among a plurality of cycles included in the period FSel or the periods S_In, S_Out, the deserializer 300 brings the input terminal /WEh into the "H" state. In other cycles, the deserializer 300 brings the input terminal /WEh into the "L" state.

In the operation mode MODEb, a signal input to the input terminal /WEh of the multiplexer 230 is output from the output terminal /WEh' of the multiplexer 230 and input to the clock input terminal of the latch circuit 210.

FIG. 35 and FIG. 36 are schematic circuit diagrams illustrating a configuration of a part of the deserializer 300. The deserializer 300 includes a circuit unit 310 as illustrated in FIG. 35 and a circuit unit 320 as illustrated in FIG. 36.

As illustrated in FIG. 35, the circuit unit 310 includes seven D flip-flops 311 and one D-latch circuit 312.

An output terminal of the first D flip-flop 311 is connected to data input terminals of the second and fourth D flip-flops 311 via a switch circuit 315. When the external control terminals CLE, ALE are "L, L", this switch circuit 315 transfers the output signal of the first D flip-flop 311 to the data input terminal of the second D flip-flop 311. In other cases, the output signal of the first D flip-flop 311 is transferred to the data input terminal of the fourth D flip-flop 311.

An output terminal of the second D flip-flop 311 is connected to data input terminals of the third and fourth D flip-flops 311 via the switch circuit 315. When the external control terminals CLE, ALE are "L, L", this switch circuit 315 transfers the output signal of the second D flip-flop 311 to the data input terminal of the third D flip-flop 311. In other cases, the output signal of the second D flip-flop 311 is transferred to the data input terminal of the fourth D flip-flop 311.

An output terminal of the third D flip-flop 311 is connected to the data input terminal of the fourth D flip-flop 311. Similarly, output terminals of the fourth to sixth D flip-flops 311 are respectively connected to data input terminals of the fifth to seventh D flip-flops 311. An output terminal of the seventh D flip-flop 311 is connected to a data input terminal of the D-latch circuit 312. An output terminal of the D-latch circuit 312 is connected to a data input terminal of the first D flip-flop 311. Clock input terminals of these seven D flip-flops 311 and one D-latch circuit 312 are connected to the external control terminal /WE.

The circuit unit 310 includes seven D-latch circuits 313 and seven AND circuits 314. Data input terminals of the seven D-latch circuits 313 are connected to the respective output terminals of the seven D flip-flops 311. To clock input terminals of the seven D-latch circuits 313, an inverted signal of the external control terminal /WE is input. Input terminals on one side of the seven AND circuits 314 are connected to respective output terminals of the seven D-latch circuits 313. Input terminals on the other side of the seven AND circuits 314 are each connected to the external control terminal /WE. In the example of FIG. 35, output terminals of the first to third AND circuits 314 among these seven AND circuits 314 are indicated as output terminals WE1_1 to WE1_3. Output terminals of the fourth to sixth AND circuits 314 are indicated as output terminals WE2 to WE4. The output terminal of the remaining one AND circuit 314 is connected to the input terminal /WEh of the above-described multiplexer 230 (FIG. 33).

Here, initial values of data latched in the seven D flip-flops 311 are set to 0, and an initial value of data latched in D-latch circuit 312 is set to 1.

When "H" is input to the external control terminal /WE in a state where the output signal of the D-latch circuit 312 is "H", the signal of the output terminal WE1_1 enters the "H" state and the signals of the output terminals WE1_2, WE1_3, WE2, WE3, WE4 and the output signal of the D-latch circuit 312 enter the "L" state.

When "H" is input to the external control terminal /WE in a state where the signal of the output terminal WE1_1 is "H" and the signals of the external control terminals CLE, ALE are "L, L", the signal of the output terminal WE1_2 enters the "H" state and the signals of the output terminals WE1_1, WE1_3, WE2, WE3, WE4 and the output signal of the D-latch circuit 312 enter the "L" state.

When "H" is input to the external control terminal /WE in a state where the signal of the output terminal WE1_1 is "H" and the signals of the external control terminals CLE, ALE are "L, H", "H, L", or "H, H", the signal of the output terminal WE2 enters the "H" state and the signals of the output terminals WE1_1, WE1_2, WE1_3, WE3, WE4 and the output signal of the D-latch circuit 312 enter the "L" state.

When "H" is input to the external control terminal /WE in a state where the signal of the output terminal WE1_2 is "H" and the signals of the external control terminals CLE, ALE are "L, L", the signal of the output terminal WE13 enters the "H" state and the signals of the output terminals WE1_1, WE1_2, WE2, WE3, WE4 and the output signal of the D-latch circuit 312 enter the "L" state.

When "H" is input to the external control terminal /WE in a state where the signal of the output terminal WE1_2 is "H" and the signals of the external control terminals CLE, ALE are "L, H", "H, L", or "H, H", the signal of the output terminal WE2 enters the "H" state and the signals of the output terminals WE1_1, WE1_2, WE1_3, WE3, WE4 and the output signal of the D-latch circuit 312 enter the "L" state.

When "H" is input to the external control terminal /WE in a state where the signal of the output terminal WE1_3 is "H", the signal of the output terminal WE2 enters the "H" state and the signals of the output terminals WE1_1, WE1_2, WE1_3, WE3, WE4 and the output signal of the D-latch circuit 312 enter the "L" state.

When "H" is input to the external control terminal /WE in a state where the signal of the output terminal WE2 is "H", the signal of the output terminal WE3 enters the "H" state and the signals of the output terminals WE1_1, WE1_2, WE1_3, WE2, WE4 and the output signal of the D-latch circuit 312 enter the "L" state.

When "H" is input to the external control terminal /WE in a state where the signal of the output terminal WE3 is "H", the signal of the output terminal WE4 enters the "H" state and the signals of the output terminals WE1_1, WE1_2, WE1_3, WE2, WE3 and the output signal of the D-latch circuit 312 enter the "L" state.

When "H" is input to the external control terminal /WE in a state where the signal of the output terminal WE4 is "H", the output signal of the D-latch circuit 312 enters the "H" state and the signals of the output terminals WE1_1, WE1_2, WE1_3, WE2, WE3, WE4 enter the "L" state.

As illustrated in FIG. 36, the circuit unit 320 includes two each of D-latch circuit 321 to D-latch circuit 326. Data input terminals on one side of D-latch circuit 321 to D-latch circuit

326 are connected to the external control terminal CLE. Data input terminals on the other side of D-latch circuit 321 to D-latch circuit 326 are connected to the external control terminal ALE. Clock input terminals of the two D-latch circuits 321 are connected to the output terminal WE1_1 of the AND circuit 314 (FIG. 35). Similarly, clock input terminals of the D-latch circuits 322, 323, 324, 325, 326 are respectively connected to the output terminals WE12, WE13, WE2, WE3, WE4 of the AND circuits 314 (FIG. 35).

In the two D-latch circuits 321, the data of the external control terminals CLE, ALE in the first cycle of the period FSel is latched. In the two D-latch circuits 322, the data of the external control terminals CLE, ALE in the second cycle of the period FSel is latched. In the two D-latch circuits 324, the data of the external control terminals CLE, ALE in the first cycle of the period S_In is latched. In the two D-latch circuits 325, the data of the external control terminals CLE, ALE in the second cycle of the period S_In is latched. In the two D-latch circuits 326, the data of the external control terminals CLE, ALE in the third cycle of the period S_In is latched.

Output terminals of the D-latch circuits 321 to the D-latch circuits 323 are connected to a decode circuit 327. The decode circuit 327 includes, for example, a plurality of output terminals corresponding to a plurality of input/output data select signals. Such input/output data select signals include, for example, the input/output data select signal indicative of inputting the address data Add, the input/output data select signal indicative of inputting the command data Cmd, and the input/output data select signal indicative of inputting the trigger signal for switching the address data Add, as described with reference to FIG. 13. Further, such input/output data select signals include, for example, the input/output data select signal indicative of inputting data and the input/output data select signal indicative of outputting data, as described with reference to FIG. 14.

For example, in the first cycle of the period FSel, when "H" is input to the external control terminal CLE and "L" is input to the external control terminal ALE, the signal of an output terminal corresponding to the output terminal CLEh enters the "H" state and the signals of other output terminals enter the "L" state. Further, for example, in the first cycle of the period FSel, when "L" is input to the external control terminal CLE and "H" is input to the external control terminal ALE, the signal of an output terminal corresponding to the output terminal ALEh enters the "H" state and the signals of other output terminals enter the "L" state.

Output terminals of the D-latch circuits 324 to the D-latch circuits 326 are connected to the output terminals DINh<7:2> via the multiplexer 220 (FIG. 33). The external control terminals CLE, ALE are connected to the output terminals DINh<1:0> via the multiplexer 220 (FIG. 33).

[Serializer Applicable to Memory Die MD According to First Embodiment]

Figure 37:
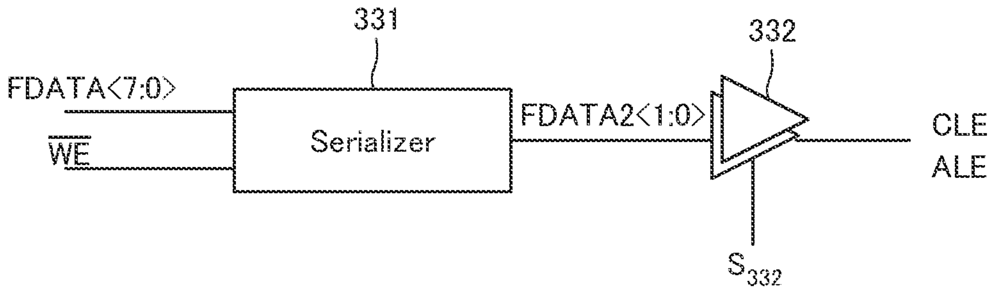
FIG. 37 is a schematic circuit diagram illustrating an exemplary configuration of a part of the memory die MD.

In the memory die MD according to the first embodiment, when the operation mode MODEb is selected, 8-bit data is converted into data of 2 bits×4 cycles, and the data is output. Such a function may be achieved by, for example, a circuit as illustrated in FIG. 37. FIG. 37 is a schematic circuit diagram illustrating an exemplary configuration of a part of the memory die MD.

The circuit illustrated in FIG. 37 includes a serializer 331 and two switch circuits 332.

The serializer 331 includes eight first input terminals and one second input terminal. One bit of 8-bit data FDATA<7:0> constituting output data is input to each of the first input terminals. The external control terminal /WE is connected to the second input terminal. The serializer 331 converts the 8-bit data FDATA<7:0> into 2-bit data FDATA2<1:0> according to the input signals of the external control terminal /WE and sequentially outputs the data FDATA2<1:0> over four cycles.

The respective two switch circuits 332 are disposed corresponding to the external control terminals CLE, ALE. An output terminal of the switch circuit 332 is connected to the external control terminal CLE or the external control terminal ALE. An input terminal of the switch circuit 332 is connected to an output terminal of the serializer 331. The switch circuit 332 outputs an input signal in response to the input of a gate signal $S_{332}$. For example, the gate signal $S_{332}$ may enter the "H" state when the external control terminal /WE is in the "L" state, "L, L" are input to the external control terminals CLE, ALE in the first cycle of the period S_Out and the first cycle of the period FSel, "H, L" are input to the external control terminals CLE, ALE in the second cycle of the period FSel, the operation mode MODEb is selected, and the memory die MD is selected.

Second Embodiment

Figure 38:
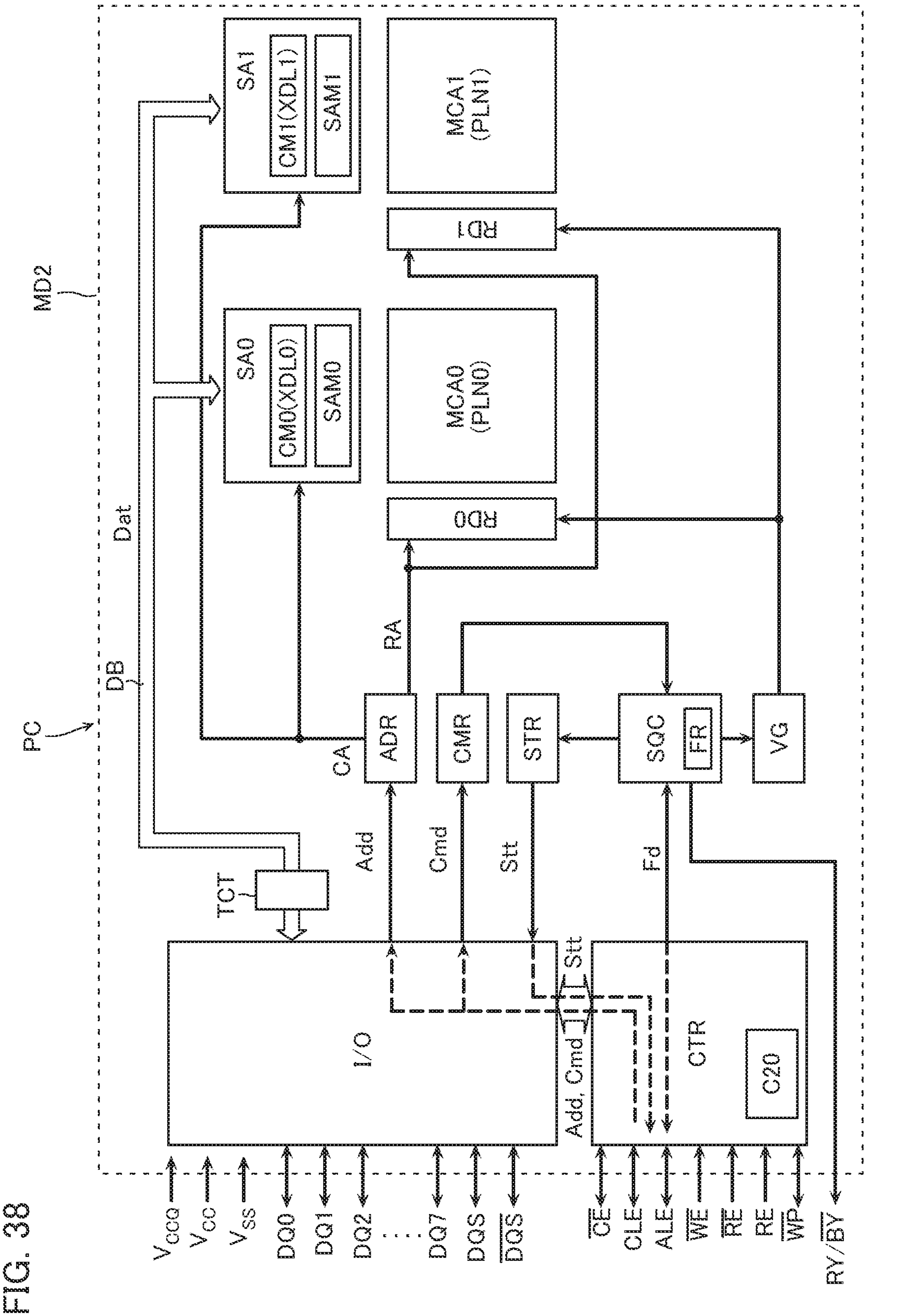
FIG. 38 is a schematic block diagram illustrating a configuration of a memory die MD2 according to a second embodiment.
Figure 39:
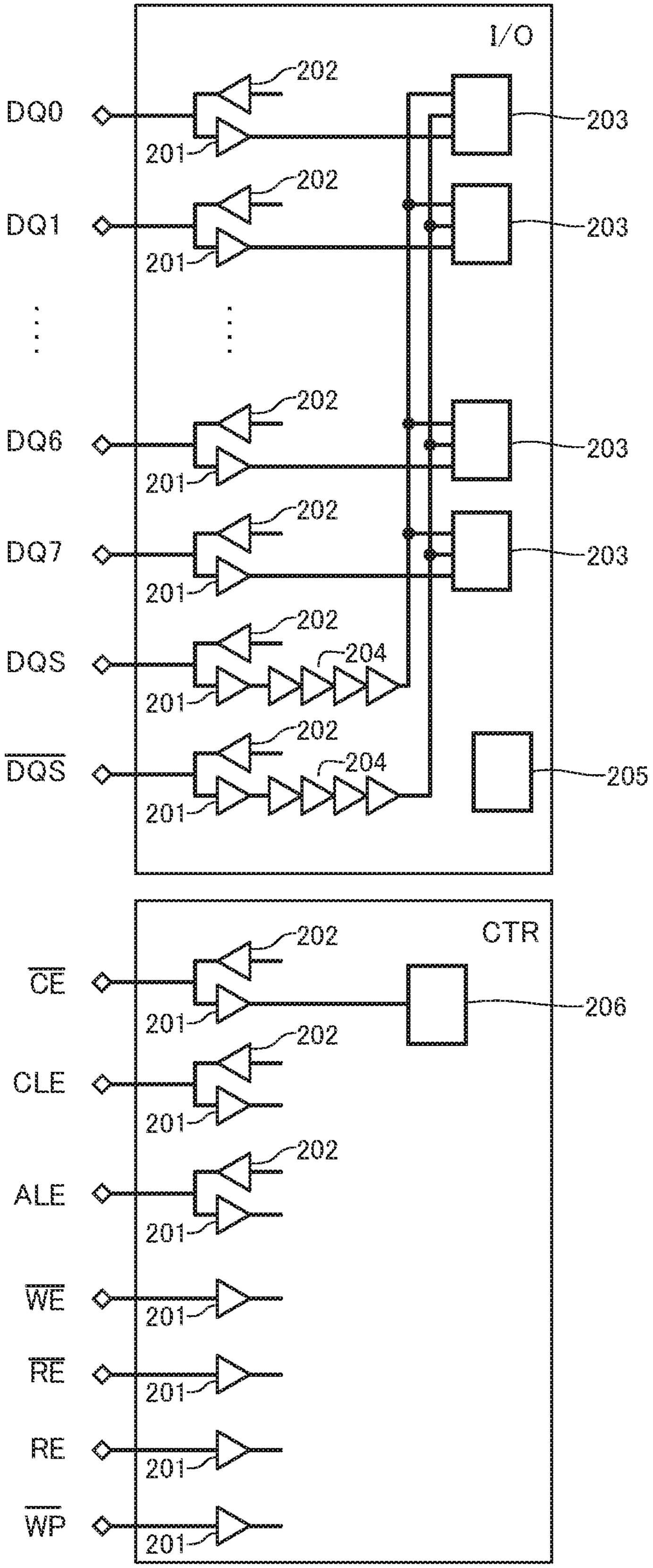
FIG. 39 is a schematic circuit diagram illustrating a configuration of a part of the memory die MD2.

Next, with reference to FIG. 38 and FIG. 39, a configuration of a semiconductor memory device according to a second embodiment will be described. FIG. 38 is a schematic block diagram illustrating a configuration of a memory die MD2 according to the second embodiment. FIG. 39 is a schematic circuit diagram illustrating a configuration of a part of the memory die MD2. For convenience of description, FIG. 38 and FIG. 39 omit a part of a configuration.

As illustrated in FIG. 38 and FIG. 39, the semiconductor memory device according to the embodiment is basically configured similarly to the semiconductor memory device according to the first embodiment. However, the semiconductor memory device according to the second embodiment can execute the input/output of a signal via the external control terminal /CE in addition to the external control terminals CLE, ALE. As illustrated in FIG. 39, the external control terminal /CE according to the second embodiment is connected to the input circuit 201 and the output circuit 202. As illustrated in FIG. 39, the external control terminal /CE according to the second embodiment includes a latch circuit 206.

Here, in the semiconductor memory device according to the first embodiment, 2-bit data is input in parallel or output in parallel in one cycle by the external control terminals CLE, ALE. For example, in the period FSel of the operation mode MODEb, 2-bit or 4-bit data is input over one cycle or two cycles. In period S_In, the 8-bit data constituting the data other than the user data Dat is input over four cycles. Therefore, 10-bit to 12-bit data is input over five cycles to six cycles.

Here, in the semiconductor memory device according to the second embodiment, the input/output of a signal can be executed via the external control terminal /CE in addition to the external control terminals CLE, ALE. Therefore, 3-bit data can be input in parallel or output in parallel in one cycle. Accordingly, the number of cycles required for the input of data can be reduced, and speed-up of the performance can be achieved.

In the semiconductor memory device according to the first embodiment, the memory die MD is in a selected state at a timing when the external control terminal /CE is in the "L" state, and the memory die MD is in an unselected state at a timing when the external control terminal /CE is in the "H"

state. The same applies in a case where the semiconductor memory device according to the second embodiment is operated in the operation mode MODEa. On the other hand, in a case where the semiconductor memory device according to the second embodiment is operated in the operation mode MODEb, the memory die MD2 is in the selected state at a timing when "L" is latched in the latch circuit 206, and the memory die MD2 is in the unselected state at a timing when "H" is latched in the latch circuit 206.

Figure 40:
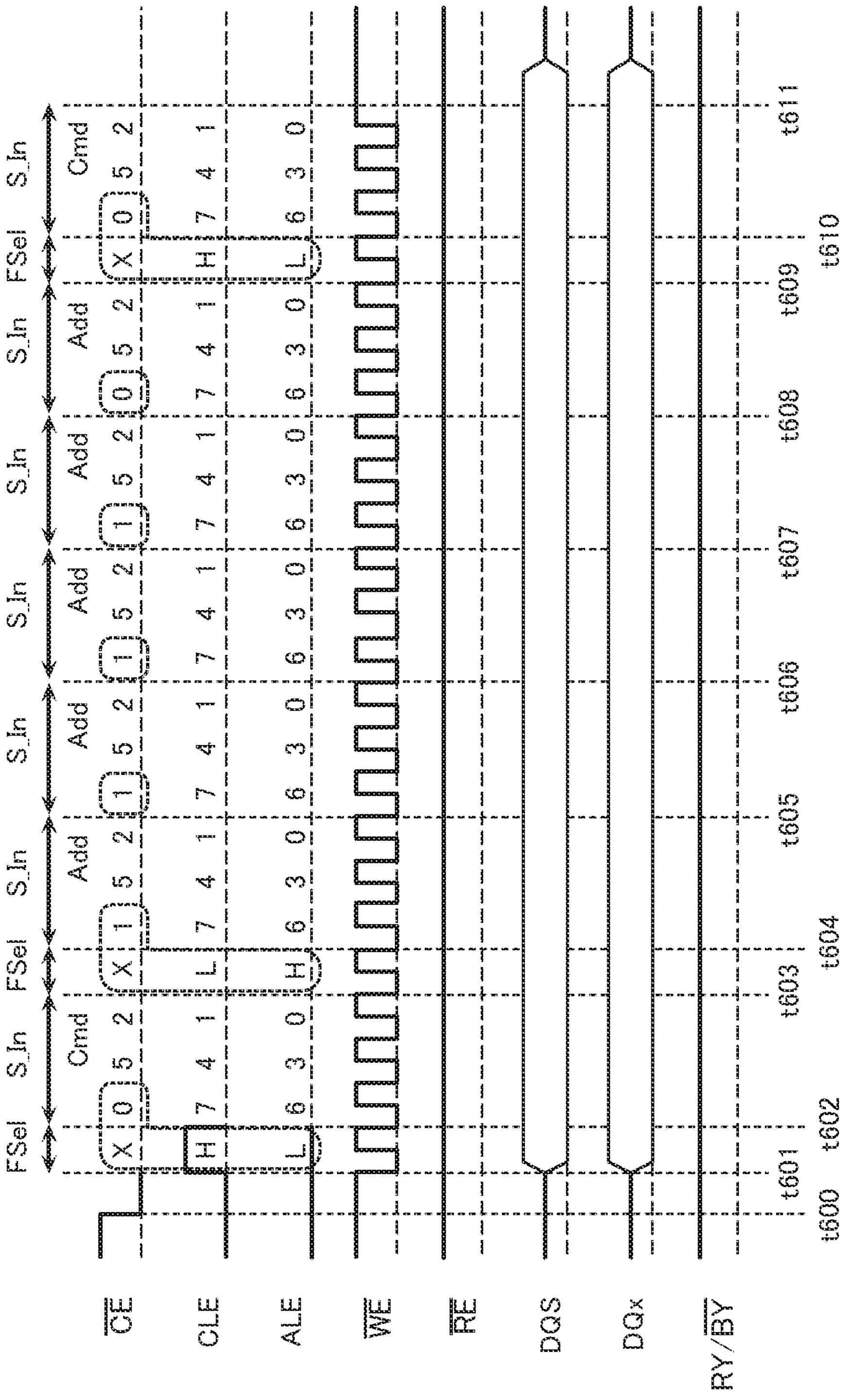
FIG. 40 is a schematic diagram for describing the operation mode MODEb.

Next, with reference to FIG. 40, operations of the semiconductor memory device according to the second embodiment will be described. FIG. 40 is a schematic waveform diagram for describing the operations of the semiconductor memory device according to the second embodiment.

In the example of FIG. 40, at timing t600, the controller die CD inputs "L" to the external control terminal /CE of the memory die MD2. In association with this, "L" is input to the latch circuit 206 (FIG. 39), and the memory die MD2 enters the selected state.

In the period FSel from timing t601 to timing t602, the controller die CD inputs "X, H, L" to the external control terminals /CE, CLE, ALE of the memory die MD2. In association with this, the input/output data select signal indicative of inputting the command data Cmd is input.

In the period S_In from timing t602 to timing t603, the controller die CD inputs the command data Cmd to the memory die MD2 over three cycles. In the illustrated example, "0" is input to the external control terminal /CE in the first cycle of the period S_In.

Note that, in the illustrated example, 1-bit data input to the external control terminal /CE in the first cycle of the period S_In is used as flag data. For example, when "0" is input to the external control terminal /CE in the first cycle of the period S_In, the cycle immediately after this period S_In is set to a period FSel. On the other hand, when "1" is input to the external control terminal /CE in the first cycle of the period S_In, a period FSel is omitted and the cycle immediately after this period S_In is set to a period S_In. In this case, in the omitted period FSel, the data input to the external control terminals /CE, CLE, ALE in the immediately previous period FSel is input to the external control terminals /CE, CLE, ALE again.

In the period FSel from timing t603 to timing t604, the controller die CD inputs "X, L, H" to the external control terminals /CE, CLE, ALE of the memory die MD2. In association with this, the input/output data select signal indicative of inputting the address data Add is input.

In the period S_In from timing t604 to timing t605, the controller die CD inputs the address data Add to the memory die MD2 over three cycles. In the illustrated example, "1" is input to the external control terminal /CE in the first cycle of the period S_In. In association with this, the period FSel immediately after this period S_In is omitted.

Similarly, in the period S_In from timing t605 to timing t606, the period S_In from timing t606 to timing t607, and the period S_In from timing t607 to timing t608, the controller die CD inputs the address data Add to the memory die MD2 over three cycles. In the illustrated example, "1" is input to the external control terminal /CE in the first cycle of these periods S_In. In association with this, the periods FSel immediately after these periods S_In are omitted.

In the period S_In from timing t608 to timing t609, the controller die CD inputs the address data Add to the memory die MD2 over three cycles. In the illustrated example, "0" is input to the external control terminal /CE in the first cycle of the period S_In. Therefore, the period FSel immediately after this period S_In is not omitted.

In the period FSel from timing t609 to timing t610, the controller die CD inputs "X, H, L" to the external control terminals /CE, CLE, ALE of the memory die MD2. In association with this, the input/output data select signal indicative of inputting the command data Cmd is input.

In the period S_In from timing t610 to timing t611, the controller die CD inputs the command data Cmd to the memory die MD2 over three cycles.

Third Embodiment

[Configuration]

Figure 41:
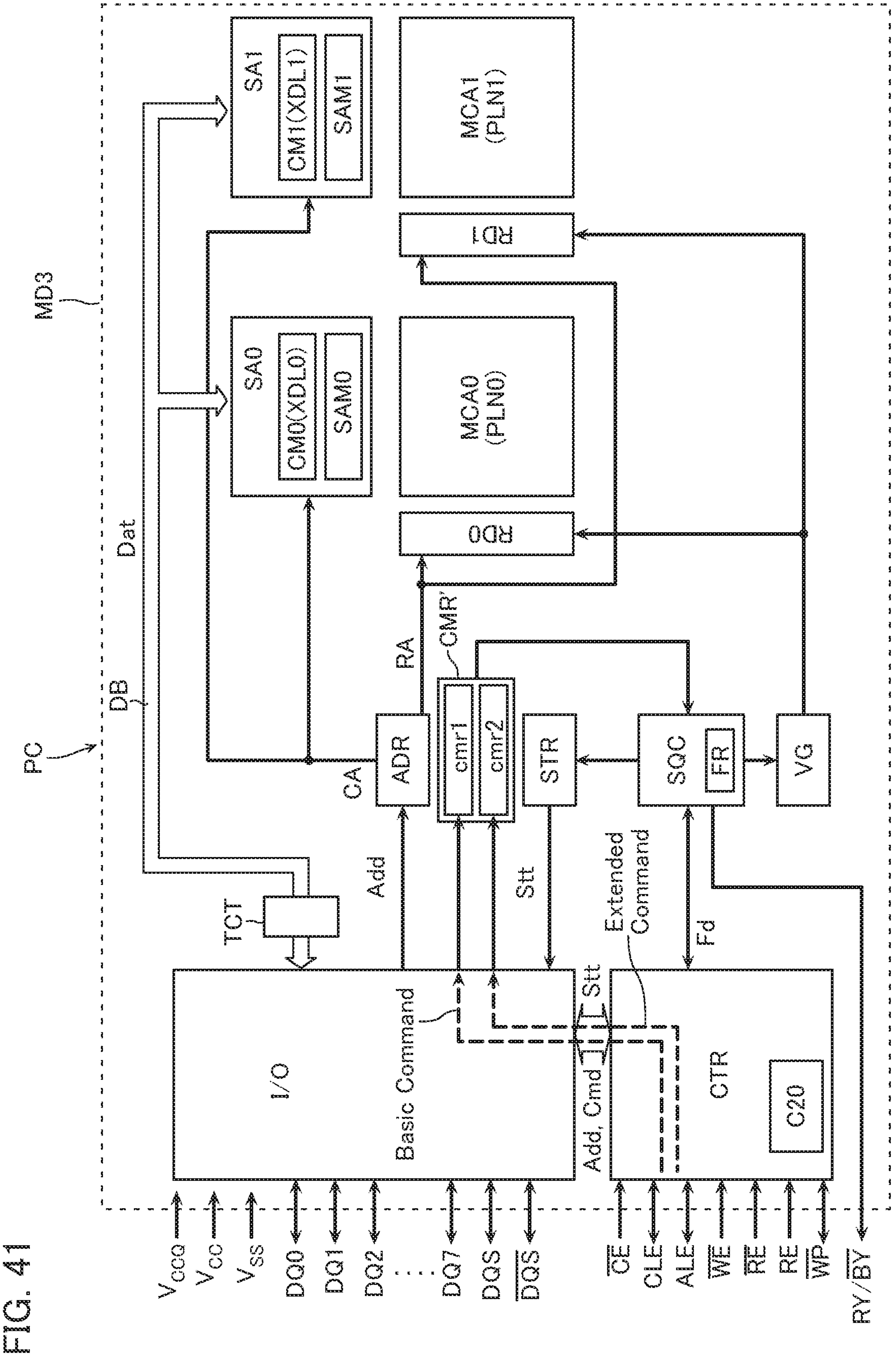
FIG. 41 is a schematic block diagram illustrating a configuration of a memory die MD3 according to a third embodiment.

Next, with reference to FIG. 41, a configuration of a semiconductor memory device according to a third embodiment will be described. FIG. 41 is a schematic block diagram illustrating a configuration of a memory die MD3 according to the third embodiment.

As illustrated in FIG. 41, the semiconductor memory device according to the embodiment is basically configured similarly to the semiconductor memory device according to the first embodiment. However, the semiconductor memory device according to the third embodiment includes a command register CMR' in place of the command register CMR. The command register CMR' is basically configured similarly to the command register CMR.

However, the command register CMR is configured to be able to output at most $2^8$ (=256) patterns of control signals according to the 8-bit command data Cmd.

On the other hand, the command register CMR' is configured to be able to output 257 or more patterns of control signals. For example, the command register CMR' may be configured to be able to output at most 512 patterns of control signals. For example, the command register CMR' includes a command processing unit cmr1 and a command processing unit cmr2.

The command processing unit cmr1 is configured to be able to output at most 256 patterns of control signals according to the 8-bit command data Cmd. The command processing unit cmr1 corresponds, for example, to the command data Cmd usable in the semiconductor memory device according to the first embodiment. In FIG. 41, such command data Cmd is exemplified as "Basic Command". Hereinafter, such command data Cmd may be referred to as "basic command data Cmd".

The command processing unit cmr2 is configured to be able to output at most 256 patterns of control signals according to the 8-bit command data Cmd. The command processing unit cmr2 corresponds, for example, to the command data Cmd other than the "Basic Command". In FIG. 41, such command data Cmd is exemplified as "Extended Command". Hereinafter, such command data Cmd may be referred to as "extended command data Cmd".

The command register CMR' may further include a configuration similar to the command processing units cmr1, cmr2. In this case, the command register CMR' may be configured to be able to output 513 or more patterns of control signals.

[Roles of External Terminals in Operation Mode MODEb]

FIG. 42 and FIG. 43 are truth tables for describing the roles of the external terminals in the operation mode MODEb. FIG. 42 illustrates the roles of the external control terminals in the second cycle of the period FSel in which the input/output data select signal is input. FIG. 43 illustrates the roles of the external control terminals in the third cycle of the period FSel in which the input/output data select signal is input.

The semiconductor memory device according to the embodiment basically operates similarly to the semiconductor memory device according to the first embodiment.

However, in the embodiment, in the first cycle of the period FSel, when the input/output data select signal indicative of inputting the command data Cmd corresponding to the "Basic Command" is input, for example, the controller die CD raises the voltage of the external control terminal /WE from "L" to "H" in the state where "H" is input to the external control terminal CLE and "L" is input to the external control terminal ALE (see FIG. 13).

In the first cycle of the period FSel, when "H" is input to the external control terminal CLE and "L" is input to the external control terminal ALE, the period FSel ends in one cycle. The data input in the period S_In immediately after this period FSel is latched in the buffer memory in the input/output control circuit I/O as the command data Cmd corresponding to the "Basic Command", transferred to the command register CMR' (FIG. 41), and processed by the command processing unit cmr1 (FIG. 41).

In the embodiment, in the second cycle of the period FSel, when the input/output data select signal indicative of inputting the extended command data Cmd is input, as exemplified in FIG. 42, for example, the controller die CD raises the voltage of the external control terminal /WE from "L" to "H" in the state where "H" is input to the external control terminal CLE and "L" is input to the external control terminal ALE.

In the second cycle of the period FSel, when "H" is input to the external control terminal CLE and "L" is input to the external control terminal ALE, the period FSel ends in two cycles. The data input in the period S_In immediately after this period FSel is latched in the buffer memory in the input/output control circuit I/O as the extended command data Cmd, transferred to the command register CMR' (FIG. 41), and processed by the command processing unit cmr2 (FIG. 41).

As described above, the command register CMR' may be configured to be able to output 513 or more patterns of control signals.

In such a case, in the third cycle of the period FSel, when the input/output data select signal indicative of inputting the command data Cmd is input, as exemplified in FIG. 43, for example, the controller die CD may raise the voltage of the external control terminal /WE from "L" to "H" in the state where "H" is input to the external control terminal CLE and "L" is input to the external control terminal ALE.

Additionally, in the third cycle of the period FSel, when "H" is input to the external control terminal CLE and "L" is input to the external control terminal ALE, the period FSel may end in three cycles. The data input in the period S_In immediately after this period FSel may be latched in the buffer memory in the input/output control circuit I/O as the command data Cmd, transferred to the command register CMR' (FIG. 41), and processed by a configuration other than the command processing units cmr1, cmr2 (FIG. 41).

[Example of Extended Command Data Cmd]

The extended command data Cmd can be used for various uses. In the following, as the uses of the extended command data Cmd, two uses will be exemplified.

[Shift-read Using Extended Command Data Cmd]

First, as a use of the extended command data Cmd, a shift-read will be exemplified.

Figures 44A, 44B:
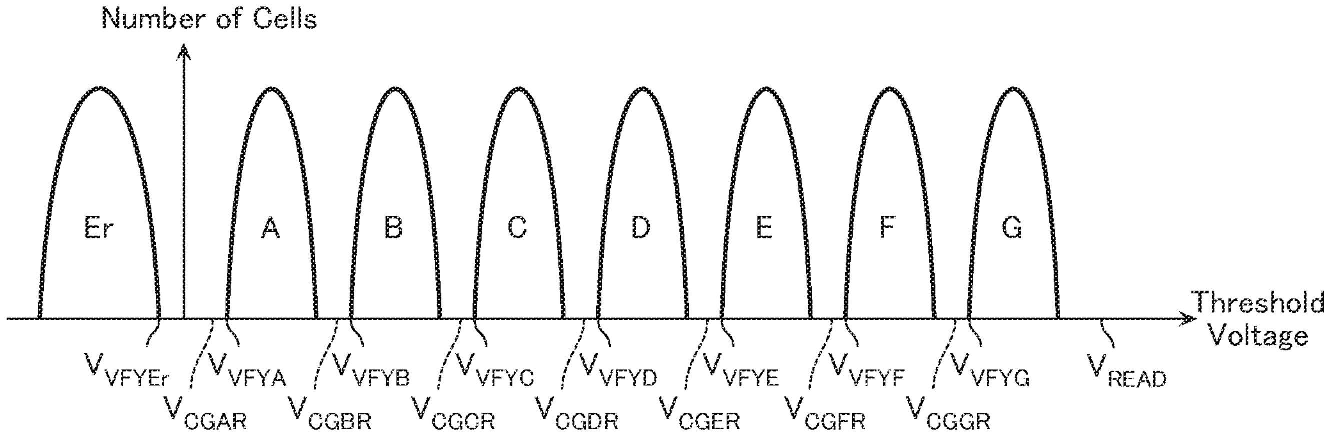
FIG. 44A is a schematic histogram for describing the threshold voltage of the memory cell MC in which 3-bit data is stored.
FIG. 44B is a table for describing a relation between the threshold voltage of the memory cell MC in which the 3-bit data is stored and the stored data.

FIG. 44A is a schematic histogram for describing the threshold voltage of the memory cell MC in which 3-bit data is stored. The horizontal axis indicates the voltage of the word line WL, and the vertical axis indicates the number of memory cells MC. FIG. 44B is a table showing an example of a relation between the threshold voltage of the memory cell MC in which the 3-bit data is stored and the stored data.

In the example of FIG. 44A, the threshold voltages of the memory cells MC are controlled in states of eight patterns. The threshold voltage of the memory cell MC controlled in an Er state is smaller than an erase verify voltage $V_{VFYEr}$. For example, the threshold voltage of the memory cell MC controlled in an A state is larger than a verify voltage $V_{VFYA}$ and smaller than a verify voltage $V_{VFYB}$ Additionally, for example, the threshold voltage of the memory cell MC controlled in a B state is larger than the verify voltage $V_{VFYB}$ and smaller than a verify voltage $V_{VFYC}$. Hereinafter, similarly, the threshold voltages of the memory cells MC controlled in a C state to an F state are larger than the verify voltage $V_{VFYC}$ to a verify voltage $V_{VFYF}$ and smaller than a verify voltage $V_{VFYD}$ to a verify voltage $V_{VFYG}$, respectively. For example, the threshold voltage of the memory cell MC controlled in a G state is larger than the verify voltage $V_{VFYG}$ and smaller than a read pass voltage $V_{READ}$.

In the example of FIG. 44A, a read voltage $V_{CGAR}$ is set between a threshold distribution corresponding to the Er state and a threshold distribution corresponding to the A state. A read voltage $V_{CGBR}$ is set between the threshold distribution corresponding to the A state and a threshold distribution corresponding to the B state. Hereinafter, similarly, a read voltage $V_{CGCR}$ to a read voltage $V_{CGGR}$ are set between the threshold distribution corresponding to the B state and a threshold distribution corresponding to the C state, to between a threshold distribution corresponding to the F state and a threshold distribution corresponding to the G state, respectively.

For example, the Er state corresponds to the lowest threshold voltage. The memory cell MC in the Er state is, for example, the memory cell MC in an erase state. For example, data "111" is assigned to the memory cell MC in the Er state.

The A state corresponds to the threshold voltage higher than the threshold voltage corresponding to the Er state. For example, data "011" is assigned to the memory cell MC in the A state.

The B state corresponds to the threshold voltage higher than the threshold voltage corresponding to the A state. For example, data "001" is assigned to the memory cell MC in the B state.

Hereinafter, similarly, the C state to the G state in the drawing correspond to threshold voltages higher than threshold voltages corresponding to the B state to the F state. For example, data "101", "100", "000", "010", and "110" are assigned to the memory cells MC in these states.

In the case of the assignment as exemplified in FIG. 44B, the data of a low-order bit is distinguishable with one read voltage $V_{CGGR}$ The data of a middle-order bit is distinguishable with two read voltages $V_{CGBR}$, $V_{CGFR}$ The data of a high-order bit is distinguishable with four read voltages $V_{CGAR}$, $V_{CGCR}$, $V_{CGER}$, $V_{CGGR}$ Such an assignment of the data is referred to as a 1-2-4 code in some cases.

The number of bits of the data stored in the memory cell MC, the number of states, the assignment of the data to each state, and the like are changeable as necessary.

Figure 45:
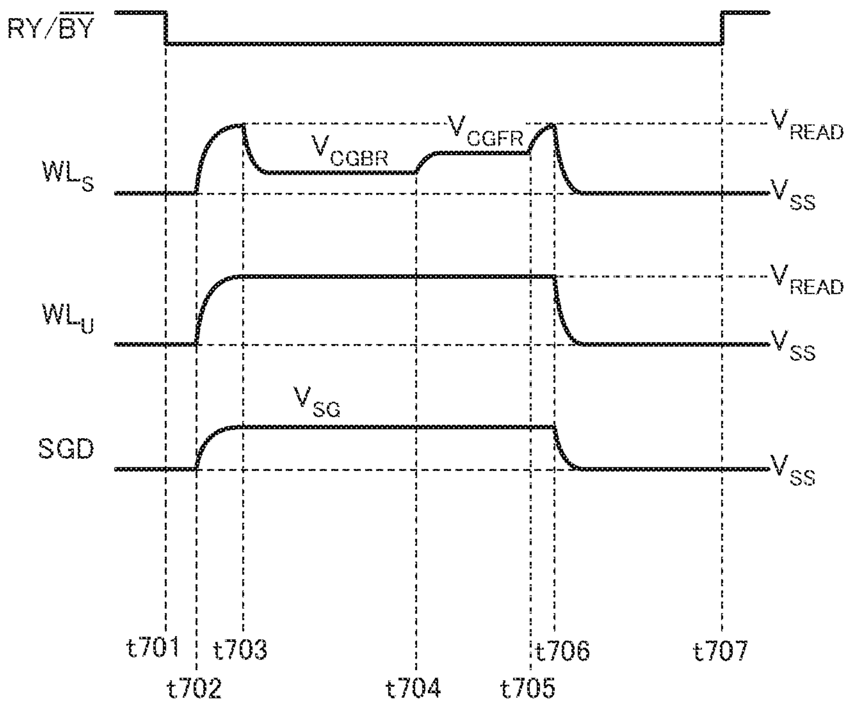
FIG. 45 is a timing chart for describing a read operation.

FIG. 45 is a timing chart for describing the read operation.

In the following description, the word line WL that is a target of the operation may be referred to as a selected word line $WL_S$ and the word line WL other than the target of the operation may be referred to as an unselected word line $WL_U$. In the following description, an example where the read operation is executed on the memory cell MC connected to the selected word line $WL_S$ (hereinafter sometimes referred to as a "selected memory cell MC") among the plurality of memory cells MC included in the string unit SU (FIG. 5) as a target of the operation will be described.

In the following description, an example where the 3-bit data is stored in the plurality of memory cells MC as described with reference to FIG. 44A and where the assignment of the data as described with reference to FIG. 44B is performed on the plurality of memory cells MC will be indicated. Additionally, in the following description, an example where the data of the middle-order bit of the selected memory cell MC is distinguished will be indicated.

At timing t701 of FIG. 45, the read operation is started, and the voltage of the terminal RY//BY falls from "H" to "L".

At timing t702, the read pass voltage $V_{READ}$ described with reference to FIG. 44A is applied to the selected word line $WL_S$ and the unselected word line $WL_U$. A voltage $V_{SG}$ is applied to the select gate lines (SGD, SGS, SGSb). The voltage $V_{SG}$ has a magnitude to the extent in which the select gate lines (SGD, SGS, SGSb) enter the ON state.

At timing t703, the read voltage $V_{CGBR}$ is applied to the selected word line $WL_S$. In the period from timing t703 to timing t704, the current of the bit line BL is detected by the sense amplifier SA, thereby obtaining data indicating the ON/OFF state of the memory cell MC.

At timing t704, the read voltage $V_{CGFR}$ is applied to the selected word line $WL_S$. In the period from timing t704 to timing t705, the current of the bit line BL is detected by the sense amplifier SA, thereby obtaining data indicating the ON/OFF state of the memory cell MC.

At timing t705, the read pass voltage $V_{READ}$ is applied to the selected word line $WL_S$ and the unselected word line $WL_U$.

At timing t706, the ground voltage $V_{SS}$ is applied to the selected word line $WL_S$, the unselected word line $WL_U$, and the select gate lines (SGD, SGS, SGSb).

Figure 46A:
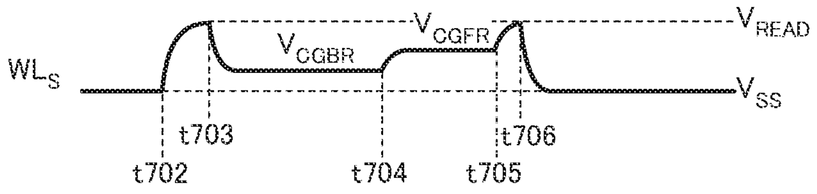
FIG. 46A is a timing chart for describing a shift-read.
Figure 46B:
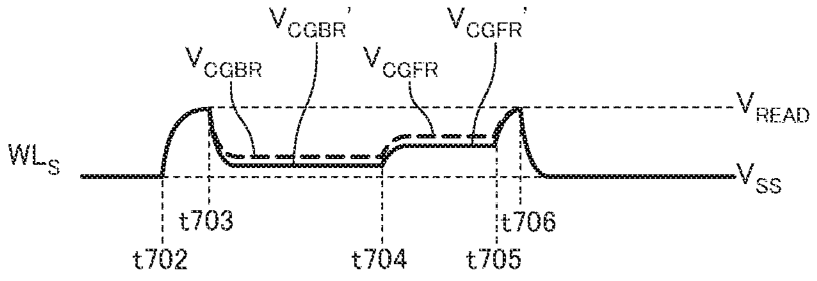
FIG. 46B is a timing chart for describing the shift-read.
Figure 46C:
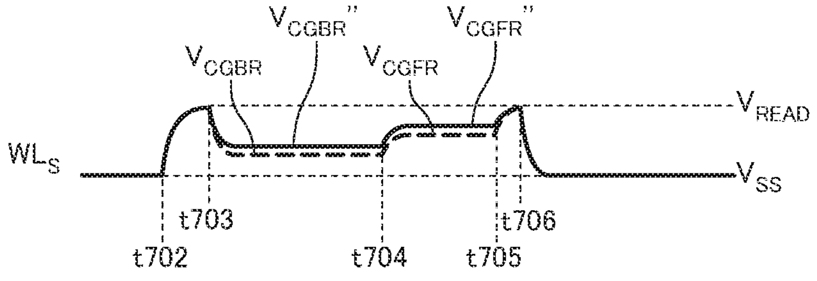
FIG. 46C is a timing chart for describing the shift-read.

FIG. 46A, FIG. 46B, and FIG. 46C are timing charts for describing the shift-read. FIG. 46A illustrates the voltage of the selected word line $WL_S$ in the read operation. FIG. 46B illustrates the voltage of the selected word line $WL_S$ in the shift-read according to one aspect. FIG. 46C illustrates the voltage of the selected word line $WL_S$ in the shift-read according to another aspect.

The shift-read is basically executed similarly to the read operation. However, the voltage applied to the selected word line $WL_S$ in the shift-read is different from the voltage applied to the selected word line $WL_S$ in the read operation.

Here, when the write operation is executed on the plurality of memory cells MC, the threshold voltages of these plurality of memory cells MC are, for example, distributed as exemplified in FIG. 44A. However, after the write operation is executed and before the erase operation is executed, the threshold voltages of the plurality of memory cells MC vary in some cases. In such a case, for example, the threshold voltage of a part of the memory cell MC controlled in the A state may become larger than the read voltage $V_{CGBR}$ and be determined as the data "0". Further, the threshold voltage of a part of the memory cell MC controlled in the B state may become smaller than the read voltage $V_{CGBR}$ and be determined as the data "1". The bit read from such memory cells MC becomes an error bit. In such a case, by applying the selected word line $WL_S$ with the voltage larger than the read voltages $V_{CGAR}$ to $V_{CGGR}$ or the voltage smaller than the read voltages $V_{CGAR}$ to $V_{CGGR}$, the number of the memory cells MC from which the error bit is read can be reduced to the minimum or a value close to the minimum in some cases. Therefore, in the shift-read, the voltage larger than the read voltages $V_{CGAR}$ to $V_{CGGR}$ or the voltage smaller than the read voltages $V_{CGAR}$ to $V_{CGGR}$ is applied to the selected word line $WL_S$.

For example, in the example of FIG. 46B, at timing t703, instead of the read voltage $V_{CGBR}$, a read voltage $V_{CGBR}'$ is applied to the selected word line $WL_S$. The read voltage $V_{CGBR}'$ is smaller than the read voltage $V_{CGBR}$.

For example, in the example of FIG. 46B, at timing t704, instead of the read voltage $V_{CGFR}$, a read voltage $V_{CGFR}'$ is applied to the selected word line $WL_S$. The read voltage $V_{CGFR}'$ is smaller than the read voltage $V_{CGFR}$.

When the read operation is executed, for example, as described with reference to FIG. 20 and the like, the controller die CD (FIG. 1) supplies the command data "00h" as the command data Cmd to the memory die MD. Then, the controller die CD supplies the address data Add and the command data "30h" to the memory die MD.

On the other hand, when the shift-read exemplified in FIG. 46B is executed, the controller die CD (FIG. 1) may supply command data "11h", "12h", "13h", . . . or the like as the extended command data Cmd to the memory die MD, instead of supplying the command data "00h" as the command data Cmd (basic command data Cmd). The difference between the read voltage $V_{CGBR}$ and the read voltage $V_{CGBR}'$ and the difference between the read voltage $V_{CGFR}$ and the read voltage $V_{CGFR}'$ (hereinafter, referred to as "voltage shift amounts") when the command data "12h" is input may be larger than voltage shift amounts when the command data "11h" is input. Similarly, voltage shift amounts when the command data "13h" is input may be larger than the voltage shift amounts when the command data "12h" is input. After the command data "11h", "12h", "13h", . . . or the like is input, the controller die CD may supply the address data Add and the command data "30h" to the memory die MD. The command data "30h" may be the basic command data Cmd or may be the extended command data Cmd.

For example, in the example of FIG. 46C, at timing t703, instead of the read voltage $V_{CGBR}$, a read voltage $V_{CGBR}'$ is applied to the selected word line $WL_S$. The read voltage $V_{CGBR}'$ is larger than the read voltage $V_{CGBR}$.

For example, in the example of FIG. 46C, at timing t704, instead of the read voltage $V_{CGFR}$, a read voltage $V_{CGFR}'$ is applied to the selected word line $WL_S$. The read voltage $V_{CGFR}'$ is larger than the read voltage $V_{CGFR}$.

When the shift-read exemplified in FIG. 46C is executed, the controller die CD (FIG. 1) may supply command data "21h", "22h", "23h", . . . or the like as the extended command data Cmd to the memory die MD, instead of supplying the command data "00h" as the command data Cmd (basic command data Cmd). Voltage shift amounts when the command data "22h" is input may be larger than voltage shift amounts when the command data "21h" is input. Similarly, voltage shift amounts when the command data "23h" is input may be larger than the voltage shift amounts when the command data "22h" is input. After the command data "21h", "22h", "23h", . . . or the like is input, the controller die CD may supply the address data Add and the command data "30h" to the memory die MD. The command data "30h" may be the basic command data Cmd or may be the extended command data Cmd.

Figure 47:
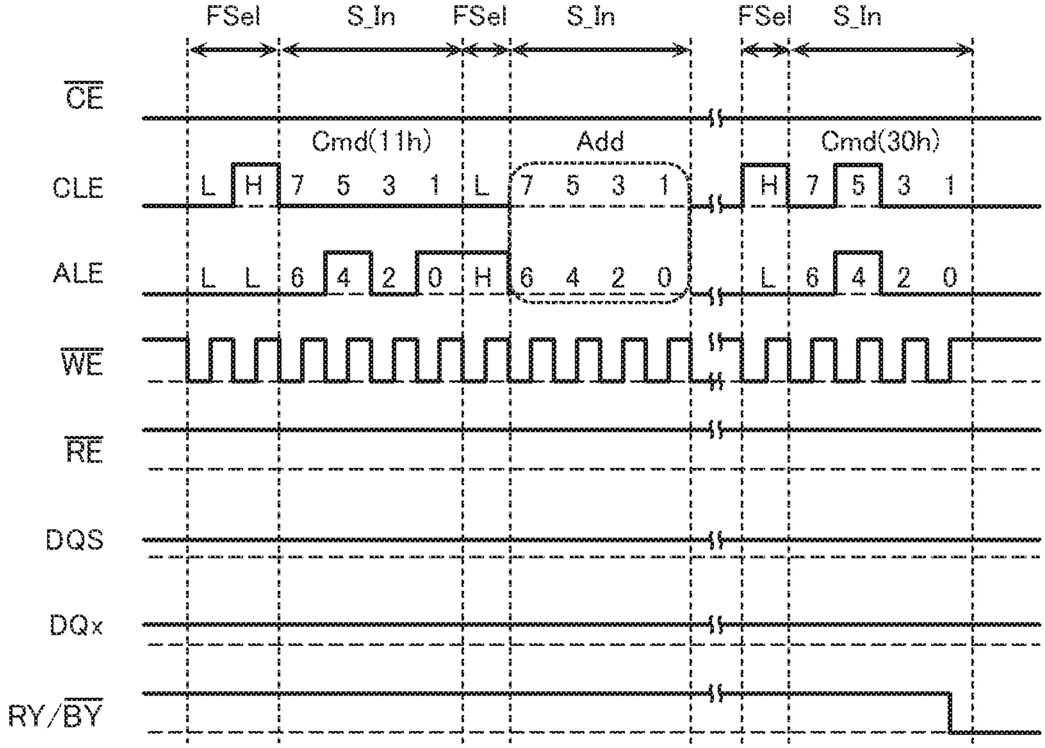
FIG. 47 is a schematic waveform diagram illustrating a state when the shift-read is executed in the operation mode MODEb.

FIG. 47 is a schematic waveform diagram illustrating a state when the shift-read is executed in the operation mode MODEb. In the example of FIG. 47, the memory die MD is set to the operation mode MODEb.

In the example of FIG. 47, first, a command set including the command data "11h" is input via the external control terminals CLE, ALE. The command data "11h" is input as the extended command data Cmd.

Here, for example, when the shift-read is executed in the first embodiment, the set-feature is executed by, for example, the method as described with reference to FIG. 30, thereby inputting the voltage shift amounts to the memory die MD as the feature data Fd. Then, the read operation is executed by the method as described with reference to FIG. 20.

On the other hand, when the shift-read is executed in the third embodiment, the shift-read is executed by the method as described with reference to FIG. 47 without executing the set-feature.

By such a method, by omitting the execution of the set-feature, speed-up of the performance can be achieved.

[Control of Internal Path Delay Detection Circuit 205 (FIG. 9) Using Extended Command Data Cmd]

Next, as a use of the extended command data Cmd, control of the internal path delay detection circuit 205 (FIG. 9) is exemplified.

As described with reference to FIG. 9, in the semiconductor memory device according to the first embodiment, the count of pulses output from the internal path delay detection circuit 205 can be obtained as the feature data Fd. Based on this, the signal delay amounts in the signal transfer circuits 204 (FIG. 8) can be measured.

Here, in the semiconductor memory device according to the first embodiment, the internal path delay detection circuit 205 is driven in response to execution of the get-feature. That is, the enable signal of the NAND circuit 212 (FIG. 9) in the internal path delay detection circuit 205 enters the "H" state in response to the execution of the get-feature. Therefore, in the semiconductor memory device according to the first embodiment, after the execution of the get-feature, the feature data Fd cannot be obtained until after the measurement of the delay amounts by the internal path delay detection circuit 205.

On the other hand, in the semiconductor memory device according to the third embodiment, the internal path delay detection circuit 205 can be driven in response to the input of the extended command data Cmd. That is, the enable signal of the NAND circuit 212 (FIG. 9) in the internal path delay detection circuit 205 can be brought into the "H" state in response to the input of the extended command data Cmd.

With such a configuration, by preliminary driving the internal path delay detection circuit 205 before the execution of the get-feature, the get-feature may be executable at a high speed.

Fourth Embodiment

Figure 48:
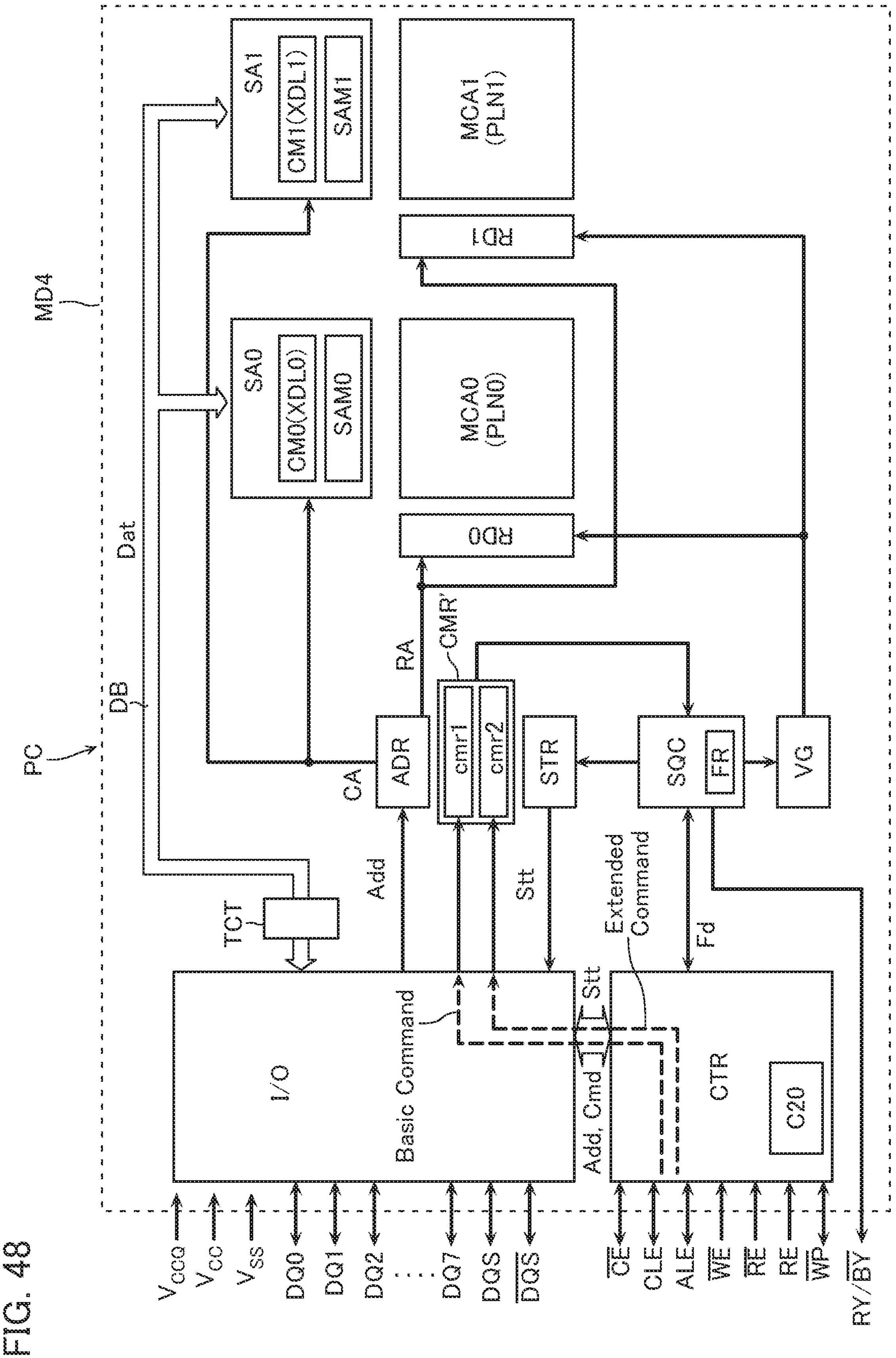
FIG. 48 is a schematic block diagram illustrating a configuration of a memory die MD4 according to a fourth embodiment.

Next, with reference to FIG. 48, a configuration of a semiconductor memory device according to a fourth embodiment will be described. FIG. 48 is a schematic block diagram illustrating a configuration of a memory die MD4 according to the fourth embodiment.

As illustrated in FIG. 48, the semiconductor memory device according to the embodiment is basically configured similarly to the semiconductor memory device according to the second embodiment. However, the semiconductor memory device according to the fourth embodiment includes the command register CMR' in place of the command register CMR.

Next, with reference to FIG. 49 and FIG. 50, operations of the semiconductor memory device according to the fourth embodiment will be described. The semiconductor memory device according to the fourth embodiment basically operates similarly to the semiconductor memory device according to the second embodiment.

However, in the semiconductor memory device according to the second embodiment, the 1-bit data input to the external control terminal /CE in the first cycle of the period S_In is used as the flag data. Additionally, in the semiconductor memory device according to the second embodiment, the period FSel is omitted according to this flag data.

On the other hand, in the semiconductor memory device according to the fourth embodiment, whether or not the input command data Cmd is the extended command data Cmd is determined according to this flag data.

For example, when this flag data is "0", the command data Cmd input in this period S_In is determined as not being the extended command data Cmd. In this case, this command data Cmd is processed by the command processing unit cmr1 (FIG. 48) in the command register CMR'.

On the other hand, when this flag data is "1", the command data Cmd input in this period S_In is determined as the extended command data Cmd. In this case, this command data Cmd is processed by the command processing unit cmr2 (FIG. 48) in the command register CMR'.

Figure 49:
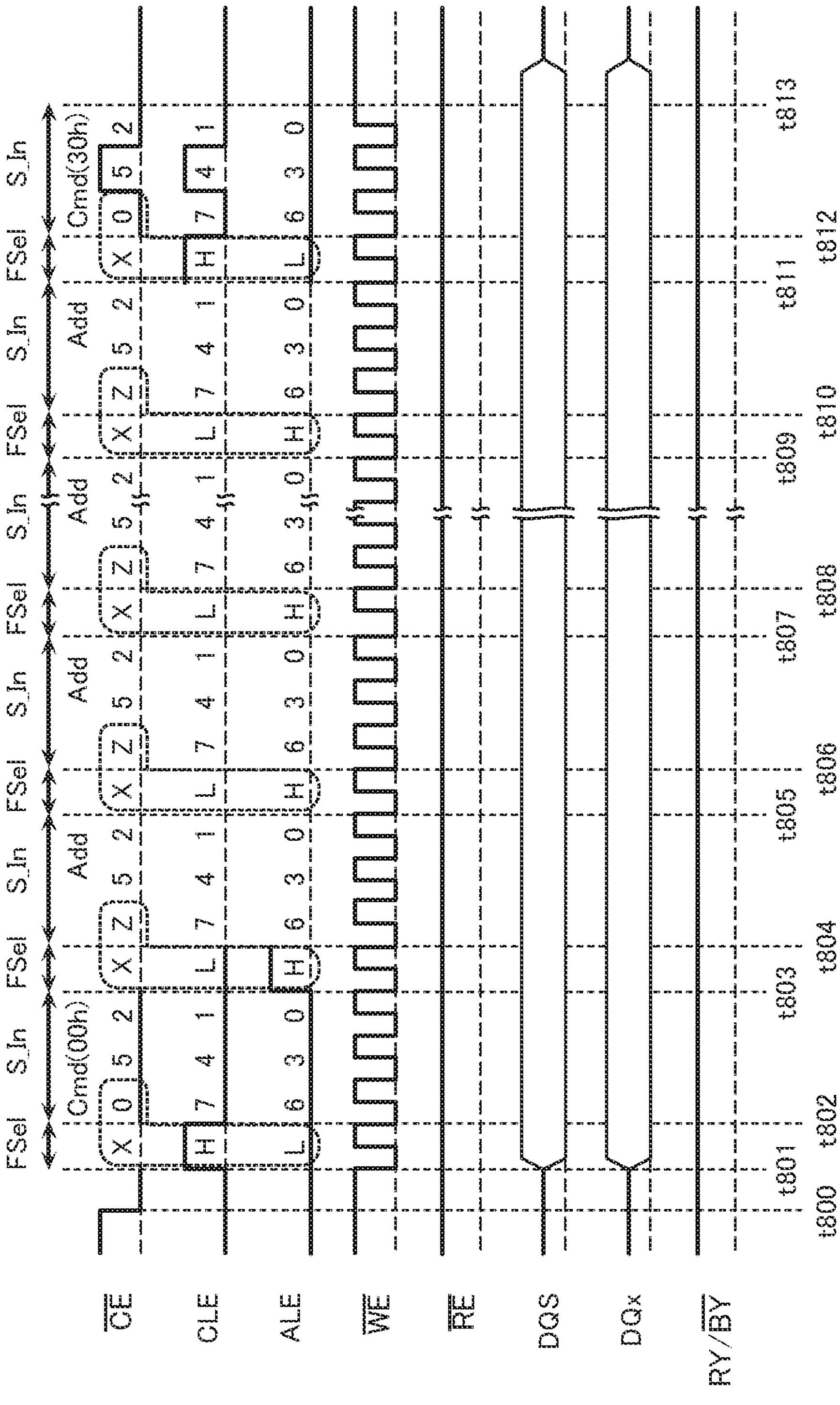
FIG. 49 is a schematic waveform diagram illustrating a state when the read operation is executed in the operation mode MODEb.

FIG. 49 is a schematic waveform diagram illustrating a state when the read operation is executed in the operation mode MODEb. In the example of FIG. 49, the memory die MD4 is set to the operation mode MODEb.

In the example of FIG. 49, at timing t800, the controller die CD inputs "L" to the external control terminal /CE of the memory die MD4. In association with this, "L" is input to the latch circuit 206 (FIG. 39), and the memory die MD4 enters the selected state.

In the period FSel from timing t801 to timing t802, the controller die CD inputs "X, H, L" to the external control terminals /CE, CLE, ALE of the memory die MD4. In association with this, the input/output data select signal indicative of inputting the command data Cmd is input.

In the period S_In from timing t802 to timing t803, the controller die CD inputs the command data "00h" to the memory die MD4 over three cycles. In the illustrated example, "0" is input to the external control terminal /CE in the first cycle of the period S_In. Therefore, the command data "00h" is determined as not being the extended command data Cmd.

In the period FSel from timing t803 to timing t804, the controller die CD inputs "X, L, H" to the external control terminals /CE, CLE, ALE of the memory die MD4. In association with this, the input/output data select signal indicative of inputting the address data Add is input.

In the period S_In from timing t804 to timing t805, the controller die CD inputs the address data Add to the memory die MD4 over three cycles. In the illustrated example, "0" may be input or "1" may be input to the external control terminal /CE in the first cycle of the period S_In.

In the period FSel from timing t805 to timing t806, the period FSel from timing t807 to timing t808, and the period FSel from timing t809 to timing t810, similarly to the period FSel from timing t803 to timing t804, the controller die CD inputs "X, L, H" to the external control terminals /CE, CLE, ALE of the memory die MD4.

In the period S_In from timing t806 to timing t807, the periods S_In after timing t808, the periods S_In before timing t809, and the period S_In from timing t810 to timing t811, similarly to the period S_In from timing t804 to timing t805, the controller die CD inputs the address data Add to the memory die MD4 over three cycles.

In the period FSel from timing t811 to timing t812, the controller die CD inputs "X, H, L" to the external control terminals /CE, CLE, ALE of the memory die MD4. In association with this, the input/output data select signal indicative of inputting the command data Cmd is input.

In the period S_In from timing t812 to timing t813, the controller die CD inputs the command data "30h" to the memory die MD4 over three cycles. In the illustrated example, "0" is input to the external control terminal /CE in the first cycle of the period S_In.

Figure 50:
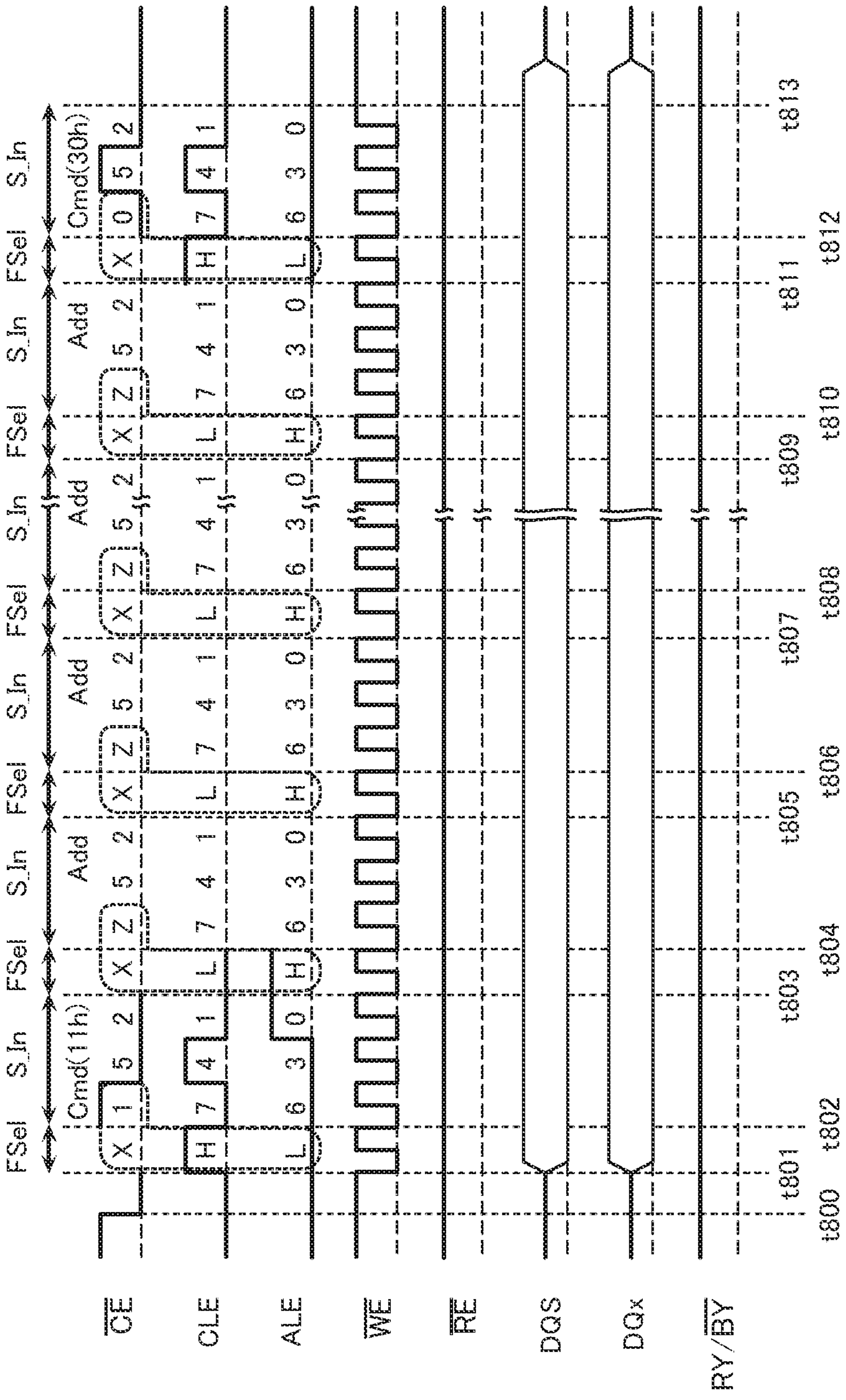
FIG. 50 is a schematic waveform diagram illustrating a state when the shift-read is executed in the operation mode MODEb.

FIG. 50 is a schematic waveform diagram illustrating a state when the shift-read is executed in the operation mode MODEb. In the example of FIG. 50, the memory die MD4 is set to the operation mode MODEb.

The operations illustrated in FIG. 50 are basically executed similarly to the operations illustrated in FIG. 49.

However, in the example of FIG. 50, in the period S_In from timing t802 to timing t803, the controller die CD inputs the command data "11h" to the memory die MD4 over three cycles. In the illustrated example, "1" is input to the external control terminal /CE in the first cycle of the period S_In. Therefore, the command data "11h" is determined as the extended command data Cmd.

Other Embodiments

The semiconductor memory devices according to the first embodiment to the fourth embodiment have been described above. However, the above descriptions are only examples, and specific configurations, operations, and the like are adjustable as appropriate.

For example, in the semiconductor memory devices according to the first embodiment and the third embodiment, in the operation mode MODEb, the input/output of 2-bit data is executed using the external control terminals CLE, ALE. In the semiconductor memory devices according to the second embodiment and the fourth embodiment, in the operation mode MODEb, the input/output of 3-bit data is executed using the external control terminals /CE, CLE, ALE. However, such methods are only examples, and specific methods are adjustable as appropriate. For example, in the operation mode MODEb, the input/output of data of 3 bits or 4 bits or more may be executed using other terminals and the like. More specifically, for example, in the operation mode MODEb, the input/output of 3-bit or 4-bit data may be executed using the external control terminal /WP or the like in place of or in addition to the external control terminal /CE. Further, the input/output of 1-bit or 2-bit data may be executed by selecting at least one terminal among the terminals including the external control terminals /CE, CLE, ALE.

For example, in the first embodiment to the fourth embodiment, the assignments of functions with respect to the external control terminals /CE, CLE, ALE and the like are exemplified. However, such assignments are only examples, and specific assignments are adjustable as appropriate.

For example, in the semiconductor memory device according to the first embodiment, a part of the functions exemplified in FIG. 13 and FIG. 14 may be interchanged. Further, for example, functions other than the functions exemplified in FIG. 13 and FIG. 14 may be added, or a part of the functions exemplified in FIG. 13 and FIG. 14 may be omitted. The third cycle of the period FSel may be added. According to the data input in the first cycle of the period FSel, the function assigned for the data input in the second cycle of the period FSel may change.

The command set includes the command data Cmd and the address data Add. In the operation mode MODEb, the semiconductor memory device according to the first embodiment transmits and receives the respective command data Cmd and address data Add using the input/output data select signal (header) and the command data Cmd or the address data Add (body) over several cycles. Here, the input of the command set is canceled in its course in some cases. In that case, the command data Cmd and the address data Add are not input until the final cycle in some cases. In such a case, each memory die MD may be configured to be able to reset in response to a reset instruction signal from the controller die CD.

Figure 51:
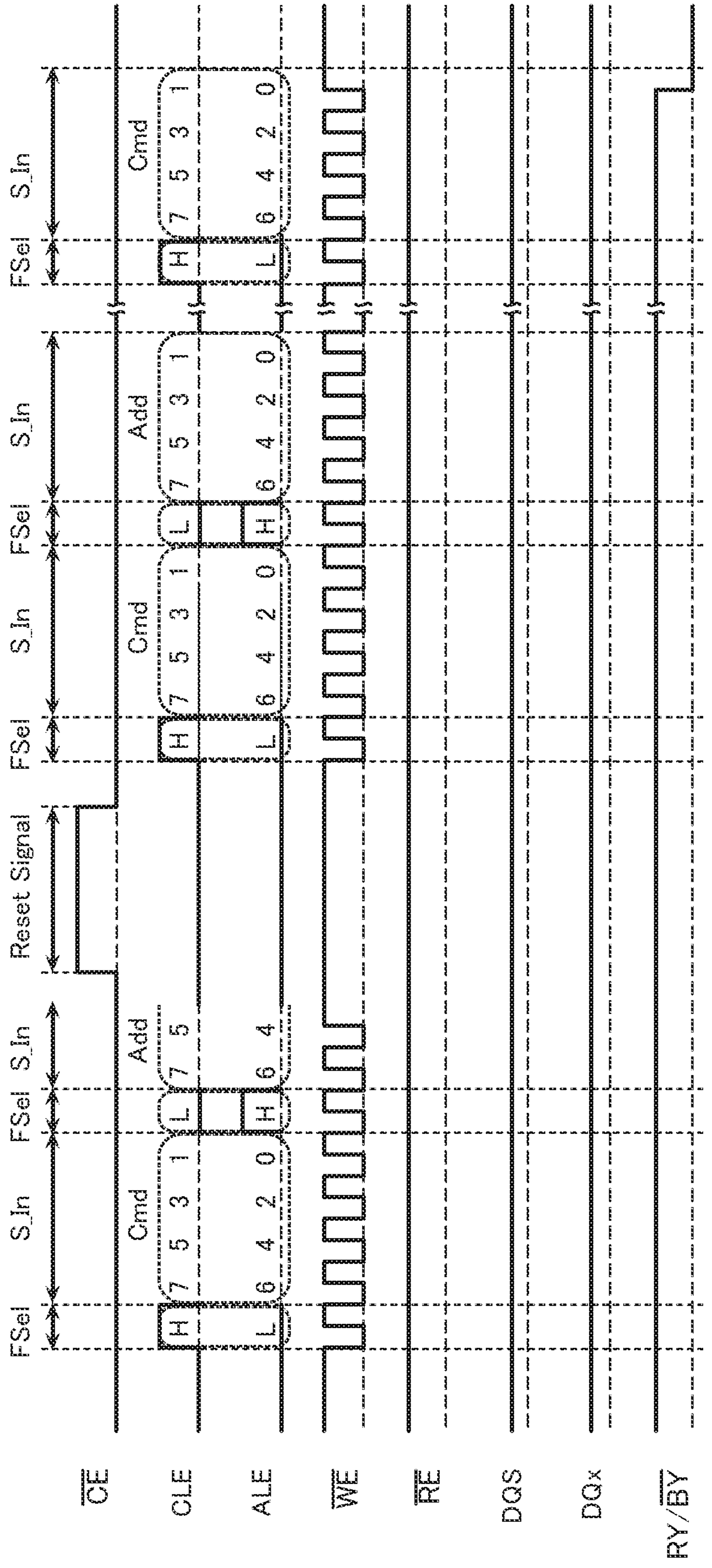
FIG. 51 is a schematic waveform diagram for describing a semiconductor memory device according to another embodiment.

For example, as illustrated in FIG. 51, when the input of the command set is canceled in its course, as the reset instruction signal, the controller die CD causes the voltage of the external control terminal /CE to transition from "L" to "H" for a certain period and then to return to "L". Then, the controller die CD inputs a new command set to the memory die MD. The new command set may be the same as or may be different from the command set the input of which is canceled in its course. After the memory die MD accepts the newly-input command set, the operation according to this command set is executed.

By configuring the controller die CD to be able to transmit the reset instruction signal and by configuring the memory die MD to be able to reset in response to the reset instruction signal, the semiconductor memory device that stably operates even when the input of the command set needs to be canceled in its course can be achieved.

Further, for example, in the semiconductor memory devices according to the second embodiment and the fourth embodiment, 1-bit data input to the external control terminal /CE in the first cycle of the period S_In is used as the flag data. In the semiconductor memory device according to the second embodiment, the period FSel is omitted according to this flag data. Further, in the semiconductor memory device according to the fourth embodiment, whether or not the input command data Cmd is the extended command data Cmd is determined according to this flag data. However, such methods are only examples, and specific methods are adjustable as appropriate. For example, the data input to the external control terminal /CE in the first cycle of the period S_In may be used as a parity bit. In such a case, this parity bit may correspond to 3-bit data input in the period FSel or may correspond to 8-bit data input in the period S_In.

Further, for example, in the semiconductor memory devices according to the second embodiment and the fourth embodiment, 1-bit data input to the external control terminal /CE in the first cycle of the period S_In is used as the flag data. However, for example, data input to the terminals other than the external control terminal /CE or data input after the second cycle of the period S_In may be used as the above-described flag data, parity bit, or other data.

For example, in the semiconductor memory device according to the third embodiment, examples in which the extended command data Cmd for executing the shift-read is "11h", "12h", "13h", . . . and "21h", "22h", "23h", . . . are indicated. However, the extended command data Cmd assigned for the shift-read is not limited to these. Optional command data can be assigned within the range that can be assigned as the extended command data Cmd.

For example, in the semiconductor memory devices according to the third embodiment and the fourth embodiment, examples in which the extended command data Cmd is 8-bit data, similarly to the ordinary command data Cmd, are indicated. However, the extended command data Cmd may be shorter than 8 bits or may be longer than 8 bits.

For example, when the extended command data Cmd is shorter than 8 bits, the area of the command processing unit cmr2 (FIG. 41) can be decreased. Further, for example, when the extended command data Cmd is 8 bits in the third embodiment, the extended command data Cmd is input to the memory die MD3 over four cycles. On the other hand, when the extended command data Cmd is 5 bits or 6 bits in the third embodiment, the extended command data Cmd is input to the memory die MD3 over three cycles. That is, when the extended command data Cmd is shorter than 8 bits, speed-up of the performance can be achieved.

Further, for example, when the extended command data Cmd is longer than 8 bits, even more command data Cmd can be handled.

Others

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
- a first pad being capable of transmitting and receiving a first timing signal;
- a second pad being capable of transmitting and receiving a data signal in response to the first timing signal;
- a third pad being capable of receiving a second timing signal;
- a fourth pad being capable of receiving control information in response to the second timing signal;
- a memory cell array including a string in which a plurality of memory cell transistors are connected in series;
- a sense amplifier connected to the memory cell array;
- a first register connected to the sense amplifier and being capable of storing data read from the memory cell array;
- a second register being capable of storing first control information;
- a third register being capable of storing second control information; and
- a control circuit being capable of executing a data-out operation of outputting the data stored in the first register from the first pad, wherein
- the first control information is stored in the second register based on an input to the fourth pad in response to the second timing signal consisting of i cycles (i is an integer of two or more), and
- the second control information is stored in the third register based on an input to the fourth pad in response to the second timing signal consisting of j cycles (j is an integer different from i).

2. The semiconductor memory device according to claim 1, wherein
- the fourth pad includes:
  - a command latch enable signal receiving pad; and
  - an address latch enable signal receiving pad, wherein
- j is an integer larger than i.

3. The semiconductor memory device according to claim 1, wherein
- the fourth pad includes:
  - a command latch enable signal receiving pad;
  - an address latch enable signal receiving pad; and
  - at least one of a chip enable signal receiving pad or a write protect signal receiving pad.

4. The semiconductor memory device according to claim 2, wherein
- the first control information includes a command signal or an address signal,
- the second control information includes characteristic data information,
- the second register includes a command register or an address register, and
- the third register includes a characteristic register.

5. The semiconductor memory device according to claim 4, further comprising:
- a first receiver and a first driver that are connected to the second pad; and
- a second receiver and a second driver that are connected to the fourth pad, wherein
- the first driver outputs the data stored in the first register to the first pad in the data-out operation, and
- the second driver outputs the characteristic data information stored in the characteristic register to the fourth pad in a characteristic information output operation.

6. The semiconductor memory device according to claim 5, further comprising
- a fourth register storing status information, wherein
- the second driver outputs the status information stored in the fourth register to the fourth pad in a status information output operation.

7. The semiconductor memory device according to claim 6, further comprising:
- a fifth pad that receives a third timing signal; and
- a receiving unit that receives a trigger signal and outputs an output start signal, wherein
- the trigger signal is transferred to the receiving unit based on an input to the fourth pad in response to the second timing signal consisting of k cycles,
- after a command set that instructs an output of the data stored in the first register is accepted, and
- after the receiving unit outputs the output start signal,
  - the first driver outputs the data to the second pad in response to the third timing signal input to the fifth pad, and
- after the command set that instructs an output of the data stored in the first register is accepted, and
- before the receiving unit outputs the output start signal,
  - the first driver does not output the data to the second pad even when the third timing signal is input to the fifth pad.

8. The semiconductor memory device according to claim 1, wherein
- the first control information includes a command signal, and
- the semiconductor memory device further comprises:
  - a first command processing unit that processes a first command signal; and
  - a second command processing unit that processes a second command signal.

9. The semiconductor memory device according to claim 1, further comprising
- a deserializer connected between the fourth pad and the second register and between the fourth pad and the third register.

10. A semiconductor memory device comprising:

a first pad being capable of transmitting and receiving a first timing signal;

a second pad being capable of transmitting and receiving a data signal in response to the first timing signal;

a third pad being capable of receiving a second timing signal;

a fourth pad being capable of receiving control information in response to the second timing signal;

a memory cell array including a string in which a plurality of memory cell transistors are connected in series;

a sense amplifier connected to the memory cell array;

a first register connected to the sense amplifier and being capable of storing data read from the memory cell array;

a second register being capable of storing first control information;

a third register being capable of storing second control information; and a control circuit being capable of executing a data-out operation of outputting the data stored in the first register from the first pad, wherein the received control information is stored in one of the second register and the third register based on an input to the fourth pad in response to the second timing signal consisting of i cycles (i is an integer of two or more), and the received control information is stored in the one of the second register and the third register based on an input to the fourth pad in response to the second timing signal consisting of j cycles (j is an integer smaller than i) following the i cycles.

11. The semiconductor memory device according to claim 10, wherein the first control information includes a command signal, and the semiconductor memory device further comprises:

a first command processing unit that processes a first command signal; and a second command processing unit that processes a second command signal.

12. The semiconductor memory device according to claim 10, wherein the fourth pad includes:

a command latch enable signal receiving pad; and an address latch enable signal receiving pad.

13. The semiconductor memory device according to claim 12, wherein the fourth pad includes at least one of a chip enable signal receiving pad or a write protect signal receiving pad.

14. The semiconductor memory device according to claim 10, wherein the first control information includes a command signal, the second control information includes an address signal, the second register includes a command register, and the third register includes an address register.

15. The semiconductor memory device according to claim 10, further comprising:

a first receiver and a first driver that are connected to the second pad; and a second receiver and a second driver that are connected to the fourth pad, wherein the first driver outputs the data stored in the first register to the first pad in the data-out operation.

16. The semiconductor memory device according to claim 15, further comprising a fourth register storing status information, wherein the second driver outputs the status information stored in the fourth register to the fourth pad in a status information output operation.

17. The semiconductor memory device according to claim 16, further comprising:

a fifth pad that receives a third timing signal; and a receiving unit that receives a trigger signal and outputs an output start signal, wherein the trigger signal is transferred to the receiving unit based on an input to the fourth pad in response to the second timing signal consisting of k cycles, after a command set that instructs an output of the data stored in the first register is accepted, and after the receiving unit outputs the output start signal, the first driver outputs the data to the second pad in response to the third timing signal input to the fifth pad, and after the command set that instructs an output of the data stored in the first register is accepted, and before the receiving unit outputs the output start signal, the first driver does not output the data to the second pad even when the third timing signal is input to the fifth pad.

18. The semiconductor memory device according to claim 10, further comprising a deserializer connected between the fourth pad and the second register and between the fourth pad and the third register.

* * * * *